US009218933B2

(12) United States Patent
Langeveld et al.

(10) Patent No.: US 9,218,933 B2
(45) Date of Patent: Dec. 22, 2015

(54) LOW-DOSE RADIOGRAPHIC IMAGING SYSTEM

(71) Applicant: Rapiscan Systems, Inc., Torrance, CA (US)

(72) Inventors: Willem Gerhardus Johannes Langeveld, Menlo Park, CA (US); Joseph Bendahan, San Jose, CA (US); Tsahi Gozani, Palo Alto, CA (US); Michael King, Mountain View, CA (US); Dan Strellis, San Jose, CA (US); Edward Franco, San Mateo, CA (US); Krystal R. Alfonso, San Jose, CA (US)

(73) Assignee: Rapidscan Systems, Inc., Torrance, CA (US)

( * ) Notice: Subject to any disclaimer, the term of this patent is extended or adjusted under 35 U.S.C. 154(b) by 0 days.

(21) Appl. No.: 14/491,825

(22) Filed: Sep. 19, 2014

(65) Prior Publication Data

US 2015/0325401 A1  Nov. 12, 2015

Related U.S. Application Data

(63) Continuation-in-part of application No. 13/492,614, filed on Jun. 8, 2012.

(60) Provisional application No. 61/880,159, filed on Sep. 19, 2013, provisional application No. 61/494,887, filed on Jun. 9, 2011.

(51) Int. Cl.
*H05G 1/52* (2006.01)
*G21K 1/08* (2006.01)
(Continued)

(52) U.S. Cl.
CPC ............... *H01J 35/14* (2013.01); *H01J 35/30* (2013.01); *H01J 37/14* (2013.01); *H01J 37/1472* (2013.01); *G21K 1/093* (2013.01); *H01J 37/147* (2013.01); *H05G 1/52* (2013.01)

(58) Field of Classification Search
CPC ......... H01J 35/14; H01J 35/30; H01J 37/141; H01J 37/143; H01J 37/147; H01J 37/1472; H01J 37/1474; H01J 37/1475; H01J 35/00; H01J 35/02; H01J 35/06; H01J 34/14; H01J 37/00; H01J 37/02; H01J 37/04; H01J 37/06; H01J 37/065; H01J 37/14; H05G 1/52; H05G 1/00; H05G 1/02; H05G 1/08; G21K 1/08; G21K 1/093; G21K 1/00; A61B 6/40; A61B 6/4021; A61B 6/44
USPC ........... 378/62, 106, 113–116, 119, 121, 136, 378/137, 145, 146, 204, 210; 250/370.09, 250/396 R, 396 ML, 397, 398, 427, 493.1, 250/503.1, 505.1, 526
See application file for complete search history.

(56) References Cited

U.S. PATENT DOCUMENTS

| 2,420,845 A | 5/1947 | Slack |
| 2,457,841 A | 1/1949 | Smith |

(Continued)

FOREIGN PATENT DOCUMENTS

| CA | 2624658 A1 | 9/2009 |
| CA | 2624663 A1 | 9/2009 |

(Continued)

OTHER PUBLICATIONS

US 5,987,079, 11/1999, Scott (withdrawn).

(Continued)

*Primary Examiner* — Anastasia Midkiff
(74) *Attorney, Agent, or Firm* — Novel IP

(57) ABSTRACT

An inspection system for scanning cargo and vehicles is described which employs an X-ray source that includes an electron beam generator, for generating an electron beam; an accelerator for accelerating said electron beam in a first direction; and, a first set of magnetic elements for transporting said electron beam into a magnetic field created by a second set of magnetic elements, wherein the magnetic field created by said second set of magnetic elements causes said electron beam to strike a target such that the target substantially only generates X-rays focused toward a high density section in the scanned object, which is estimated in a second pulse using image data captured by a detector array in a first pulse. The electron beam direction is optimized by said X-ray source during said second pulse to focus X-rays towards said high density section based on said image data in said first pulse.

45 Claims, 29 Drawing Sheets

(51) Int. Cl.
*H01J 37/14* (2006.01)
*H01J 35/14* (2006.01)
*H01J 35/30* (2006.01)
H01J 37/147 (2006.01)
G21K 1/093 (2006.01)

(56) References Cited

U.S. PATENT DOCUMENTS

| | | |
|---|---|---|
| 2,636,619 A | 4/1953 | Alexander |
| 2,831,123 A | 4/1958 | Daly |
| 2,885,069 A | 5/1959 | Bowen |
| 2,952,790 A | 9/1960 | Steen |
| 2,971,433 A | 2/1961 | Akin |
| 3,070,399 A | 12/1962 | Bartlett |
| 3,073,960 A | 1/1963 | Guentner |
| 3,146,349 A | 8/1964 | Jordan |
| 3,239,706 A | 3/1966 | Farrell |
| 3,275,831 A | 9/1966 | Martin |
| 3,374,355 A | 3/1968 | Parratt |
| 3,417,243 A | 12/1968 | Hill |
| 3,439,166 A | 4/1969 | Chope |
| 3,458,026 A | 7/1969 | Lauzon |
| 3,485,339 A | 12/1969 | Miller |
| 3,676,783 A | 7/1972 | Kinbara |
| 3,766,387 A | 10/1973 | Heffan |
| 3,767,850 A | 10/1973 | Mc |
| 3,768,645 A | 10/1973 | Conway |
| 3,770,955 A | 11/1973 | Tomita |
| 3,784,837 A | 1/1974 | Holmstrom |
| 3,837,502 A | 9/1974 | Hornagold |
| RE28,544 E | 9/1975 | Stein |
| 3,904,923 A | 9/1975 | Schwartz |
| 3,919,467 A | 11/1975 | Peugeot |
| 3,955,678 A | 5/1976 | Moyer |
| 3,961,186 A | 6/1976 | Leunbach |
| 3,980,889 A | 9/1976 | Haas |
| 4,020,346 A | 4/1977 | Dennis |
| 4,047,035 A | 9/1977 | Dennhoven |
| 4,057,725 A | 11/1977 | Wagner |
| 4,064,440 A | 12/1977 | Roder |
| 4,105,922 A | 8/1978 | Lambert |
| 4,139,771 A | 2/1979 | Dennhoven |
| 4,164,138 A | 8/1979 | Burkhart |
| 4,210,811 A | 7/1980 | Dennhoven |
| 4,216,499 A | 8/1980 | Dennhoven |
| 4,228,353 A | 10/1980 | Johnson |
| 4,254,599 A | 3/1981 | Maistre |
| 4,259,721 A | 3/1981 | Kuznia |
| 4,266,425 A | 5/1981 | Allport |
| 4,274,005 A | 6/1981 | Yamamura |
| 4,340,816 A | 7/1982 | Schott |
| 4,352,021 A | 9/1982 | Boyd |
| 4,366,382 A | 12/1982 | Kotowski |
| 4,380,817 A | 4/1983 | Harding |
| 4,430,568 A | 2/1984 | Yoshida |
| 4,434,372 A | 2/1984 | Cleland |
| 4,468,802 A | 8/1984 | Friedel |
| 4,481,403 A | 11/1984 | Del |
| 4,501,011 A | 2/1985 | Hauck |
| 4,525,854 A | 6/1985 | Molbert |
| 4,563,707 A | 1/1986 | Kishida |
| 4,566,113 A | 1/1986 | Doenges |
| 4,599,740 A | 7/1986 | Cable |
| 4,626,688 A | 12/1986 | Barnes |
| 4,641,330 A | 2/1987 | Herwig |
| 4,672,649 A | 6/1987 | Rutt |
| 4,675,890 A | 6/1987 | Plessis |
| 4,709,382 A | 11/1987 | Sones |
| 4,719,153 A | 1/1988 | Akasawa |
| 4,736,401 A | 4/1988 | Donges |
| 4,752,948 A | 6/1988 | MacMahon |
| 4,788,704 A | 11/1988 | Donges |
| 4,799,247 A | 1/1989 | Annis |
| 4,809,312 A | 2/1989 | Annis |
| 4,809,857 A | 3/1989 | Steuck |
| 4,817,123 A | 3/1989 | Sones |
| 4,825,454 A | 4/1989 | Annis |
| 4,831,260 A | 5/1989 | DiBianca |
| RE32,961 E | 6/1989 | Wagner |
| 4,853,595 A | 8/1989 | Alfano |
| 4,864,142 A | 9/1989 | Gomberg |
| 4,866,439 A | 9/1989 | Kraus |
| 4,866,745 A | 9/1989 | Akai |
| 4,868,856 A | 9/1989 | Frith |
| 4,870,670 A | 9/1989 | Geus |
| 4,872,188 A | 10/1989 | Lauro |
| 4,879,735 A | 11/1989 | Owens |
| 4,884,289 A | 11/1989 | Glockmann |
| 4,887,604 A | 12/1989 | Shefer |
| 4,979,137 A | 12/1990 | Gerstenfeld |
| 4,979,202 A | 12/1990 | Siczek |
| 4,987,584 A | 1/1991 | Doenges |
| 4,991,189 A | 2/1991 | Boomgaarden |
| 4,991,708 A | 2/1991 | Francioni |
| 4,998,270 A | 3/1991 | Scheid |
| 5,006,299 A | 4/1991 | Gozani |
| 5,014,293 A | 5/1991 | Boyd |
| 5,022,062 A | 6/1991 | Annis |
| 5,033,106 A | 7/1991 | Kita |
| 5,040,199 A | 8/1991 | Stein |
| 5,046,846 A | 9/1991 | Ray |
| 5,065,418 A | 11/1991 | Bermbach |
| 5,067,145 A | 11/1991 | Siczek |
| 5,076,993 A | 12/1991 | Sawa |
| 5,086,300 A | 2/1992 | Ash more |
| 5,091,924 A | 2/1992 | Bermbach |
| 5,092,451 A | 3/1992 | Jones |
| 5,097,939 A | 3/1992 | Shanklin |
| 5,098,640 A | 3/1992 | Gozani |
| 5,114,662 A | 5/1992 | Gozani |
| 5,144,191 A | 9/1992 | Jones |
| 5,179,581 A | 1/1993 | Annis |
| 5,181,234 A | 1/1993 | Smith |
| 5,182,764 A | 1/1993 | Peschmann |
| 5,185,778 A | 2/1993 | Magram |
| 5,202,932 A | 4/1993 | Cambier |
| 5,221,843 A | 6/1993 | Alvarez |
| 5,224,144 A | 6/1993 | Annis |
| 5,237,598 A | 8/1993 | Albert |
| 5,243,693 A | 9/1993 | Maron |
| 5,247,556 A | 9/1993 | Eckert |
| 5,247,561 A | 9/1993 | Kotowski |
| 5,253,283 A | 10/1993 | Annis |
| 5,259,012 A | 11/1993 | Baker |
| 5,259,014 A | 11/1993 | Brettschneider |
| 5,260,983 A | 11/1993 | Ono |
| 5,272,627 A | 12/1993 | Maschhoff |
| 5,313,511 A | 5/1994 | Annis |
| 5,319,547 A | 6/1994 | Krug |
| 5,319,696 A | 6/1994 | Abdel-Malek |
| 5,321,271 A | 6/1994 | Schonberg |
| 5,341,916 A | 8/1994 | Doane |
| 5,367,552 A | 11/1994 | Peschmann |
| 5,379,334 A | 1/1995 | Zimmer |
| 5,394,454 A | 2/1995 | Harding |
| 5,410,156 A | 4/1995 | Miller |
| 5,412,702 A | 5/1995 | Sata |
| 5,418,372 A | 5/1995 | Schonberg |
| 5,422,926 A | 6/1995 | Smith |
| 5,428,657 A | 6/1995 | Papanicolopoulos |
| 5,430,787 A | 7/1995 | Norton |
| 5,467,377 A | 11/1995 | Dawson |
| 5,490,196 A | 2/1996 | Rudich |
| 5,490,218 A | 2/1996 | Krug |
| 5,491,734 A | 2/1996 | Boyd |
| 5,493,596 A | 2/1996 | Annis |
| 5,505,291 A | 4/1996 | Huang |
| 5,511,104 A | 4/1996 | Mueller |
| 5,524,133 A | 6/1996 | Neale |
| 5,548,123 A | 8/1996 | Perez-Mendez |
| 5,557,108 A | 9/1996 | Tumer |
| 5,590,057 A | 12/1996 | Fletcher |
| 5,600,303 A | 2/1997 | Husseiny |
| 5,600,700 A | 2/1997 | Krug |

(56) References Cited

U.S. PATENT DOCUMENTS

| | | |
|---|---|---|
| 5,604,778 A | 2/1997 | Polacin |
| 5,606,167 A | 2/1997 | Miller |
| 5,633,907 A | 5/1997 | Gravelle |
| 5,634,551 A | 6/1997 | Francioni |
| 5,638,420 A | 6/1997 | Armistead |
| 5,638,817 A | 6/1997 | Morgan |
| 5,642,393 A | 6/1997 | Krug |
| 5,642,394 A | 6/1997 | Rothschild |
| 5,660,549 A | 8/1997 | Witt |
| 5,661,377 A | 8/1997 | Mishin |
| 5,661,774 A | 8/1997 | Gordon |
| 5,666,393 A | 9/1997 | Annis |
| 5,687,210 A | 11/1997 | Maitrejean |
| 5,689,541 A | 11/1997 | Schardt |
| 5,692,028 A | 11/1997 | Geus |
| 5,692,029 A | 11/1997 | Husseiny |
| 5,696,806 A | 12/1997 | Grodzins |
| 5,712,926 A | 1/1998 | Eberhard |
| 5,738,202 A | 4/1998 | Ydoate |
| 5,744,919 A | 4/1998 | Mishin |
| 5,751,837 A | 5/1998 | Watanabe |
| 5,763,886 A | 6/1998 | Schulte |
| 5,764,683 A | 6/1998 | Swift |
| 5,768,334 A | 6/1998 | Maitrejean |
| 5,787,145 A | 7/1998 | Geus |
| 5,796,802 A | 8/1998 | Gordon |
| 5,805,660 A | 9/1998 | Perion |
| 5,818,897 A | 10/1998 | Gordon |
| 5,838,758 A | 11/1998 | Krug |
| 5,838,759 A | 11/1998 | Armistead |
| 5,841,831 A | 11/1998 | Hell |
| 5,859,891 A | 1/1999 | Hibbard |
| 5,870,449 A | 2/1999 | Lee |
| 5,881,122 A | 3/1999 | Crawford |
| 5,882,206 A | 3/1999 | Gillio |
| 5,887,047 A | 3/1999 | Bailey |
| 5,901,198 A | 5/1999 | Crawford |
| 5,903,008 A | 5/1999 | Li |
| 5,903,623 A | 5/1999 | Swift |
| 5,905,806 A | 5/1999 | Eberhard |
| 5,909,477 A | 6/1999 | Crawford |
| 5,909,478 A | 6/1999 | Polichar |
| 5,910,973 A | 6/1999 | Grodzins |
| 5,930,326 A | 7/1999 | Rothschild |
| 5,936,247 A | 8/1999 | Lange |
| 5,940,468 A | 8/1999 | Huang |
| 5,949,811 A | 9/1999 | Baba |
| 5,949,842 A | 9/1999 | Schafer |
| 5,958,299 A | 9/1999 | Kury |
| 5,963,211 A | 10/1999 | Oikawa |
| 5,966,422 A | 10/1999 | Dafni |
| 5,970,113 A | 10/1999 | Crawford |
| 5,974,111 A | 10/1999 | Krug |
| 5,982,843 A | 11/1999 | Bailey |
| 5,987,097 A | 11/1999 | Salasoo |
| 6,018,562 A | 1/2000 | Willson |
| 6,021,174 A | 2/2000 | Campbell |
| 6,026,143 A | 2/2000 | Simanovsky |
| 6,026,171 A | 2/2000 | Hiraoglu |
| 6,031,888 A | 2/2000 | Ivan |
| 6,031,890 A | 2/2000 | Bermbach |
| 6,032,808 A | 3/2000 | Henson |
| 6,035,014 A | 3/2000 | Hiraoglu |
| 6,037,597 A | 3/2000 | Karavolos |
| 6,044,353 A | 3/2000 | Pugliese |
| 6,056,671 A | 5/2000 | Marmer |
| 6,058,158 A | 5/2000 | Eiler |
| 6,067,344 A | 5/2000 | Grodzins |
| 6,067,366 A | 5/2000 | Simanovsky |
| 6,069,936 A | 5/2000 | Bjorkholm |
| 6,073,751 A | 6/2000 | Worzischek |
| 6,075,871 A | 6/2000 | Simanovsky |
| 6,076,400 A | 6/2000 | Bechwati |
| 6,078,642 A | 6/2000 | Simanovsky |
| 6,081,580 A | 6/2000 | Grodzins |
| 6,088,423 A | 7/2000 | Krug |
| 6,091,795 A | 7/2000 | Schafer |
| 6,094,472 A | 7/2000 | Smith |
| 6,108,396 A | 8/2000 | Bechwati |
| 6,111,974 A | 8/2000 | Hiraoglu |
| 6,118,850 A | 9/2000 | Mayo |
| 6,118,852 A | 9/2000 | Rogers |
| 6,122,343 A | 9/2000 | Pidcock |
| 6,128,365 A | 10/2000 | Bechwati |
| 6,134,299 A | 10/2000 | Artig |
| 6,137,895 A | 10/2000 | Al-Sheikh |
| 6,149,592 A | 11/2000 | Yanof |
| 6,151,381 A | 11/2000 | Grodzins |
| 6,163,591 A | 12/2000 | Benjamin |
| 6,181,765 B1 | 1/2001 | Sribar |
| 6,183,139 B1 | 2/2001 | Solomon |
| 6,185,272 B1 | 2/2001 | Hiraoglu |
| 6,188,745 B1 | 2/2001 | Gordon |
| 6,188,747 B1 | 2/2001 | Geus |
| 6,192,101 B1 | 2/2001 | Grodzins |
| 6,192,104 B1 | 2/2001 | Adams |
| 6,195,413 B1 | 2/2001 | Geus |
| 6,195,444 B1 | 2/2001 | Simanovsky |
| 6,198,795 B1 | 3/2001 | Naumann |
| 6,200,024 B1 | 3/2001 | Negrelli |
| 6,212,251 B1 | 4/2001 | Tomura |
| 6,216,540 B1 | 4/2001 | Nelson |
| 6,218,943 B1 | 4/2001 | Ellenbogen |
| 6,236,709 B1 | 5/2001 | Perry |
| 6,236,712 B1 | 5/2001 | Tomasetti |
| 6,246,320 B1 | 6/2001 | Monroe |
| 6,249,567 B1 | 6/2001 | Rothschild |
| 6,252,929 B1 | 6/2001 | Swift |
| 6,256,369 B1 | 7/2001 | Lai |
| 6,256,404 B1 | 7/2001 | Gordon |
| 6,269,142 B1 | 7/2001 | Smith |
| 6,272,230 B1 | 8/2001 | Hiraoglu |
| 6,278,115 B1 | 8/2001 | Annis |
| 6,282,260 B1 | 8/2001 | Grodzins |
| 6,292,533 B1 | 9/2001 | Swift |
| 6,301,326 B2 | 10/2001 | Bjorkholm |
| 6,301,327 B1 | 10/2001 | Martens |
| 6,304,629 B1 | 10/2001 | Conway |
| 6,317,509 B1 | 11/2001 | Simanovsky |
| 6,320,933 B1 | 11/2001 | Grodzins |
| 6,324,249 B1 | 11/2001 | Fazzio |
| 6,327,339 B1 | 12/2001 | Chung |
| 6,345,113 B1 | 2/2002 | Crawford |
| 6,347,132 B1 | 2/2002 | Annis |
| 6,356,620 B1 | 3/2002 | Rothschild |
| 6,396,899 B2 | 5/2002 | Kuwabara |
| 6,418,189 B1 | 7/2002 | Schafer |
| 6,418,194 B1 | 7/2002 | McPherson |
| 6,421,420 B1 | 7/2002 | Grodzins |
| 6,424,695 B1 | 7/2002 | Grodzins |
| 6,427,891 B1 | 8/2002 | Anderson |
| 6,429,578 B1 | 8/2002 | Danielsson |
| 6,430,255 B2 | 8/2002 | Fenkart |
| 6,431,344 B1 | 8/2002 | Emmermann |
| 6,434,219 B1 | 8/2002 | Rothschild |
| 6,435,715 B1 | 8/2002 | Betz |
| 6,438,201 B1 | 8/2002 | Mazess |
| 6,442,233 B1 | 8/2002 | Grodzins |
| 6,445,765 B1 | 9/2002 | Frank |
| 6,446,782 B1 | 9/2002 | Patrick |
| 6,448,564 B1 | 9/2002 | Johnson |
| 6,453,003 B1 | 9/2002 | Springer |
| 6,453,007 B2 | 9/2002 | Adams |
| 6,456,684 B1 | 9/2002 | Mun |
| 6,459,755 B1 | 10/2002 | Li |
| 6,459,761 B1 | 10/2002 | Grodzins |
| 6,459,764 B1 | 10/2002 | Chalmers |
| 6,473,487 B1 | 10/2002 | Le |
| RE37,899 E | 11/2002 | Grodzins |
| 6,483,894 B2 | 11/2002 | Hartick |
| 6,507,025 B1 | 1/2003 | Verbinski |
| 6,528,787 B2 | 3/2003 | Katagami |
| 6,532,276 B1 | 3/2003 | Hartick |
| 6,542,574 B2 | 4/2003 | Grodzins |

(56) References Cited

U.S. PATENT DOCUMENTS

| | | |
|---|---|---|
| 6,542,578 B2 | 4/2003 | Ries |
| 6,542,580 B1 | 4/2003 | Carver |
| 6,543,599 B2 | 4/2003 | Jasinetzky |
| 6,546,072 B1 | 4/2003 | Chalmers |
| 6,552,346 B2 | 4/2003 | Verbinski |
| 6,556,653 B2 | 4/2003 | Hussein |
| 6,563,903 B2 | 5/2003 | Kang |
| 6,563,906 B2 | 5/2003 | Hussein |
| 6,567,496 B1 | 5/2003 | Sychev |
| 6,580,778 B2 | 6/2003 | Meder |
| 6,584,170 B2 | 6/2003 | Aust |
| 6,590,956 B2 | 7/2003 | Fenkart |
| 6,591,130 B2 | 7/2003 | Shahidi |
| 6,597,760 B2 | 7/2003 | Beneke |
| 6,606,516 B2 | 8/2003 | Levine |
| 6,618,466 B1 | 9/2003 | Ning |
| 6,621,888 B2 | 9/2003 | Grodzins |
| 6,629,593 B2 | 10/2003 | Zeitler |
| 6,632,020 B2 | 10/2003 | Kaufhold |
| 6,636,581 B2 | 10/2003 | Sorenson |
| 6,636,623 B2 | 10/2003 | Nelson |
| 6,647,091 B2 | 11/2003 | Fenkart |
| 6,647,094 B2 | 11/2003 | Harding |
| 6,647,095 B2 | 11/2003 | Hsieh |
| 6,653,588 B1 | 11/2003 | Gillard-Hickman |
| 6,658,087 B2 | 12/2003 | Chalmers |
| 6,661,867 B2 | 12/2003 | Mario |
| 6,661,876 B2 | 12/2003 | Turner |
| 6,663,280 B2 | 12/2003 | Doenges |
| 6,665,373 B1 | 12/2003 | Kotowski |
| 6,665,433 B2 | 12/2003 | Roder |
| 6,687,333 B2 | 2/2004 | Carroll |
| 6,690,766 B2 | 2/2004 | Kresse |
| 6,705,357 B2 | 3/2004 | Jeon |
| 6,707,879 B2 | 3/2004 | McClelland |
| 6,713,773 B1 | 3/2004 | Lyons |
| 6,715,533 B2 | 4/2004 | Kresse |
| 6,721,387 B1 | 4/2004 | Naidu |
| 6,721,391 B2 | 4/2004 | McClelland |
| 6,727,506 B2 | 4/2004 | Mallette |
| 6,735,271 B1 | 5/2004 | Rand |
| 6,737,652 B2 | 5/2004 | Lanza |
| 6,744,845 B2 | 6/2004 | Harding |
| 6,748,043 B1 | 6/2004 | Dobbs |
| 6,754,298 B2 | 6/2004 | Fessler |
| 6,760,407 B2 | 7/2004 | Price |
| 6,763,083 B2 | 7/2004 | Fernandez |
| 6,763,635 B1 | 7/2004 | Lowman |
| 6,770,884 B2 | 8/2004 | Bryman |
| 6,775,348 B2 | 8/2004 | Hoffman |
| 6,785,357 B2 | 8/2004 | Bernardi |
| 6,788,761 B2 | 9/2004 | Bijjani |
| 6,812,426 B1 | 11/2004 | Kotowski |
| 6,813,374 B1 | 11/2004 | Karimi |
| 6,816,571 B2 | 11/2004 | Bijjani |
| 6,827,265 B2 | 12/2004 | Knowles |
| 6,829,585 B1 | 12/2004 | Grewal |
| 6,830,185 B2 | 12/2004 | Tsikos |
| 6,837,422 B1 | 1/2005 | Meder |
| 6,837,432 B2 | 1/2005 | Tsikos |
| 6,839,134 B2 | 1/2005 | Saito |
| 6,839,403 B1 | 1/2005 | Kotowski |
| 6,843,599 B2 | 1/2005 | Le |
| 6,847,040 B2 | 1/2005 | Strommer |
| 6,856,344 B2 | 2/2005 | Franz |
| 6,856,667 B2 | 2/2005 | Ellenbogen |
| 6,859,514 B2 | 2/2005 | Hoffman |
| 6,869,217 B2 | 3/2005 | Rasche |
| 6,876,719 B2 | 4/2005 | Ozaki |
| 6,876,724 B2 | 4/2005 | Zhou |
| 6,879,657 B2 | 4/2005 | Hoffman |
| 6,899,540 B1 | 5/2005 | Neiderman |
| 6,901,135 B2 | 5/2005 | Fox et al. |
| 6,901,346 B2 | 5/2005 | Tracy |
| 6,906,329 B2 | 6/2005 | Bryman |
| 6,907,101 B2 | 6/2005 | Hoffman |
| 6,920,197 B2 | 7/2005 | Kang |
| 6,922,455 B2 | 7/2005 | Jurczyk |
| 6,922,460 B2 | 7/2005 | Skatter |
| 6,922,461 B2 | 7/2005 | Kang |
| 6,928,141 B2 | 8/2005 | Carver |
| 6,933,504 B2 | 8/2005 | Hoffman |
| 6,934,354 B2 | 8/2005 | Hoffman |
| 6,937,692 B2 | 8/2005 | Johnson |
| 6,940,071 B2 | 9/2005 | Ramsden |
| 6,944,264 B2 | 9/2005 | Bijjani |
| 6,947,517 B2 | 9/2005 | Hoffman |
| 6,950,492 B2 | 9/2005 | Besson |
| 6,950,493 B2 | 9/2005 | Besson |
| 6,952,163 B2 | 10/2005 | Huey |
| 6,953,935 B1 | 10/2005 | Hoffman |
| 6,957,913 B2 | 10/2005 | Renkart |
| 6,962,289 B2 | 11/2005 | Vatan |
| 6,965,314 B2 | 11/2005 | Bohinc, Jr. |
| 6,968,030 B2 | 11/2005 | Hoffman |
| 6,968,034 B2 | 11/2005 | Ellenbogen |
| 6,971,577 B2 | 12/2005 | Tsikos |
| 6,972,693 B2 | 12/2005 | Brown |
| 6,973,158 B2 | 12/2005 | Besson |
| 6,975,698 B2 | 12/2005 | Katcha |
| 6,978,936 B2 | 12/2005 | Tsikos |
| 6,980,627 B2 | 12/2005 | Qiu |
| 6,983,704 B1 | 1/2006 | Ness |
| 6,987,833 B2 | 1/2006 | Du |
| 6,990,171 B2 | 1/2006 | Toth |
| 6,990,172 B2 | 1/2006 | Toth |
| 6,991,371 B2 | 1/2006 | Georgeson |
| 6,993,115 B2 | 1/2006 | McGuire |
| 6,996,209 B2 | 2/2006 | Marek |
| 7,010,083 B2 | 3/2006 | Hoffman |
| 7,010,094 B2 | 3/2006 | Grodzins |
| 7,016,459 B2 | 3/2006 | Ellenbogen |
| 7,020,241 B2 | 3/2006 | Beneke |
| 7,020,242 B2 | 3/2006 | Ellenbogen |
| 7,023,956 B2 | 4/2006 | Heaton |
| 7,023,957 B2 | 4/2006 | Bijjani |
| 7,027,553 B2 | 4/2006 | Dunham |
| 7,027,554 B2 | 4/2006 | Gaultier |
| 7,028,442 B2 | 4/2006 | Merrifield |
| 7,031,430 B2 | 4/2006 | Kaucic |
| 7,031,434 B1 | 4/2006 | Saunders |
| 7,034,313 B2 | 4/2006 | Hoffman |
| 7,039,154 B1 | 5/2006 | Ellenbogen |
| 7,039,159 B2 | 5/2006 | Muenchau |
| 7,042,975 B2 | 5/2006 | Heuscher |
| 7,045,787 B1 | 5/2006 | Verbinski |
| 7,045,788 B2 | 5/2006 | Iwatschenko-Borho |
| 7,046,756 B2 | 5/2006 | Hoffman |
| 7,046,761 B2 | 5/2006 | Ellenbogen |
| 7,046,768 B1 | 5/2006 | Gilevich |
| 7,050,536 B1 | 5/2006 | Fenkart |
| 7,050,541 B2 | 5/2006 | Bittl |
| 7,054,408 B2 | 5/2006 | Jiang |
| 7,062,009 B2 | 6/2006 | Karimi |
| 7,062,011 B1 | 6/2006 | Tybinkowski |
| 7,062,074 B1 | 6/2006 | Beneke |
| 7,064,334 B2 | 6/2006 | Hoffman |
| 7,065,175 B2 | 6/2006 | Green |
| 7,065,179 B2 | 6/2006 | Block |
| 7,068,749 B2 | 6/2006 | Kollegal |
| 7,068,750 B2 | 6/2006 | Toth |
| 7,068,751 B2 | 6/2006 | Toth |
| 7,072,434 B1 | 7/2006 | Tybinkowski |
| 7,076,029 B2 | 7/2006 | Toth |
| 7,078,699 B2 | 7/2006 | Seppi |
| 7,081,628 B2 | 7/2006 | Granfors |
| 7,084,404 B2 | 8/2006 | Hoffman |
| 7,087,902 B2 | 8/2006 | Wang |
| 7,088,799 B2 | 8/2006 | Hoffman |
| 7,090,133 B2 | 8/2006 | Zhu |
| 7,092,481 B2 | 8/2006 | Hoffman |
| 7,092,485 B2 | 8/2006 | Kravis |
| 7,099,434 B2 | 8/2006 | Adams |
| 7,099,435 B2 | 8/2006 | Heumann |

(56) References Cited

U.S. PATENT DOCUMENTS

| | | |
|---|---|---|
| 7,103,137 B2 | 9/2006 | Seppi |
| 7,110,488 B2 | 9/2006 | Katcha |
| 7,112,797 B2 | 9/2006 | Hoge |
| 7,116,235 B2 | 10/2006 | Alioto |
| 7,116,749 B2 | 10/2006 | Besson |
| 7,116,751 B2 | 10/2006 | Ellenbogen |
| 7,119,553 B2 | 10/2006 | Yang |
| 7,123,681 B2 | 10/2006 | Ellenbogen |
| 7,127,027 B2 | 10/2006 | Hoffman |
| 7,130,374 B1 | 10/2006 | Jacobs |
| 7,130,484 B2 | 10/2006 | August |
| RE39,396 E | 11/2006 | Swift |
| 7,133,491 B2 | 11/2006 | Bernardi |
| 7,136,450 B2 | 11/2006 | Ying |
| 7,136,451 B2 | 11/2006 | Naidu |
| 7,139,367 B1 | 11/2006 | Le |
| 7,139,406 B2 | 11/2006 | McClelland |
| 7,142,208 B2 | 11/2006 | Lorenz |
| 7,142,629 B2 | 11/2006 | Edic |
| 7,149,278 B2 | 12/2006 | Arenson |
| 7,149,339 B2 | 12/2006 | Veneruso |
| 7,154,989 B2 | 12/2006 | Ueno |
| 7,155,812 B1 | 1/2007 | Peterson |
| 7,158,611 B2 | 1/2007 | Heismann |
| 7,162,005 B2 | 1/2007 | Bjorkholm |
| 7,162,285 B2 | 1/2007 | Owens |
| 7,164,747 B2 | 1/2007 | Ellenbogen |
| 7,164,750 B2 | 1/2007 | Nabors |
| 7,166,458 B2 | 1/2007 | Ballerstadt |
| 7,166,844 B1 | 1/2007 | Gormley |
| 7,167,539 B1 | 1/2007 | Hoffman |
| 7,173,998 B2 | 2/2007 | Hoffman |
| 7,177,387 B2 | 2/2007 | Yasunaga |
| 7,177,391 B2 | 2/2007 | Chapin |
| 7,187,756 B2 | 3/2007 | Gohno |
| 7,190,757 B2 | 3/2007 | Ying |
| 7,192,031 B2 | 3/2007 | Dunham |
| 7,197,113 B1 | 3/2007 | Katcha |
| 7,197,172 B1 | 3/2007 | Naidu |
| 7,203,276 B2 | 4/2007 | Arsenault |
| 7,203,629 B2 | 4/2007 | Oezis |
| 7,204,125 B2 | 4/2007 | Fine |
| 7,206,379 B2 | 4/2007 | Lemaitre |
| 7,207,713 B2 | 4/2007 | Lowman |
| 7,212,113 B2 | 5/2007 | Zanovitch |
| 7,215,731 B1 | 5/2007 | Basu |
| 7,215,737 B2 | 5/2007 | Li |
| 7,215,738 B2 | 5/2007 | Muenchau |
| 7,218,700 B2 | 5/2007 | Huber |
| 7,218,704 B1 | 5/2007 | Adams |
| 7,224,763 B2 | 5/2007 | Naidu |
| 7,224,765 B2 | 5/2007 | Ellenbogen |
| 7,224,766 B2 | 5/2007 | Jiang |
| 7,224,769 B2 | 5/2007 | Turner |
| 7,233,640 B2 | 6/2007 | Ikhlef |
| 7,233,644 B1 | 6/2007 | Bendahan |
| 7,236,564 B2 | 6/2007 | Hopkins |
| 7,238,945 B2 | 7/2007 | Hoffman |
| 7,238,951 B2 | 7/2007 | Disdier |
| 7,244,947 B2 | 7/2007 | Polichar |
| 7,247,856 B2 | 7/2007 | Hoge |
| 7,250,940 B2 | 7/2007 | Jayanetti |
| 7,251,310 B2 | 7/2007 | Smith |
| 7,257,189 B2 | 8/2007 | Modica |
| 7,260,170 B2 | 8/2007 | Arenson |
| 7,260,171 B1 | 8/2007 | Arenson |
| 7,260,172 B2 | 8/2007 | Arenson |
| 7,260,173 B2 | 8/2007 | Wakayama |
| 7,260,174 B2 | 8/2007 | Hoffman |
| 7,260,182 B2 | 8/2007 | Toth |
| 7,260,255 B2 | 8/2007 | Polichar |
| 7,263,160 B2 | 8/2007 | Schlomka |
| 7,266,180 B1 | 9/2007 | Saunders |
| 7,272,208 B2 | 9/2007 | Yatsenko |
| 7,272,429 B2 | 9/2007 | Walker |
| 7,274,767 B2 | 9/2007 | Clayton |
| 7,277,577 B2 | 10/2007 | Ying |
| 7,279,120 B2 | 10/2007 | Cheng |
| 7,280,631 B2 | 10/2007 | De |
| 7,282,727 B2 | 10/2007 | Retsky |
| 7,283,604 B2 | 10/2007 | De |
| 7,283,609 B2 | 10/2007 | Possin |
| 7,286,638 B2 | 10/2007 | Ledoux |
| 7,295,019 B2 | 11/2007 | Yang |
| 7,295,651 B2 | 11/2007 | Delgado |
| 7,298,812 B2 | 11/2007 | Tkaczyk |
| 7,302,083 B2 | 11/2007 | Larson |
| 7,308,073 B2 | 12/2007 | Tkaczyk |
| 7,308,074 B2 | 12/2007 | Jiang |
| 7,308,076 B2 | 12/2007 | Studer |
| 7,308,077 B2 | 12/2007 | Bijjani |
| 7,317,195 B2 | 1/2008 | Eikman |
| 7,317,259 B2 | 1/2008 | Yamauchi |
| 7,317,390 B2 | 1/2008 | Huey |
| 7,319,737 B2 | 1/2008 | Singh |
| 7,322,745 B2 | 1/2008 | Agrawal |
| 7,324,625 B2 | 1/2008 | Eilbert |
| 7,327,853 B2 | 2/2008 | Ying |
| 7,330,527 B2 | 2/2008 | Hoffman |
| 7,330,535 B2 | 2/2008 | Arenson |
| 7,333,587 B2 | 2/2008 | De |
| 7,333,588 B2 | 2/2008 | Mistretta |
| 7,333,589 B2 | 2/2008 | Ellenbogen |
| 7,335,887 B1 | 2/2008 | Verbinski |
| 7,336,769 B2 | 2/2008 | Arenson |
| 7,349,525 B2 | 3/2008 | Morton |
| 7,352,843 B2 | 4/2008 | Hu |
| 7,356,174 B2 | 4/2008 | Leue |
| 7,366,282 B2 | 4/2008 | Peschmann |
| 7,368,717 B2 | 5/2008 | Verbinski |
| 7,369,463 B1 | 5/2008 | Van Dullemen |
| 7,369,640 B2 | 5/2008 | Seppi |
| 7,369,642 B2 | 5/2008 | Eilbert |
| 7,369,643 B2 | 5/2008 | Kotowski |
| 7,372,040 B2 | 5/2008 | Polichar |
| 7,372,944 B2 | 5/2008 | Bernhardt |
| 7,379,530 B2 | 5/2008 | Hoff |
| 7,381,962 B2 | 6/2008 | Goldberg |
| 7,386,092 B2 | 6/2008 | Kang |
| 7,397,891 B2 | 7/2008 | Johnson |
| 7,400,701 B1 | 7/2008 | Cason |
| 7,406,192 B2 | 7/2008 | Schmiegel |
| 7,420,174 B2 | 9/2008 | Kurita |
| 7,429,738 B2 | 9/2008 | Li |
| 7,440,543 B2 | 10/2008 | Morton |
| 7,440,544 B2 | 10/2008 | Scheinman |
| 7,453,987 B1 | 11/2008 | Richardson |
| 7,460,639 B2 | 12/2008 | Tudor |
| 7,470,914 B2 | 12/2008 | Li |
| 7,471,764 B2 | 12/2008 | Kaval |
| 7,475,428 B2 | 1/2009 | Smith |
| 7,475,866 B2 | 1/2009 | Hu |
| 7,483,510 B2 | 1/2009 | Carver |
| 7,483,511 B2 | 1/2009 | Bendahan |
| 7,486,768 B2 | 2/2009 | Allman |
| 7,492,682 B2 | 2/2009 | Osakabe |
| 7,492,855 B2 | 2/2009 | Hopkins |
| 7,492,862 B2 | 2/2009 | Bendahan |
| 7,492,934 B2 | 2/2009 | Mundy |
| 7,500,931 B2 | 3/2009 | Rosemeier |
| 7,505,556 B2 | 3/2009 | Chalmers |
| 7,505,557 B2 | 3/2009 | Modica |
| 7,505,562 B2 | 3/2009 | Dinca |
| 7,512,210 B2 | 3/2009 | Possin |
| 7,512,215 B2 | 3/2009 | Morton |
| 7,517,149 B2 | 4/2009 | Agrawal |
| 7,519,148 B2 | 4/2009 | Kotowski |
| 7,522,696 B2 | 4/2009 | Imai |
| 7,525,101 B2 | 4/2009 | Grodzins |
| 7,526,064 B2 | 4/2009 | Akery |
| 7,538,325 B2 | 5/2009 | Mishin |
| 7,547,888 B2 | 6/2009 | Cooke |
| 7,551,714 B2 | 6/2009 | Rothschild |
| 7,551,715 B2 | 6/2009 | Rothschild |

(56) References Cited

U.S. PATENT DOCUMENTS

| | | |
|---|---|---|
| 7,551,718 B2 | 6/2009 | Rothschild |
| 7,555,099 B2 | 6/2009 | Rothschild |
| 7,564,939 B2 | 7/2009 | Morton |
| 7,580,505 B2 | 8/2009 | Kang |
| 7,593,506 B2 | 9/2009 | Cason |
| 7,593,510 B2 | 9/2009 | Rothschild |
| 7,649,976 B2 | 1/2010 | Georgeson |
| 7,653,545 B1 | 1/2010 | Starkie |
| 7,663,109 B2 | 2/2010 | Kang |
| 7,684,538 B2 | 3/2010 | Morton |
| 7,693,261 B2 | 4/2010 | Robinson |
| 7,702,075 B2 | 4/2010 | Wang |
| 7,720,195 B2 | 5/2010 | Allman |
| 7,724,869 B2 | 5/2010 | Wang |
| 7,734,066 B2 | 6/2010 | DeLia |
| 7,738,687 B2 | 6/2010 | Tortora |
| 7,741,612 B2 | 6/2010 | Clothier |
| 7,742,568 B2 | 6/2010 | Smith |
| 7,750,294 B2 | 7/2010 | Bright |
| 7,760,103 B2 | 7/2010 | Frank |
| 7,762,760 B2 | 7/2010 | Takehara |
| 7,769,133 B2 | 8/2010 | Carver |
| 7,783,003 B2 | 8/2010 | Clayton |
| 7,783,004 B2 | 8/2010 | Kotowski |
| 7,783,005 B2 | 8/2010 | Kaval |
| 7,796,734 B2 | 9/2010 | Mastronardi |
| 7,800,073 B2 | 9/2010 | Clothier |
| 7,809,103 B2 | 10/2010 | Du |
| 7,809,104 B2 | 10/2010 | Foland |
| 7,809,109 B2 | 10/2010 | Mastronardi |
| 7,817,775 B2 | 10/2010 | Kang |
| 7,817,776 B2 | 10/2010 | Agrawal |
| 7,835,486 B2 | 11/2010 | Basu |
| 7,844,027 B2 | 11/2010 | Harding |
| 7,860,213 B2 | 12/2010 | Akery |
| 7,876,879 B2 | 1/2011 | Morton |
| 7,876,880 B2 | 1/2011 | Kotowski |
| 7,885,375 B2 | 2/2011 | Bernard |
| 7,903,783 B2 | 3/2011 | Modica |
| 7,920,735 B2 | 4/2011 | Krauss |
| 7,952,079 B2 | 5/2011 | Neustadter |
| 7,957,506 B2 | 6/2011 | Smith |
| 7,963,695 B2 | 6/2011 | Kotowski |
| 7,965,695 B2 | 6/2011 | Valko |
| 7,965,816 B2 | 6/2011 | Kravis |
| 7,973,697 B2 | 7/2011 | Reilly |
| 7,991,113 B2 | 8/2011 | Carver |
| 7,991,117 B2 | 8/2011 | Chen |
| 7,995,705 B2 | 8/2011 | Allman |
| 8,000,436 B2 | 8/2011 | Seppi |
| 8,031,903 B2 | 10/2011 | Paresi |
| 8,054,937 B2 | 11/2011 | Langeveld |
| 8,054,938 B2 | 11/2011 | Kaval |
| 8,059,781 B2 | 11/2011 | Agrawal |
| 8,111,889 B2 | 2/2012 | Basu |
| 8,116,428 B2 | 2/2012 | Gudmundson |
| 8,121,258 B2 | 2/2012 | Hoghoj |
| 8,148,693 B2 | 4/2012 | Ryge |
| 8,170,177 B2 | 5/2012 | Akery |
| 8,173,970 B2 | 5/2012 | Inbar |
| 8,179,597 B2 | 5/2012 | Namba |
| 8,194,822 B2 | 6/2012 | Rothschild |
| 8,233,586 B1 | 7/2012 | Boas |
| 8,263,938 B2 | 9/2012 | Bjorkholm |
| 8,275,091 B2 | 9/2012 | Morton |
| 8,350,747 B2 | 1/2013 | Delia |
| 8,356,937 B2 | 1/2013 | Kotowski |
| 8,385,501 B2 | 2/2013 | Allman |
| 8,389,941 B2 | 3/2013 | Bendahan |
| 8,389,942 B2 | 3/2013 | Morton |
| 8,401,147 B2 | 3/2013 | Ryge |
| 8,433,036 B2 | 4/2013 | Morton |
| 8,437,448 B2 | 5/2013 | Langeveld |
| 8,451,974 B2 | 5/2013 | Morton |
| 8,457,275 B2 | 6/2013 | Akery |
| 8,483,356 B2 | 7/2013 | Bendahan |
| 8,491,189 B2 | 7/2013 | Kotowski |
| 8,498,376 B2 | 7/2013 | Modica |
| 8,502,699 B2 | 8/2013 | Zerwekh |
| 8,503,605 B2 | 8/2013 | Morton |
| 8,579,506 B2 | 11/2013 | Morton |
| 8,582,720 B2 | 11/2013 | Morton |
| 8,644,453 B2 | 2/2014 | Morton |
| 8,668,386 B2 | 3/2014 | Morton |
| 8,687,765 B2 | 4/2014 | Kotowski |
| 8,724,774 B2 | 5/2014 | Langeveld |
| 8,735,833 B2 | 5/2014 | Morto |
| 8,744,033 B2 | 6/2014 | Oosaka |
| 8,750,452 B2 | 6/2014 | Kaval |
| 8,781,067 B2 | 7/2014 | Langeveld |
| 8,798,232 B2 | 8/2014 | Bendahan |
| 8,831,176 B2 | 9/2014 | Morto |
| 8,837,670 B2 | 9/2014 | Akery |
| 2002/0031202 A1 | 3/2002 | Callerame |
| 2002/0038753 A1 | 4/2002 | Ursu |
| 2002/0045152 A1 | 4/2002 | Viscardi |
| 2003/0023592 A1 | 1/2003 | Modica |
| 2003/0035510 A1 | 2/2003 | Strommer |
| 2003/0072417 A1 | 4/2003 | Kaufhold |
| 2003/0085163 A1 | 5/2003 | Chan |
| 2003/0118246 A1 | 6/2003 | August |
| 2003/0185340 A1 | 10/2003 | Frantz |
| 2004/0017888 A1 | 1/2004 | Seppi |
| 2004/0062346 A1 | 4/2004 | Fernandez |
| 2004/0086078 A1 | 5/2004 | Adams |
| 2004/0101098 A1 | 5/2004 | Bijjani |
| 2004/0125914 A1 | 7/2004 | Kang |
| 2004/0141584 A1 | 7/2004 | Bernardi |
| 2004/0178339 A1 | 9/2004 | Gentile |
| 2004/0202287 A1 | 10/2004 | Muller |
| 2004/0213378 A1 | 10/2004 | Zhou |
| 2004/0258198 A1 | 12/2004 | Carver |
| 2004/0258305 A1 | 12/2004 | Burnham |
| 2004/0267114 A1 | 12/2004 | Mundy |
| 2005/0008119 A1 | 1/2005 | McClelland |
| 2005/0008120 A1 | 1/2005 | Ellenbogen |
| 2005/0023479 A1 | 2/2005 | Grodzins |
| 2005/0031076 A1 | 2/2005 | McClelland |
| 2005/0100135 A1 | 5/2005 | Lowman |
| 2005/0117683 A1 | 6/2005 | Mishin |
| 2005/0117700 A1 | 6/2005 | Peschmann |
| 2005/0123101 A1 | 6/2005 | Akutsu |
| 2005/0152504 A1 | 7/2005 | Shih |
| 2005/0156734 A1 | 7/2005 | Zerwekh |
| 2005/0169421 A1 | 8/2005 | Muenchau |
| 2005/0226364 A1 | 10/2005 | Bernard |
| 2005/0226484 A1 | 10/2005 | Basu |
| 2005/0251397 A1 | 11/2005 | Zanovitch |
| 2006/0056584 A1 | 3/2006 | Allman |
| 2006/0115109 A1 | 6/2006 | Whitson |
| 2006/0126772 A1 | 6/2006 | Hu |
| 2006/0140341 A1 | 6/2006 | Carver |
| 2006/0182221 A1 | 8/2006 | Bernhardt |
| 2006/0215811 A1 | 9/2006 | Modica |
| 2006/0249685 A1* | 11/2006 | Tanaka .......... 250/397 |
| 2006/0274916 A1 | 12/2006 | Chan |
| 2007/0009088 A1 | 1/2007 | Edic |
| 2007/0085010 A1 | 4/2007 | Letant |
| 2007/0087885 A1 | 4/2007 | Rosemeier |
| 2007/0092066 A1 | 4/2007 | Tkaczyk |
| 2007/0104320 A1 | 5/2007 | Arenson |
| 2007/0110215 A1 | 5/2007 | Hu |
| 2007/0147585 A1 | 6/2007 | Eilbert |
| 2007/0151783 A1 | 7/2007 | Yamauchi |
| 2007/0194909 A1 | 8/2007 | Garfield |
| 2007/0211851 A1 | 9/2007 | Ogawa |
| 2007/0269005 A1 | 11/2007 | Chalmers |
| 2007/0280416 A1 | 12/2007 | Bendahan |
| 2007/0280502 A1 | 12/2007 | Paresi |
| 2007/0286329 A1 | 12/2007 | Wang |
| 2008/0013672 A1 | 1/2008 | Krauss |
| 2008/0037707 A1 | 2/2008 | Rothschild |
| 2008/0044801 A1 | 2/2008 | Modica |
| 2008/0056432 A1 | 3/2008 | Pack |

(56) References Cited

U.S. PATENT DOCUMENTS

| | | | |
|---|---|---|---|
| 2008/0056608 A1 | 3/2008 | Spahn | |
| 2008/0123809 A1 | 5/2008 | Tudor | |
| 2008/0156992 A1 | 7/2008 | Kang | |
| 2008/0170655 A1 | 7/2008 | Bendahan | |
| 2008/0198970 A1* | 8/2008 | Kirshner et al. | 378/137 |
| 2008/0205594 A1 | 8/2008 | Bjorkholm | |
| 2008/0211431 A1 | 9/2008 | Mishin | |
| 2008/0240341 A1 | 10/2008 | Possin | |
| 2008/0283761 A1 | 11/2008 | Robinson | |
| 2008/0298546 A1 | 12/2008 | Bueno | |
| 2009/0041197 A1 | 2/2009 | Clayton | |
| 2009/0086314 A1 | 4/2009 | Namba | |
| 2009/0154650 A1* | 6/2009 | Tanabe | 378/137 |
| 2009/0257555 A1 | 10/2009 | Chalmers | |
| 2010/0002834 A1 | 1/2010 | Gudmundson | |
| 2010/0020937 A1* | 1/2010 | Hautmann et al. | 378/137 |
| 2010/0034353 A1 | 2/2010 | Kravis | |
| 2010/0034355 A1 | 2/2010 | Langeveld | |
| 2010/0072405 A1* | 3/2010 | Yu et al. | 250/493.1 |
| 2010/0177868 A1 | 7/2010 | Smith | |
| 2010/0295689 A1 | 11/2010 | Armistead | |
| 2011/0019797 A1 | 1/2011 | Morton | |
| 2011/0096906 A1 | 4/2011 | Langeveld | |
| 2011/0135060 A1 | 6/2011 | Morton | |
| 2011/0176660 A1 | 7/2011 | Morton | |
| 2011/0216881 A1 | 9/2011 | Modica | |
| 2011/0235777 A1 | 9/2011 | Gozani | |
| 2011/0305318 A1 | 12/2011 | Robinson | |
| 2012/0099710 A1 | 4/2012 | Kotowski | |
| 2012/0116720 A1 | 5/2012 | Klann | |
| 2012/0134473 A1 | 5/2012 | Morton | |
| 2012/0177176 A1 | 7/2012 | Carver | |
| 2013/0039472 A1 | 2/2013 | Morton | |

FOREIGN PATENT DOCUMENTS

| | | |
|---|---|---|
| CA | 2636306 A1 | 9/2009 |
| DE | 2729353 A1 | 1/1979 |
| DE | 3214910 A1 | 5/1983 |
| EP | 77018 | 4/1983 |
| EP | 0077018 A1 | 4/1983 |
| EP | 0146992 A1 | 7/1985 |
| EP | 0176314 | 4/1986 |
| EP | 0261984 A2 | 3/1988 |
| EP | 0287707 | 10/1988 |
| EP | 0417965 | 3/1991 |
| EP | 0432568 | 6/1991 |
| EP | 0531993 A1 | 3/1993 |
| EP | 0584871 A1 | 3/1994 |
| EP | 0549858 | 3/1998 |
| EP | 0864884 A2 | 9/1998 |
| EP | 0919186 A2 | 6/1999 |
| EP | 0924742 A2 | 6/1999 |
| EP | 0930046 A2 | 7/1999 |
| EP | 0963925 A2 | 12/1999 |
| EP | 1277439 A1 | 1/2003 |
| EP | 1374776 A1 | 1/2004 |
| EP | 1413898 A1 | 4/2004 |
| EP | 2255224 | 12/2010 |
| FR | 2328280 A1 | 5/1977 |
| GB | 516517 A | 1/1940 |
| GB | 1497396 A | 1/1978 |
| GB | 1526041 A | 9/1978 |
| GB | 2015245 A | 9/1979 |
| GB | 2089109 A | 6/1982 |
| GB | 2212903 A | 8/1989 |
| GB | 2255634 A | 11/1992 |
| GB | 2277013 A | 10/1994 |
| GB | 2337032 A | 11/1999 |
| GB | 2404431 | 2/2005 |
| GB | 2409268 A | 6/2005 |
| GB | 2424065 A | 9/2006 |
| GB | 2437777 A | 11/2007 |
| GB | 2438317 A | 11/2007 |
| GB | 10017382 | 2/2010 |
| GB | 2470161 | 11/2010 |
| GB | 2470163 | 11/2010 |
| GB | 2470330 | 11/2010 |
| JP | 570175247 | 10/1982 |
| JP | 59016254 | 1/1984 |
| JP | 5975549 | 4/1984 |
| JP | 600015546 | 1/1985 |
| JP | 600021440 | 2/1985 |
| JP | H10211196 A | 8/1998 |
| JP | H11230918 A | 8/1999 |
| JP | 2001176408 | 6/2001 |
| JP | 2001233440 A | 8/2001 |
| JP | 2003126075 A | 5/2003 |
| JP | 2004000605 A | 1/2004 |
| JP | 2005013768 A | 1/2005 |
| WO | 9528715 A2 | 10/1995 |
| WO | 9802763 A1 | 1/1998 |
| WO | 9803889 A1 | 1/1998 |
| WO | 9820366 A1 | 5/1998 |
| WO | 9855851 A1 | 12/1998 |
| WO | 9909400 | 2/1999 |
| WO | 9939189 A2 | 8/1999 |
| WO | 9960387 A2 | 11/1999 |
| WO | 0033060 A2 | 6/2000 |
| WO | 0159485 | 8/2001 |
| WO | 0159485 A1 | 8/2001 |
| WO | 03051201 A2 | 6/2003 |
| WO | 03105159 | 12/2003 |
| WO | 2004010127 A1 | 1/2004 |
| WO | 2004037088 | 5/2004 |
| WO | 2004111625 | 12/2004 |
| WO | 2005084351 | 9/2005 |
| WO | 2005091227 | 9/2005 |
| WO | 2005098400 A2 | 10/2005 |
| WO | 2006000020 A1 | 1/2006 |
| WO | 2006036076 A1 | 4/2006 |
| WO | 2006045019 | 4/2006 |
| WO | 2006053279 A2 | 5/2006 |
| WO | 2006078691 A2 | 7/2006 |
| WO | 2006095188 | 9/2006 |
| WO | 2006135586 | 12/2006 |
| WO | 2007035359 A2 | 3/2007 |
| WO | 2007051092 | 5/2007 |
| WO | 2007055720 A2 | 5/2007 |
| WO | 2007068933 A1 | 6/2007 |
| WO | 2007103216 A2 | 9/2007 |
| WO | 2008017983 A2 | 2/2008 |
| WO | 2009000020 A1 | 12/2008 |
| WO | 2009027667 A2 | 3/2009 |
| WO | 2009088706 | 9/2009 |
| WO | 2009106803 | 9/2009 |
| WO | 2009106815 | 9/2009 |
| WO | 2009106857 | 9/2009 |
| WO | 2009141613 | 11/2009 |
| WO | 2009141615 | 11/2009 |
| WO | 2009137698 | 12/2009 |
| WO | 2009150416 A2 | 12/2009 |
| WO | 2010019311 | 2/2010 |
| WO | 2010135620 | 11/2010 |
| WO | 2011008718 | 1/2011 |
| WO | 2011017475 | 2/2011 |
| WO | 2011069024 A1 | 6/2011 |
| WO | 2011087861 | 7/2011 |
| WO | 2011095810 | 8/2011 |
| WO | 2011095942 A2 | 8/2011 |
| WO | 2011106463 A1 | 9/2011 |
| WO | 2011142768 A2 | 11/2011 |
| WO | 2012109273 | 8/2012 |
| WO | 2012170914 A1 | 12/2012 |
| WO | 2012174265 | 12/2012 |
| WO | 2014124152 A2 | 8/2014 |

OTHER PUBLICATIONS

International Search Report for PCT/US14/56652, Apr. 27, 2015.
International Search Report for PCT/US12/41696, Rapiscan Systems Inc., mailed on Sep. 18, 2012.

(56) References Cited

OTHER PUBLICATIONS

International Search Report for PCT/US09/47292, mailed on Apr. 23, 2012, Rapiscan Laboratories, Inc.
International Search Report for PCT/GB2011/050182, Dec. 28, 2011.
Office Action dated Nov. 5, 2014 for U.S. Appl. No. 13/577,170.
International Search Report for PCT/US10/35048; Rapiscan Security Products, Inc.; Feb. 8, 2012.
International Search Report for PCT/US2014/015126, May 27, 2014.
Written Opinion of the International Searching Authority for PCT/US2014/015126, May 27, 2014.
International Search Report for PCT/US2010/044475, mailed on Oct. 29, 2010, Rapiscan Laboratories Inc.
Supplementary Partial European Search Report for EP2462431, Nov. 17, 2014.
International Search Report PCT/US2011/025969, mailed on Aug. 1, 2011, Rapiscan Systems Inc.
Final Office Action for Japanese Application No. 2011523012, mailing date Jun. 19, 2014.
Office Action dated Apr. 14, 2015 for U.S. Appl. No. 13/492,614.
Office Action dated Jan. 9, 2015 for U.S. Appl. No. 14/268,128.
International Search Report for PCT/IB2011/050469, Jun. 9, 2011.
Notice of Allowance dated Feb. 3, 2015 for U.S. Appl. No. 13/577,170.
Supplementary European Search Report for Application No. EP10807126, dated Feb. 6, 2015.
"Oral Program of SORMA West 2008", Jun. 5, 2008, pp. 1-95, XP055167963, Retrieved from the Internet: URL: http://www2.lbl.gov/conferences/SORMA/assets/doc/SORMAOralProgram30May.pdf.
Corrected Notice of Allowance dated Mar. 19, 2015 for U.S. Appl. No. 13/577,170.
Notice of Allowance dated Dec. 24, 2014 for U.S. Appl. No. 13/775,256.
International Search Report for PCT/US2008/087654, date of mailing, Jul. 6, 2009, Rapiscan Security Products, Inc.
International preliminary report on patentability PCT/US2012/024184, issued on Aug. 13, 2013, Rapiscan Systems Inc.
International Search Report PCT/US2012/024184, mailed on Jul. 27, 2012, Rapiscan Systems Inc.
International Search Report PCT/US2012/042493, mailed on Oct. 1, 2012, Rapiscan Systems Inc.
International Search Report PCT/GB2009/000515, Feb. 23, 2010, Rapiscan Security Products, Inc.
International Search Report for PCT/GB2009/000497, Jan. 22, 2010.
International Search Report PCT/GB2009/001444, Apr. 6, 2010, Rapiscan Security Products.
International Search Report for PCT/GB2009/000556, Feb. 19, 2010, Rapiscan Security Products, Inc.
International Search Report PCT/GB2009/001277, Jul. 20, 2010, Rapiscan Systems, Inc.
Mobile X-Ray Inspection Systems, Internet Citation, Feb. 12, 2007, pp. 1-2, URL:http://web.archive.org/web/20070212000928/http://www.bombdetecti-on.com/cat--details.php?catid=20.
Molchanov P A et al: 'Nanosecond gated optical sensors for ocean optic applications' Sensors Applications Symposium, 2006. Proceedings of the 2006 IEEE Houston, Texas,USA Feb. 7-9, 2006, Piscataway, NJ, USA,IEEE, Feb. 7, 2006, pp. 147-150, XP010917671 ISBN: 978-0-7803-9580-0.
International Search Report for PCT/US10/58809; Rapiscan Systems Inc.; Apr. 19, 2011.
International Search Report for PCT/GB2009/001250, Mar. 2, 2010, Rapiscan Security Products Inc.
International Search Report for PCT/GB2009/001275, Jul. 24, 2009, Rapiscan Security Products Inc.
International Search Report for PCT/US10/35720, date of mailing, Nov. 15, 2010, Rapiscan Security Products, Inc.
Smith C. R. et al: 'Application of 450 kV computed tomography to engine blocks with steel liners' Materials Evaluation vol. 65, No. 5, 2007, pp. 458-461, XP055108238.
International Search Report and Written Opinion for PCT/US2010/041757, Oct. 12, 2010.
European Patent Office, International Search Report and Written Opinion of the International Searching Authority, PCT/US2005/011382, Oct. 21, 2005.
European Patent Office, International Search Report, International Application No. PCT/US99/28266, dated Sep. 6, 2000, 3 pages.
International Search Report, PCT/US2007/066936; dated: Sep. 30, 2008, 5 pages.
International Search Report, PCT/US1998/18642, dated Jul. 7, 1999, 4 pages.
International Search Report, PCT/US1999/028035, dated Sep. 15, 2000, 6 pages.
Written Opinion of the International Searching Authority, PCT/US2007/066936, dated Sep. 30, 2008, 7 pages.
International Bureau of WIPO, International Preliminary Report on Patentability, PCT/US2005/011382, dated Oct. 19, 2006, 7 pages.
Mertz, L.N., et al, "Rotational aperture synthesis for x rays", Journal. Optical Society of America, vol. 3, Dec. 1986, pp. 2167-2170.
International Preliminary Report on Patentability, PCT/US2012/024182, issued on Aug. 13, 2013, Rapiscan Systems Inc.
International Search Report, PCT/US2012/024182 mailed on Aug. 20, 2012, Rapiscan Systems Inc.
International Search Report for PCT/US2010/061908, mailed on Apr. 2, 2012, Rapiscan Systems, Inc.
International Search Report for PCT/GB2006/000859, mailed on May 19, 2006, Corus UK Ltd.
International Search Report for PCT/US11/21758; Jul. 7, 2011, Rapiscan Systems Inc.
Office Action dated May 13, 2015 for U.S. Appl. No. 14/601,112.
Notice of Allowance dated Jun. 11, 2015 for U.S. Appl. No. 12/919,483.
International Search Report for PCT/US2010/041757, mailed on Oct. 12, 2010, Rapiscan Systems Inc.
International Search Report for PCT/GB2009/000575, Apr. 7, 2010, Rapiscan Security Products Inc.
International Search Report for PCT/GB2004/001747, Aug. 10, 2004, CXR Ltd.
International Search Report for PCT/US2007/005444, Oct. 29, 2007, Telesecurity Sciences, Inc.
International Search Report for PCT/US2006/11492, Oct. 11, 2007, United Technologies Corporation.
Sun Olapiriyakul and Sanchoy Das, Design and analysis of a two-stage security screening and inspection system, Journal of Air Transport Management, vol. 13, Issue 2, Mar. 2007, pp. 67-74.
Supplementary Partial European Search Report for EP12744504, Nov. 13, 2004.
Extended European Search Report for Application No. EP20120744504, dated Jan. 14, 2015.
Office Action dated Dec. 4, 2014 for U.S. Appl. No. 13/168,440.
Office Action dated May 20, 2015 for U.S. Appl. No. 13/168,440.
Notice of Allowance dated Mar. 31, 2015 for U.S. Appl. No. 13/922,529.
Office Action dated Mar. 27, 2015 for U.S. Appl. No. 14/268,112.

* cited by examiner

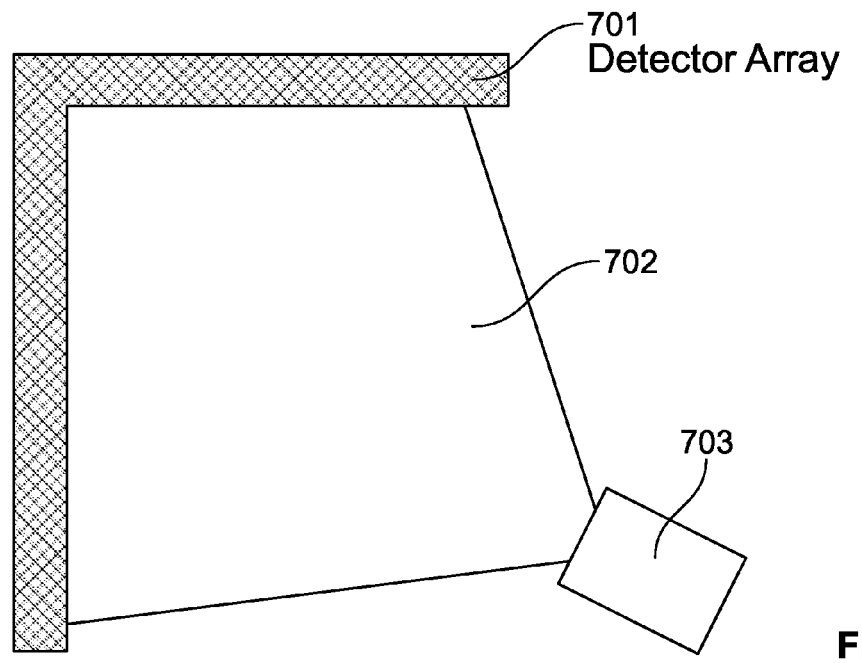
FIG. 7
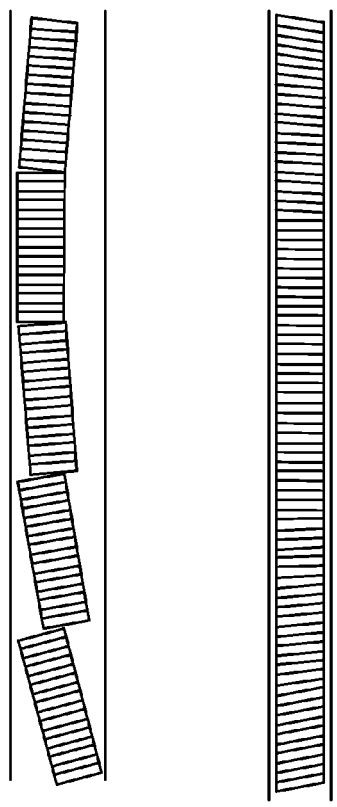
FIG. 8  FIG. 9

LOW-DOSE RADIOGRAPHIC IMAGING SYSTEM

CROSS-REFERENCE TO RELATED APPLICATIONS

The present specification relies on U.S. Provisional Patent Application No. 61/880,159, entitled "Mobile Low-Dose Radiographic Imaging System", and filed on Sep. 19, 2013, for priority, which is herein incorporated by reference in its entirety.

The present specification is a continuation-in-part of U.S. patent application Ser. No. 13/492,614, entitled "System and Method for Reducing Weight of an X-Ray Source", and filed on Jun. 8, 2012, which, in turn, relies on Unites States Provisional Patent Application No. 61/494,887, filed on Jun. 9, 2011, which are herein incorporated by reference in their entirety.

The present specification is related to U.S. patent application Ser. Nos. 13/577,170; 14/104,625; 14/174,558; 14/228,340; 14/268,128; 14/293,258 all of which are hereby incorporated by reference in their entirety. The present specification is also related to U.S. Pat. Nos. 8,437,448; 8,054,937; 8,633,823; 8,724,744; 8,750,452; and 8,781,067 all of which are hereby incorporated by reference in their entirety.

FIELD

The present specification relates generally to X-ray imaging systems, and specifically to a mobile system for automatically and rapidly detecting the presence of high-atomic-number (high-Z) materials such as nuclear materials, radioactive materials, and shielding materials.

BACKGROUND

Security systems are presently limited in their ability to detect contraband, weapons, explosives, and other dangerous objects concealed in cargo. It is known in the art that images of various types of material can be generated by using various X-ray scattering and transmission techniques. The intensity of transmitted X-rays is related to the thickness, density and atomic number (Z) of the material scattering or absorbing the X-rays. Materials with high atomic number (Z>70) are characterized by the high attenuation of x-rays having energies in the high end of the X-ray spectrum, and in particular, energies in the range of 2-10 MeV, due to a process called $e^+/e^-$ pair production. Therefore, X-ray transmission images are, in part, modulated by variations in the atomic number of items of various materials inside the cargo.

As a result of the image modulation due to the density, thickness and atomic numbers of various materials, it is common for X-ray imaging systems to produce images with dark areas. These dark areas might be indicative of the presence of threat materials; however, they yield little information about the exact nature of threat. In addition, radiographic images produced by conventional X-ray systems are often difficult to interpret because objects are superimposed. Therefore, a trained operator must study and interpret each image to render an opinion on whether or not a target of interest, or a threat, is present. Operator fatigue and distraction can compromise detection performance when a large number of such radiographic images are to be interpreted, such as at high traffic transit points and ports. Even with automated systems, it becomes difficult to comply with the implied requirement to keep the number of false alarms low, when the system is operated at high throughputs.

One method of obtaining more useful information and clarity from X-ray imaging is by using dual-energy systems to measure the effective atomic numbers of materials in containers or luggage.

Typical X-ray inspection systems include an X-ray generator which comprises a heated cathode filament emitting an electron beam. The emitted electrons are accelerated towards a target. The electron beam strikes the target at a focal spot and some portion of the kinetic energy contained within the electron beam is converted into X-rays. At the focal spot, the X-rays are emitted in all directions from the target surface, where the intensity and energy of X-rays varies based on the angle with respect to the electron beam direction. The generated X-rays are allowed to leave a heavily shielded area in a predefined direction through a collimator. Current x-ray inspection systems are very heavy, largely due to the massive amounts of shielding required to create the predefined area in which produced x-rays area allowed to propagate, such as in the forward direction where the X-rays are used for radiography or other purposes.

A greater amount of shielding is required when using electron targets made of materials having a high atomic number (high-Z). In contrast, low atomic number (low-Z) targets have a much more forward-peaked angular distribution, making it possible to eliminate a substantial amount of shielding. However, because of this forward-peaked angular distribution, when large areas need to be scanned, such as in mobile cargo radiography, the X-rays produced from low-Z targets typically do not cover the vertical extent of the object adequately. In addition, mobile cargo inspection systems typically require an X-ray source optimized for weight and performance. Currently, weight is primarily determined by the required quantity of shielding materials.

Furthermore, while mobile systems are available to provide inspection capabilities at locations which are constrained for space, such systems are generally large, heavy, and lack maneuverability. As a result these systems can be difficult to deploy quickly, especially in urban areas and pose several disadvantages and constraints.

Accordingly, there is still a need for improved inspection methods and systems built into a fully self-contained, smaller and more mobile vehicle that can be brought to any site accessible by roads and rapidly deployed for inspection. Moreover, there is an additional need for methods and systems that require minimal footprint with respect to the radiation dose to the environment, while still performing inspection using a sufficient range of the radiation energy spectrum to encompass safe and effective scanning of light commercial vehicles as well as cargo containers and trucks.

Additionally, there is a need for a system and method with reduced shielding requirements, thereby reducing the overall weight of an x-ray source employed in an x-ray inspection system, such as a mobile cargo inspection system.

Further, in the case of X-ray sources employing low Z targets, which require less shielding material but have limited capability in scanning the full vertical length of the object, there is a requirement for systems and methods to enhance the vertical scanning capability of such X-ray sources. What are also needed are systems and methods for deflecting the central point of an X-ray beam towards areas of high density in the scanned object.

In addition, there is also a need for an integrated X-ray inspection system further comprising a secondary scanning system such as a neutron subsystem to improve the material separation capability of the system.

SUMMARY

In some embodiments, a system for scanning cargo and vehicles is disclosed. In some embodiments, the operational flexibility of the system may be enhanced by significantly reducing its size and weight as compared to currently available mobile radiographic inspection systems. In some embodiments, the inspection system is mobile.

In some embodiments, the present specification describes an X-ray source comprising: an electron beam generator, wherein said electron beam generator generates an electron beam; an accelerator for accelerating said electron beam in a first direction; a first set of magnetic elements for transporting said electron beam into a magnetic field created by a second set of magnetic elements; wherein the magnetic field created by said second set of magnetic elements causes said electron beam to strike a target such that the target substantially only generates X-rays focused toward a high density area in the scanned object.

In some embodiments, the high density section in the scanned object may be estimated in a second pulse using image data captured by a detector array in a first pulse and wherein the direction of electron beam is optimized by said X-ray source during said second pulse to focus X-rays towards said high density area in the scanned object based on said image data in said first pulse.

Optionally, the intensity of the electron beam may be optimized in each pulse to ensure that targeted areas in the scanned object are radiated with an optimal dose of X-rays.

Optionally, the magnetic field may cause said electron beam to strike the target at the same point but at a different angle in each successive pulse such that the angle at which said electron beam strikes the target depends on the position of the high density area in the scanned object.

Optionally, the magnetic field may cause said electron beam to strike the target at different points in successive pulses.

Optionally, the magnetic field may cause said electron beam to strike the target at the same point from different directions in successive pulses.

Optionally, the electron beam comprises single energy radiation. Optionally, said first set of magnetic elements comprise a pulsed dipole magnet and said second set of magnetic elements comprise a dipole magnet. Still optionally, said first set of magnetic elements comprise a pulsed dipole magnet and said second set of magnetic elements comprise a quadrupole magnet.

Optionally, the electron beam comprises dual energy radiation. Still optionally, the first set of magnetic elements may comprise a pulsed dipole magnet and the second set of magnetic elements may comprise a pulsed quadrupole magnet. Still optionally, the first set of magnetic elements may comprise a pulsed dipole magnet and the second set of magnetic elements may comprise two quadrupole magnets, wherein each quadrupole magnet is configured to transport at least one of the radiation energies in the dual energy radiation beam.

Optionally, the target may be manufactured from a material having low atomic number. Still optionally, the target may be manufactured from carbon, graphite or diamond.

Optionally, the target may be shaped. Still optionally, the target may be of a semi-circular, triangular, or flat shape.

Optionally, the source of the present specification may comprise shielding optimized to reduce the system weight.

Optionally, the linear accelerator is mounted in a substantially vertical direction.

In some embodiments, the present specification describes an X-ray source comprising: a generator for generating an electron beam; an accelerator for accelerating the generated electron beam in a desired direction; and, one or more magnetic elements for directing at least a part of the electron beam in at least one defined direction, wherein the magnetic elements comprise a defocusing magnet for directing a first part of the electron beam to a first predefined area within a shaped magnetic field and a second part of the electron beam to a second predefined area within the shaped magnetic field, wherein the first predefined area and second predefined area are different and wherein the shaped magnetic field directs the first and second parts of the electron beam onto a predefined area of a target, the directed parts of the electron beam producing a forward radiation at a plurality of different angles upon striking the said target.

In some embodiments, the present specification describes an inspection system for scanning cargo or vehicles comprising: an X-ray source for generating an electron beam; an accelerator for accelerating said electron beam in at least one predefined direction; a first set of magnetic elements for transporting said electron beam into a magnetic field created by a second set of magnetic elements, wherein the magnetic field created by said second set of magnetic elements causes said electron beam to strike a target such that it substantially only generates X-rays focused toward a specific high density area in the scanned object; and, an X-ray detector array for detecting the radiation transmitted through the object under inspection.

Optionally, the inspection system may be mounted on a mobile inspection vehicle. Optionally, the inspection system further comprises a foldable boom which can be deployed to form a portal for cargo or vehicles to pass through. Still optionally, the foldable boom comprises a first vertical section, a second vertical section and a horizontal section, wherein the first vertical section is coupled to the inspection vehicle, and wherein a distal end of the first vertical section is coupled to a proximal end of horizontal section and a distal end of the horizontal section is coupled to a proximal end of the second vertical section. Still optionally, the first vertical section and second vertical sections are respectively coupled to wheels to support movement of boom structure. Still optionally, an outrigger wheel may be connected to the inspection vehicle and deployed before deploying the boom for added stability to the vehicle.

The X-ray source and the boom may be part of a single fixture that can be deployed or stowed. Optionally, the foldable boom assembly may be moved horizontally in range of 1 to 10 degrees, and preferably by 5 degrees, in either direction. Optionally, the inspection vehicle further comprises at least one operator station. Still optionally, the system may further comprise a neutron-based inspection subsystem comprising a pair of neutron generators and a plurality of gamma-ray detectors, wherein said X-ray detector array(s) and said neutron-based inspection subsystem are integrated within the boom.

In some embodiments, the high density area in the scanned object may be estimated in a second pulse using image data captured by the detector array in a first pulse and wherein the direction of electron beam is optimized by said X-ray source during said second pulse to focus X-rays towards said high density area in the scanned object based on said image data in said first pulse. Further, the intensity of electron beam may be optimized for each pulse to ensure that targeted areas in the scanned object are radiated with an optimal dose of X-rays.

Optionally, the magnetic field may cause said electron beam to strike the target at the same point but at a different angle in each successive pulse such that the angle at which said electron beam strikes the target depends on the position of high density area in the scanned object. Optionally, the magnetic field may cause the electron beam to strike the target at different points in successive pulses. Optionally, the magnetic field may cause the electron beam to strike the target at the same point from different directions in successive pulses.

Optionally, the electron beam comprises single energy radiation. Still optionally, the first set of magnetic elements may comprise a pulsed dipole magnet and said second set of magnetic elements may comprise a quadrupole magnet.

Optionally, the electron beam may comprise dual energy radiation. Still optionally, the first set of magnetic elements may comprise a pulsed dipole magnet and said second set of magnetic elements may comprise a pulsed quadrupole magnet. Still optionally, the first set of magnetic elements may comprise a pulsed dipole magnet and a second set of magnetic elements may comprise two quadrupole magnets wherein each quadrupole magnet is configured for transporting at least one of the radiation energies in the dual energy radiation beam.

Optionally, the target may be manufactured from a material having low atomic number. Still optionally, the target may be manufactured from carbon, graphite, or diamond.

Optionally, the target is shaped. Still optionally, the target may be of a semi-circular, triangular, or flat shape.

Optionally, the system further comprises shielding optimized to reduce the system weight.

Optionally, the X-ray source may be a linear accelerator mounted in a substantially vertical direction.

Optionally, the system may further conduct transmission Z-spectroscopy to analyze at least one material contained in the scanned object. Optionally, the system may further conduct noise spectroscopy to analyze at least one material contained in the scanned object.

Optionally, the system may further comprise at least one X-ray filter for vertically modulating x-ray intensity.

Optionally, the detector array may comprise one or more gapless X-ray detector arrays to detect the radiation transmitted by the scanned objects. The gapless detector array may comprise a two-dimensional array of small detector elements and wherein each detector element comprises a scintillator. Still optionally, the scintillator is a photo-sensing device, comprising at least one of: a photodiode, a biased photodiode, an avalanche photodiode, or a silicon multiplier. Optionally, the scintillator material may be LYSO, lead tungstate or any other suitable material. The detector array may be coupled to a collimator.

In some embodiments, the present specification describes an X-ray source comprising: an electron beam generator, wherein said electron beam generator generates an electron beam; an accelerator for accelerating said electron beam in a first direction; and, a first set of magnetic elements for transporting said electron beam into a magnetic field created by a second set of magnetic elements, wherein the magnetic field created by said second set of magnetic elements causes said electron beam to strike a target such that the target generates X-rays, wherein a majority of the X-rays are focused on a high density section in the scanned object and a minority of the X-rays are focused elsewhere.

In some embodiments, the present specification describes an X-ray source comprising: an accelerator capable of generating pulsed electron beams of two or more different energies moving in a pre-defined direction, wherein at least a first pulse and a second pulse are generated; and, a set of electron steering components which causes the beam to strike the same area of the target at pre-defined angles, wherein said angle is estimated from at least one image captured from said first pulse of said electron beam.

In some embodiments, the present specification describes an X-ray source comprising: an accelerator capable of generating a sequence of pulsed electron beams of two or more different energies moving in a pre-defined direction, wherein a first pulse is low energy, a second pulse is high energy and each subsequent pulse in the sequence alternates between low energy and high energy; and, a set of electron steering components which causes the beam to strike the same area of the target at pre-defined angles, wherein said angle is estimated from at least one image captured from any previous pulse in the sequence of pulses of said electron beam.

Optionally, the steering components include a pulsed steering magnet and a pulsed quadrupole. Optionally, the steering components include a pulsed steering magnet and at least one DC magnet.

Optionally, the low energy beam ranges from 4 MeV to 6 MeV and the high energy beam ranges from 6 MeV to 10 MeV.

Optionally, the target is fabricated from tungsten, a low-z material such as graphite, or copper depending upon the application.

In some embodiments, the present specification describes an X-ray source comprising: an electron beam generator for generating an electron beam; an accelerator for accelerating the generated electron beam in at least one direction; and, one or more magnetic elements for directing a first part of the electron beam in a first direction and a second part of the electron beam in a second direction, wherein the first and second direction are different, wherein said directed parts of the electron beam produce a beam of X-rays upon striking a target.

Optionally, said first part of the electron beam and said second part of the electron beam strike the target at substantially the same point in a given pulse. Optionally, the directed parts of the electron beam may produce forward radiation at a plurality of different angles upon striking the target, providing a wide angular coverage of an object being scanned.

In some embodiments, the target may be shaped, allowing for the directed parts of the electron beam produce X-rays in one or more pre-defined directions.

Optionally, the magnetic elements may comprise a defocusing magnet for transporting at least a part of the electron beam to a predefined area within a shaped magnetic field, the shaped magnetic field directing the part of the electron beam onto a predefined part of the target.

Optionally, the target may be semi-circular, triangular, or flat. Optionally, the target is made from a material having a low atomic number such as carbon, graphite, or diamond.

In another embodiment, the present specification describes a mobile inspection system for scanning cargo or vehicles, the system mounted on an inspection vehicle, comprising: an X-ray source for producing radiation in the direction of an object to be inspected; a foldable boom which can be deployed to form a portal for cargo or vehicles to pass through; and an X-ray detector array for detecting the radiation transmitted through the object under inspection.

In some embodiments, the present specification discloses an inspection system for scanning cargo or vehicles, comprising: an X-ray source sub-system for producing a fan beam of radiation in the direction of an object to be inspected; and an X-ray detector array for detecting the radiation transmitted through the object under inspection. Optionally, the X-ray source sub-system may be vertically mounted.

Optionally, the inspection system may be mobile. Still optionally, the inspection system may comprise a foldable boom which can be deployed to form a portal for cargo or vehicles to pass through. Optionally, the size and weight of the inspection vehicle may be reduced by employing a hybrid fuel-electric vehicle.

In some embodiments, the present specification is directed toward a mobile inspection system for scanning cargo or vehicles, the system mounted on an inspection vehicle, comprising: a vertically mounted X-ray source sub-system for producing a fan beam of radiation in the direction of an object to be inspected; a foldable boom which can be deployed to form a portal for cargo or vehicles to pass through; and an X-ray detector array for detecting the radiation transmitted through the object under inspection.

Optionally, the X-ray source and boom are part of a single fixture that can be deployed or stowed.

In some embodiments, the foldable boom may comprise a first vertical section, a second vertical section and a horizontal section, wherein the first vertical section is coupled to the inspection vehicle; the distal end of the first vertical section is coupled to the proximal end of horizontal section and the distal end of the horizontal section is coupled to the proximal end of the second vertical section. Optionally, the first vertical section and second vertical sections may be coupled to wheels to support the movement of boom structure. Optionally, the inspection vehicle may be coupled to a wheel that is deployed before deploying the boom and the X-ray source to lend stability to the inspection vehicle and/or to prevent the inspection vehicle from tilting backwards. Optionally, the foldable boom assembly may be rotated horizontally in range of 1 to 10 degrees, and preferably by 5 degrees, in either direction. Optionally, a neutron generator may be positioned on at least one side of the foldable boom to allow detection of threats on at least one side and/or the top of the object passing through the portal. In some embodiments, the inspection system may comprise at least one operator station.

In some embodiments, the X-ray source sub-system further comprises optimized shielding to reduce overall weight of the source.

Optionally, the intensity of the X-ray source is modulated to reduce the size of the exclusion zone.

Optionally, the X-ray source sub-system further includes an applied magnetic field.

Optionally, the X-ray source sub-system further comprises a bending magnet.

Optionally, the X-ray source sub-system may further comprise a low atomic number target. In some embodiments, the low atomic number target may comprise carbon. In some embodiments, the low atomic number target may comprise graphite. In some embodiments, the low atomic number target may comprise diamond. Optionally, the low atomic number target is shaped and may comprise a semi-circular, triangular, or flat shape.

In operation, an electron beam may be vertically steered onto the low atomic number target in the X-ray source sub-system. Optionally, the electron beam may be steered by use of a magnet, or by electrostatic deflectors, or by a combination of both. Optionally, the electron beam may be steered to adjust the direction of strongest emission of the X-rays towards the area of highest attenuation in the object under inspection.

Optionally, the inspection system may further employ transmission X-ray spectroscopy and/or noise spectroscopy to analyze the material contained in the scanned object.

Optionally, the inspection system further comprises X-ray filters to modulate the x-ray intensity vertically.

Optionally, the inspection system uses pulse-width modulation to change X-ray intensity. Optionally, the system uses pulse-height modulation to change X-ray intensity.

In some embodiments, the inspection system may further comprise at least one gapless X-ray detector arrays to detect radiation transmitted by the scanned objects. Optionally, the inspection system may use a two-dimensional array of small detector segments. In some embodiments, each detector segment in the array may be individually aligned to aim at the source. Optionally, different scintillator materials may be used for different detector segments.

Optionally, the detector array may comprise a plurality of long, thin detectors. Further, the long, thin detectors may comprise scintillation crystals with photo-detector elements. Optionally, the scintillator material may be LYSO. Still optionally, the scintillator material may be lead tungstate. In some embodiments, the photo-detector elements may comprise at least one of: photodiodes, biased photodiodes, avalanche photodiodes, or silicon photomultipliers.

Optionally, the detector array may be coupled to a collimator.

Optionally, the X-ray source is a high-duty factor X-ray source for improved material discrimination.

In some embodiments, the inspection system may further comprise a neutron-based inspection subsystem comprising a pair of neutron generators and a plurality of gamma-ray detectors, wherein said X-ray detector array(s) and said neutron-based inspection subsystem are integrated within the boom.

In some embodiments, the neutron subsystem may further comprise a three-layered shielding collimator. Optionally, the radiation footprint of the neutron subsystem is reduced by using direction-specific shielding.

In some embodiments, the present specification describes a mobile inspection system for scanning cargo or vehicles, the system mounted on an inspection vehicle, comprising: a vertically mounted X-ray source sub-system for producing a fan beam of radiation in a direction of an object to be inspected; a foldable boom which can be deployed to form a portal for cargo or vehicles to pass through; at least one X-ray detector array for detecting the radiation transmitted through the object under inspection; and a neutron-based inspection subsystem comprising one or more neutron generators and a plurality of gamma-ray detectors, wherein said X-ray detector array(s) and said neutron-based inspection subsystem are integrated within the boom.

In some embodiments, the present specification describes a mobile inspection system for scanning cargo or vehicles, the system mounted on an inspection vehicle, comprising: a vertically mounted X-ray source sub-system for producing a fan beam of radiation in a direction of an object to be inspected; a foldable boom which can be deployed and used to scan stationary cargo or vehicles by moving the inspection system; at least one X-ray detector array for detecting the radiation transmitted through the object under inspection; and a neutron-based inspection subsystem comprising one or more neutron generators and a plurality of gamma-ray detectors, wherein said X-ray detector array(s) and said neutron-based inspection subsystem are integrated within the boom.

In some embodiments, the present specification describes an X-ray source comprising: a generator for generating an electron beam; an accelerator for accelerating the generated electron beam in a desired direction; one or more magnetic elements for directing a first portion of the electron beam in a first direction and a second portion of the electron beam in a second direction, wherein the first and second direction are different; and wherein said directed portions of the electron beam produce a beam of X-rays upon striking a target.

Optionally, the target may be fabricated from a low atomic number material. Optionally, the target may be fabricated from carbon. Optionally, the target may be shaped. Still optionally, the target may be semi-circular, triangular, or flat.

Optionally, the directed portions of the electron beam may produce forward radiation at a plurality of different angles upon striking the shaped target, thereby providing a wide angular coverage of an object being scanned in one or more desired directions.

Optionally, the directed portions of the electron beam produce X-rays having a wide angular coverage of an object being scanned only in one or more desired directions, thereby reducing an X-ray shielding requirement in one or more undesired directions.

Optionally, the directed portions of the electron beam may produce X-rays for covering an object such that it is scanned with more uniform intensity and energy.

Optionally, the magnetic elements may comprise a defocusing magnet for transporting at least a portion of the electron beam to a predefined area within a shaped magnetic field, the shaped magnetic field directing the portion of the electron beam onto a predefined part of the shaped target, thereby causing production of X-rays in a desired direction.

Still optionally, the magnetic elements may comprise one or more quadrupole magnets for directing at least a portion of the electron beam to a predefined area within a shaped magnetic field, the shaped magnetic field directing the portion of the electron beam onto a predefined part of the shaped target, thereby causing production of X-rays in a desired direction.

Still optionally, the magnetic elements may comprise a bending magnet for transporting at least a portion of the electron beam to a predefined area within a shaped magnetic field, the shaped magnetic field directing the portion of the electron beam onto a predefined part of the shaped target, thereby causing production of X-rays in a desired direction. Optionally, the bending magnet is configured to transport a first portion of the electron beam to a first predefined area within a shaped magnetic field on a first pulse and a second portion of the electron beam to a second predefined area within the shaped magnetic field on a second pulse.

In some embodiments, the X-ray may be produced in a fan beam, wherein the resultant fan beam is forward-peaked, thereby reducing an amount of lateral shielding required to prevent the X-rays from escaping in an undesired direction.

Optionally, a shaped magnetic field may be arranged to direct one or more portions of the electron beam onto the shaped target causing the generated X-rays to appear as originating from within a predefined distance of a predefined point within the shaped target. Still optionally, a shaped magnetic field may be arranged to direct a plurality of portions of the electron beam to different areas on the shaped target, causing the generated X-rays to appear as originating from different points within the shaped target.

In some embodiments, the present specification describes an X-ray source, comprising: a generator for generating an electron beam; an accelerator for accelerating the generated electron beam in a desired direction; one or more magnetic elements for directing at least a portion of the electron beam in a desired direction, the magnetic elements comprising a defocusing magnet for directing a first portion of the electron beam to a first predefined area within a shaped magnetic field and a second portion of the electron beam to a second predefined area within the shaped magnetic field, wherein the first predefined area and second predefined area are different; and a target, the shaped magnetic field directing the portion of the electron beam onto a predefined area of the target, the directed parts of the electron beam producing a forward radiation at a plurality of different angles upon striking the target.

Optionally, the target may be fabricated from a low atomic number material. Optionally, the target may be fabricated from carbon, graphite or diamond. Optionally, the target may be shaped. Still optionally, the target may be semi-circular, triangular, or flat.

In some embodiments, the present specification describes an X-ray source comprising: a generator for generating an electron beam; an accelerator for accelerating the generated electron beam in a desired direction; and means for directing multiple portions of electron beam to strike different areas of a target to produce a beam of X-rays.

Optionally, the target may be fabricated from a low atomic number material. Optionally, the target may be fabricated from carbon. Optionally, the target may be shaped. Still optionally, the target may be semi-circular, triangular, or flat.

Optionally, said means comprise magnetic elements. Optionally, said means comprise shaping a magnetic field designed to transport different portions of a beam to strike different areas of a shaped target to produce a X-ray beam.

Optionally, the directed portions of the electron beam may produce forward radiation at a plurality of different angles upon striking the shaped target and thus, may provide wide angular coverage of an object being scanned in one or more desired directions.

Optionally, the X-ray source may further comprise means for directing the maximum intensity of the X-ray fan beam towards high attenuation areas of the scanned object.

Optionally, the X-ray source may further comprise means for modulating the intensity of the electron beam depending on the scanning requirement.

Optionally, the X-ray source may further comprise means to modify the electron beam direction and intensity based on the image data captured by the system.

Optionally, the X-ray source may further comprise a bend magnet which bends the electron beam on each alternative pulse thereby switching the electron beam from one direction on a target to another in successive electronic pulses.

In some embodiments, the present specification describes an X-ray source comprising: a generator for generating an electron beam; and an accelerator for accelerating the generated electron beam in a desired direction, wherein said electron beam is transported to different areas within a shaped magnetic field and wherein said shaped magnetic field is designed to transport different portions of the beam to strike different areas of a target to produce an X-ray beam.

Optionally, the target may be fabricated from a low atomic number material. Optionally, the target may be fabricated from carbon. Optionally, the target may be shaped. Still optionally, the target may be semi-circular, triangular, or flat.

In some embodiments, the present specification describes an X-ray source comprising: a generator for generating a dual energy electron beam; an accelerator for accelerating said dual energy electron beam in a desired direction; and a steering magnet to transport the said dual energy electron beam into a magnetic field created by a pulsed quadrupole magnet which causes said dual energy electron beam to strike a target at at least one predefined angle to focus the direction of generated X-rays towards areas of high attenuation in the scanned object, wherein said angle is estimated from the image captured in previous pulses by the X-ray system.

In some embodiments, the present specification describes an X-ray source comprising an accelerator capable of generating pulsed electron beams of two or more different energies moving in a desired direction and a set of electron steering components which causes the beam to strike the same area of a target at predefined angles, wherein said angle is estimated from the image(s) captured in previous pulse(s) of the x-ray beam. Optionally, the steering components may include a pulsed steering magnet and a pulsed quadrupole. Still optionally, the steering components may include a pulsed steering magnet and two or more DC magnets. In some embodiments, the low energy may be 6 MeV and the high energy is 9 MeV. In some embodiments, the low energy may be 4 MeV and the high energy may be 6 MeV.

Optionally, the target may be fabricated from tungsten for wide fan beams, low-Z materials, such as graphite for narrow fan beams, or copper for reducing the production of photoneutrons.

In some embodiments, the present specification describes an X-ray inspection system for scanning cargo or vehicles, comprising: an X-ray source for producing a beam of radiation toward an object to be inspected; and a gapless X-ray detector array for detecting the radiation transmitted through the object under inspection.

Optionally, the gapless detector array may comprise a two-dimensional array of small detector elements wherein each detector element comprises a scintillator. Optionally, said scintillator may comprise a photo-sensing device. Optionally, for a given angle of incidence, a virtual detector comprising a certain combination of said detector elements may be representative of the signal in that direction.

The aforementioned and other embodiments of the present shall be described in greater depth in the drawings and detailed description provided below.

BRIEF DESCRIPTION OF THE DRAWINGS

These and other features and advantages of the present specification will be appreciated, as they become better understood by reference to the following detailed description when considered in connection with the accompanying drawings, wherein:

FIG. 7 shows an inverted-L-shaped detector array, as used in cargo inspection systems;

FIG. 8 illustrates a standard mounting configuration of detectors modules;

FIG. 9 illustrates a detector module mounting configuration for detector arrays that are constricted to a narrow vertical enclosure;

FIG. 31b shows another view of the exemplary shielding design shown in FIG. 31a;

DETAILED DESCRIPTION

Figure 1:
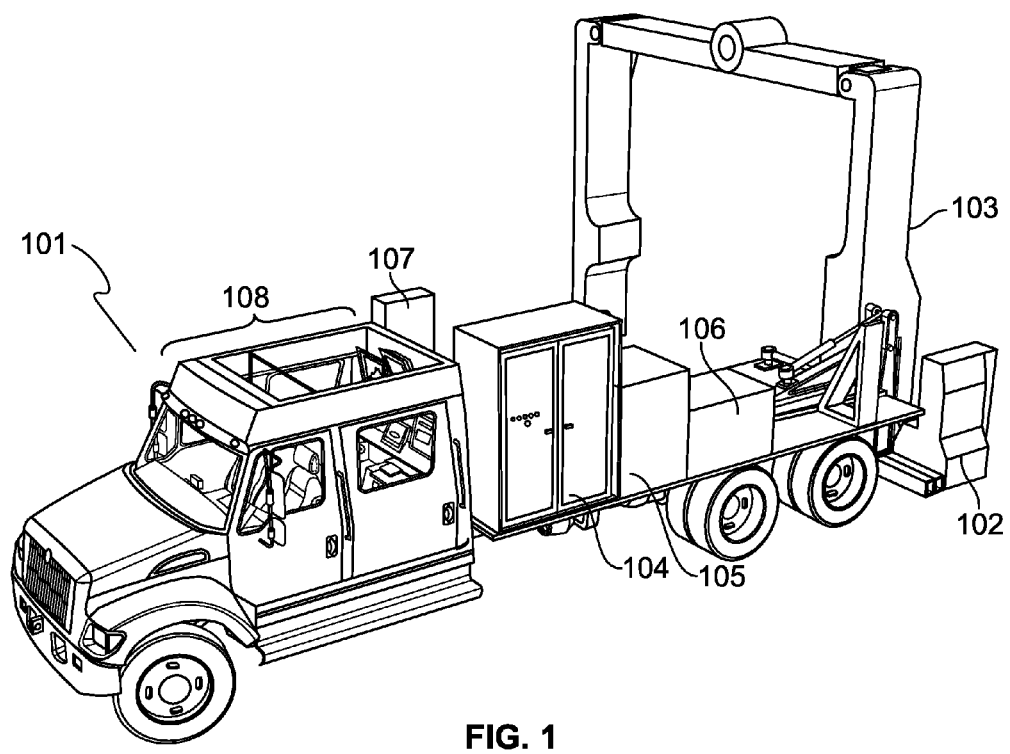
FIG. 1 illustrates a side view of an exemplary mobile inspection system described in the present specification, according to an embodiment.

The present specification describes a radiographic imaging system that is substantially smaller than existing systems and has a considerably reduced weight. The system also has a much smaller exclusion zone due to better beam collimation and use of an intensity-modulated X-ray source. In some embodiments, the radiographic imaging system is highly mobile.

In some embodiments, the system is equipped with an appropriate shielding design which reduces the X-ray source weight significantly. Some embodiments of a shielding design are described below with reference to FIGS. 30, 31a, and 31b.

In some embodiments, the x-ray source is mounted vertically. In a vertically mounted configuration, the x-ray target can be positioned close to the ground; thus, the system can inspect small vehicles and commercial vehicles to automatically detect high-Z materials such as SNM (Special Nuclear Materials). In another embodiment, the system includes integrated nuclear radiation detectors that help detect unshielded and lightly shielded radioactive materials.

In some embodiments, the operational flexibility of the system is enhanced by significantly reducing its size and weight by employing a hybrid (such as diesel and electric) inspection vehicle.

In some embodiments, the system uses, in additional to a primary radiography system, a neutron-based secondary inspection system to clear or confirm threats.

In some embodiments, the system uses a gapless imaging array that avoids image artifacts seen in existing systems. Two different gapless embodiments are described below with reference to FIGS. 10 and 11 and FIGS. 24 to 28.

In some embodiments, to reduce the size of the exclusion zone and to improve the X-ray energy spectrum, intensity modulation of the X-ray source is employed.

In some embodiments, the system uses a set of X-ray filters that modulate the x-ray intensity vertically such that the highest intensity X-rays will strike the part of the cargo with the highest attenuation, as described with reference to FIG. 29 below.

In some embodiments, the system employs vertically steering the electron beam onto a X-ray production target, in order for the maximum intensity of the X-rays to be directed towards the part of the cargo with the highest attenuation, as shown in and described with respect to FIG. 35a below. In some embodiments, the X-ray production target is made from a low-Z material. In some embodiments, the low-Z X-ray production target is specially shaped. In some embodiments, the low-Z X-ray production target is carbon. In some embodiments, the low-Z X-ray production target is graphite. In some embodiments, the low-Z X-ray production target is diamond, which has specific cooling properties in that it is a good heat conductor.

In some embodiments, the present specification describes an x-ray inspection system employing a low-Z x-ray target in order to reduce shielding requirements and thereby reduce the overall weight of a linear accelerator x-ray source employed in the inspection system. Since X-rays generated from a low-Z target are more forward-peaked than those generated from a high-Z target, they allow for a significant reduction in lateral and backward shielding, and, as a result, a significant reduction in overall shielding weight can be achieved. The amount of weight reduction depends on factors such as the electron beam energy, the geometrical configuration of accelerator components and the shielding material used, but is on the order of several hundred pounds at a minimum for electron beam energies of 5 MV and above.

In some embodiments, the present specification provides an X-ray source design having significant weight reduction and performance improvement. In an embodiment, the X-ray source sub-system and methods of the present specification are used in mobile cargo inspection systems. In other embodiments, the X-ray source system and methods are used in any radiological application, where reduced shielding and lower weight is desired. As is known to those of ordinary skill in the art, X-rays produced by directing a 5 MeV to 10 MeV electron beam on a low-Z target have a steeper angular distribution in the forward direction than the X-rays produced from traditional high-Z targets like tungsten. In an embodiment, the system of the present specification compensates for the steeper angular distribution by use of magnetic beam transport and shaping of the low-Z target, thereby producing a more uniform coverage of the object being scanned than conventional systems with respect to both x-ray intensity and x-ray energy. Since the resultant X-ray beam has less intensity in the lateral directions, there is significant reduction in the shielding requirements leading to lower weight of the X-ray source.

In other embodiments, the system of the present specification employs a pulsed magnetic field in conjunction with a low-Z target, such that the central point of the forward focused X-ray beam is focused on areas of high density in the scanned object in an intermittent manner.

In other embodiments, the system also employs intensity modulation of the electron beam along with a pulsed magnetic field to ensure that all areas of the scanned object are illuminated with adequate/threshold intensity. In an embodiment, the system of the present specification continuously predicts the area of high density in the scanned object and re-focuses the central point of the forward focused X-ray beam towards the predicted areas of high density at each subsequent pulse. The total radiation intensity and hence the shielding requirement are significantly reduced in the above embodiment.

The present specification is directed towards multiple embodiments. The following disclosure is provided in order to enable a person having ordinary skill in the art to practice the invention. Language used in this specification should not be interpreted as a general disavowal of any one specific embodiment or used to limit the claims beyond the meaning of the terms used therein. The general principles defined herein may be applied to other embodiments and applications without departing from the spirit and scope of the invention. Also, the terminology and phraseology used is for the purpose of describing exemplary embodiments and should not be considered limiting. Thus, the present invention is to be accorded the widest scope encompassing numerous alternatives, modifications and equivalents consistent with the principles and features disclosed. For purpose of clarity, details relating to technical material that is known in the technical fields related to the invention have not been described in detail so as not to unnecessarily obscure the present invention. In the description and claims of the application, each of the words "comprise" "include" and "have", and forms thereof, are not necessarily limited to members in a list with which the words may be associated.

It should be noted herein that image data is processed by a processing unit comprising a processor and memory to generate images of the cargo, which can be viewed on operator consoles. In accordance with the present invention, processing unit may be a general purpose computing device comprising various types of operating systems, memory configurations and computing platforms, as would be appreciated by a person of skill in the art. In one embodiment, data representative of the radiographic image is loaded from a memory device, which may include RAM, ROM, RAID array, flash drive, USB device, hard disk or other memory, to a processor that subjects the data to a program which includes instructions for performing image processing functions. In addition, those of ordinary skill in the art will recognize that devices of a less general purpose nature, such as hardwired devices, field programmable gate arrays (FPGAs), application specific integrated circuits (ASICs), or the like, may also be used for processing the images without departing from the scope and spirit of the inventive concepts disclosed herein.

In addition, one of ordinary skill in the art would appreciate that the features described in the present application can operate on any computing platform including, but not limited to: a laptop or tablet computer; personal computer; personal data assistant; cell phone; server; embedded processor; digital signal processor (DSP) chip or specialized imaging device capable of executing programmatic instructions or code.

It should further be appreciated that the platform provides the functions described in the present application by executing a plurality of programmatic instructions, which are stored in one or more non-volatile memories, using one or more processors and presents and/or receives data through transceivers in data communication with one or more wired or wireless networks.

It should further be appreciated that each device may have wireless and wired receivers and transmitters capable of sending and transmitting data, at least one processor capable of processing programmatic instructions, memory capable of storing programmatic instructions, and software comprised of a plurality of programmatic instructions for performing the processes described herein. Additionally, the programmatic code can be compiled (either pre-compiled or compiled "just-in-time") into a single application executing on a single computer, or distributed among several different computers operating locally or remotely to each other.

FIG. 1 illustrates a side view of an exemplary mobile inspection system of the present specification, in a deployed configuration. The system comprises a vehicle 101, such as a truck, with a flat-bed surface and equipment mounted on it. The equipment, in one embodiment, comprises an X-ray source 102, a boom 103, a modulator 104, a temperature control unit such as a chiller 105 and hydraulics assembly 106. A radiation detector 107 is also mounted on the bed of the truck 101. The front part of the vehicle 101 comprises the operator cab 108. In an embodiment, the operator cab 108 has two or three operator stations, each equipped with large sized high-resolution displays for scanning operations. In an embodiment, the X-ray source 102 and the boom 103 are part of a single fixture that can be in either a deployed configuration or a stowed configuration. Making the source and the boom part of a single fixture ensures a rigid connection between the two, thereby minimizing alignment problems. In an embodiment, the boom 103 is foldable and is folded before storing it on the flat bed surface of the vehicle 101.

Figure 2:
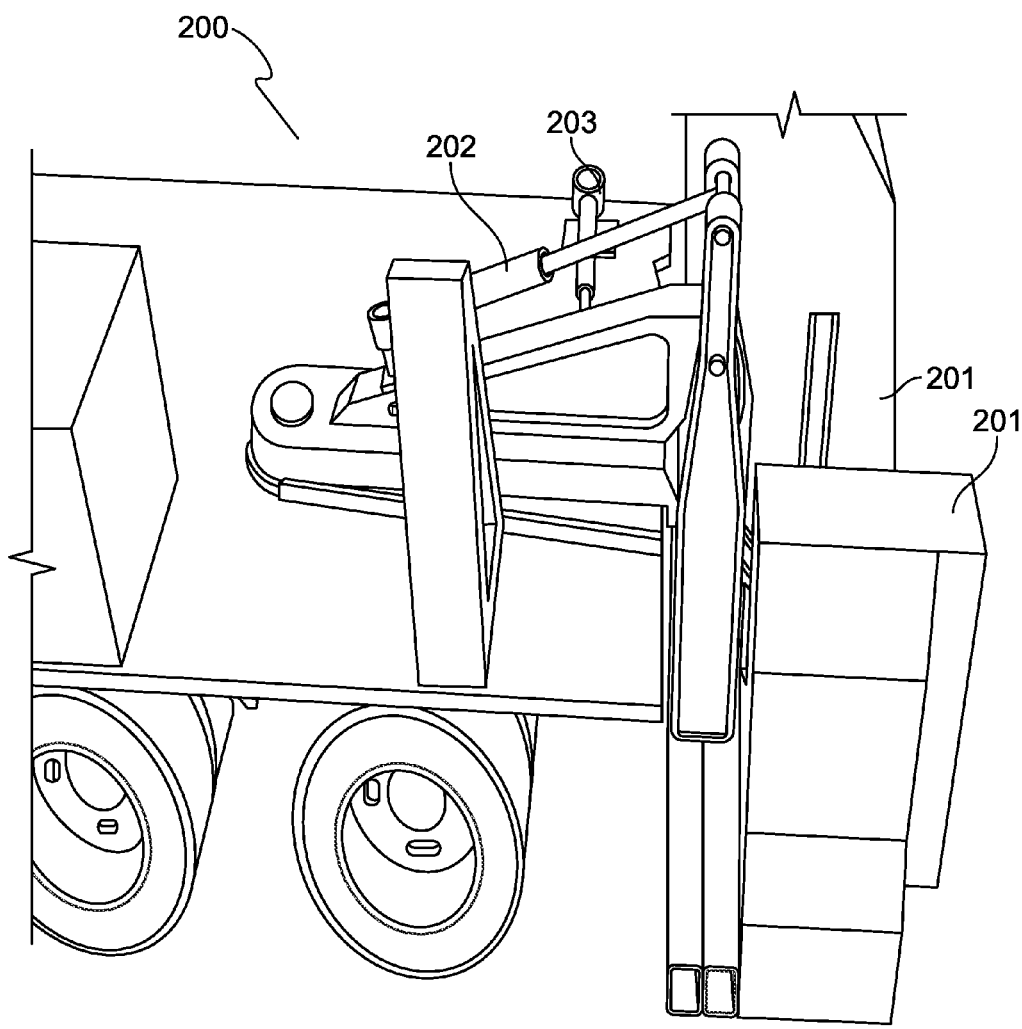
FIG. 2 illustrates a boom and X-ray source assembly mount, according to an embodiment of the present specification.

FIG. 2 shows a close-up view of a mechanism 200 used to move the X-ray source and boom assembly 201. In an embodiment, the mechanism 200 comprises a hydraulic system which in an embodiment is operated using a lever or a button. In an embodiment, the mechanism 200 comprises a first hydraulic piston 202 and a second hydraulic piston 203 wherein the first hydraulic piston 202 and the second hydraulic piston 203 are used to move the boom assembly in multiple directions. In an embodiment, the hydraulic system is capable of rotating the boom assembly horizontally by 5 degrees in either direction. This aids in scanning surfaces that would otherwise be parallel to the X-ray fan beam, such as the front and end of a container, or other perpendicular walls of a container.

Figure 3:
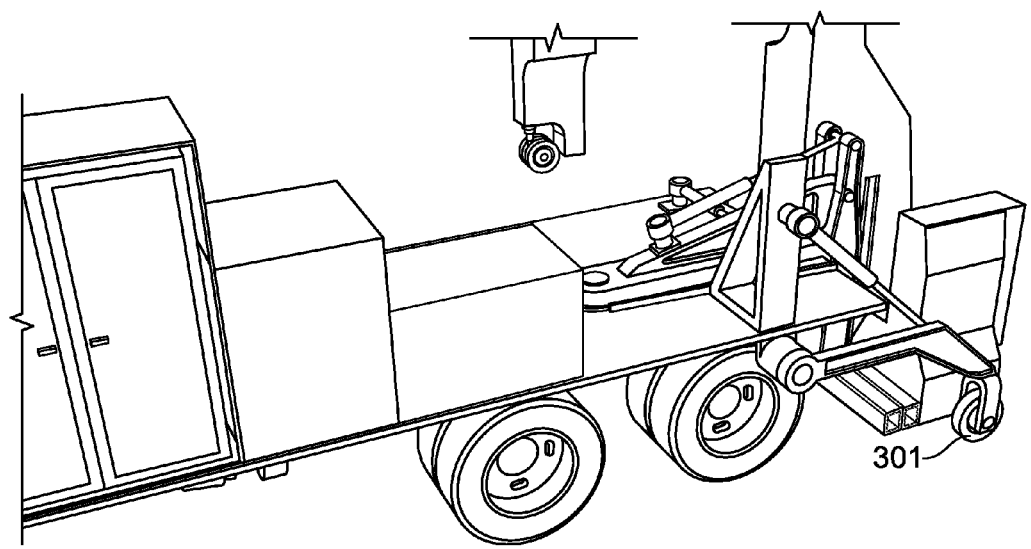
FIG. 3 illustrates an optional outrigger wheel, according to an embodiment of the present specification.

Since the weight of the boom and source assembly may be considerable, in an embodiment, an outrigger wheel 301 is added to the system, as shown in FIG. 3. This wheel is deployed before the boom is raised in order to improve system stability, and retracted after stowing the boom. In an embodiment, the outrigger wheel 301 is coupled to the vehicle 101 (shown in FIG. 1) through a connecting part. The outrigger wheel 301 enhances stability of vehicle 101 and prevents it from tipping when the X-ray source and boom assembly are deployed, thus lending stability to the truck.

Figure 4:
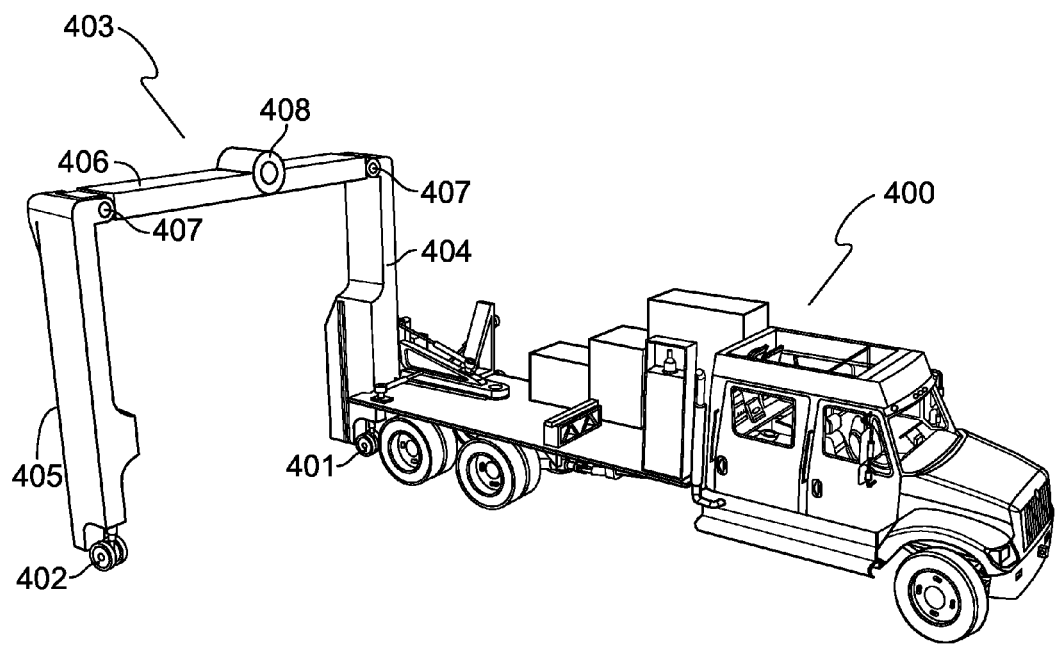
FIG. 4 illustrates another side view, including boom wheels, for the mobile inspection system of the present specification, shown in FIG. 1.

Further, as shown in FIG. 4, in an embodiment, for a self-supporting boom structure, there are two sets of wheels 401, 402 below the boom structure 403. To avoid torsion of the boom structure 403, wheels 402, located on the distal end of the boom structure 403, are powered by an electric motor, in an embodiment. These wheels can pivot, so that they will turn in the correct direction during deployment and retraction of the boom assembly. In an embodiment, the boom structure is designed to be wide enough to accommodate an imaging detector array and a neutron-based scanning system (not shown in FIG. 4). Further, a wide boom improves rigidity to resist boom sway, which is important for reducing image artifacts, scatter and the size of the exclusion zone.

In an embodiment, the boom structure 403 approximates an inverse U shaped structure comprising a first vertical section 404 and a second vertical section 405 which are connected through a horizontal section 406. In an embodiment, the truck 400 is connected to the first vertical section 404 at a position near its proximal end. The distal end of the first vertical section 404 is connected to the proximal end of horizontal section 406. As described in the above embodiment, the vertical section 404 is also coupled to a wheel 401 at its proximal end which assists in the movement of boom structure 403. In an embodiment, the proximal end of second vertical section 405 is connected to the distal end of horizontal section 406 and the distal end of second vertical section 405 is coupled to the wheel 402. While in the above embodiment, the truck 400 is shown connected to the vertical section 404 at a position closer to the proximal end of the vertical section 404, one of ordinary skill in the art would appreciate that the connection between truck and the vertical section 404 can be located at various other positions without compromising on the stability of system. In an embodiment, the two vertical sections 404 and 405 are substantially parallel to each other and are coupled to the horizontal section 406 in a perpendicular direction.

In an embodiment, the two vertical sections 404 and 405 are connected to the horizontal section 406 through a hinge 407 shown in the embodiment. In an embodiment, an X-ray source 102 (shown in FIG. 1) is located substantially parallel to the two vertical sections 404 and 405. In an embodiment, an outrigger wheel 301 (shown in FIG. 3) is deployed before deploying the X-ray source to prevents the truck 400 from tipping as the weight of boom assembly and X-ray source may be substantial compared to the weight of truck. In another embodiment comprising a boom assembly with wheels that provide the support to the entire structure as described in the above embodiment, the outrigger wheel 301 is deployed just before deploying the boom assembly 403 and is subsequently retracted once the boom assembly is properly deployed.

In an embodiment, the X-ray source is vertically mounted as shown in the FIG. 4, however, it can also be mounted and/or deployed in other configurations.

In an embodiment, the boom structure 403 is foldable such that it can be easily stored on the truck 400. In an embodiment, the horizontal section 406 of boom structure 403 can be folded in two sub sections around the point 408 located on the horizontal section 406. In another embodiment, the vertical sections are also foldable into two or more subsections to make the process of storage of the boom structure easy and convenient.

Figure 5A:
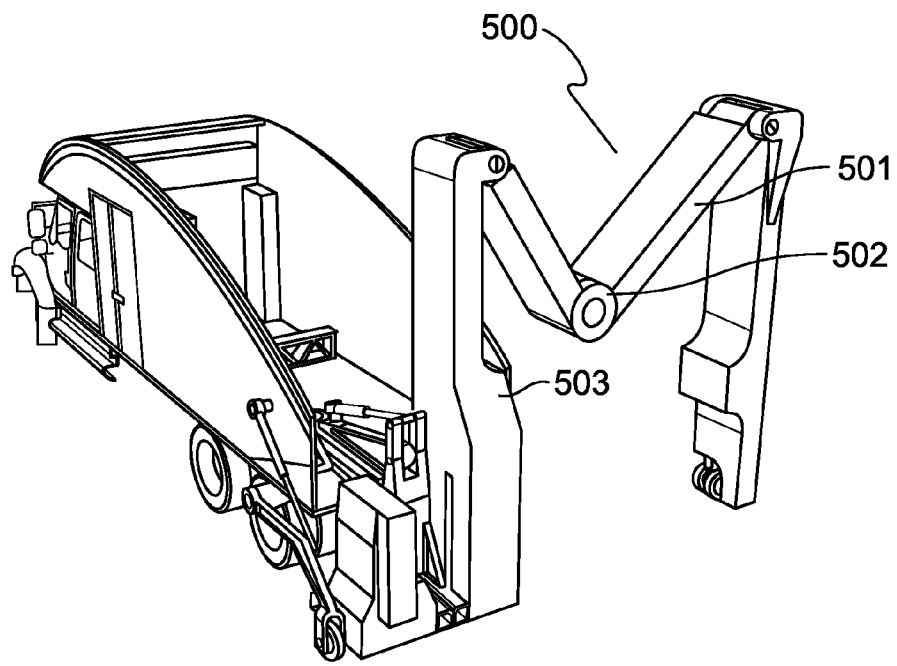
FIG. 5a illustrates a boom stowing position, according to an embodiment of the present specification.
Figure 5B:
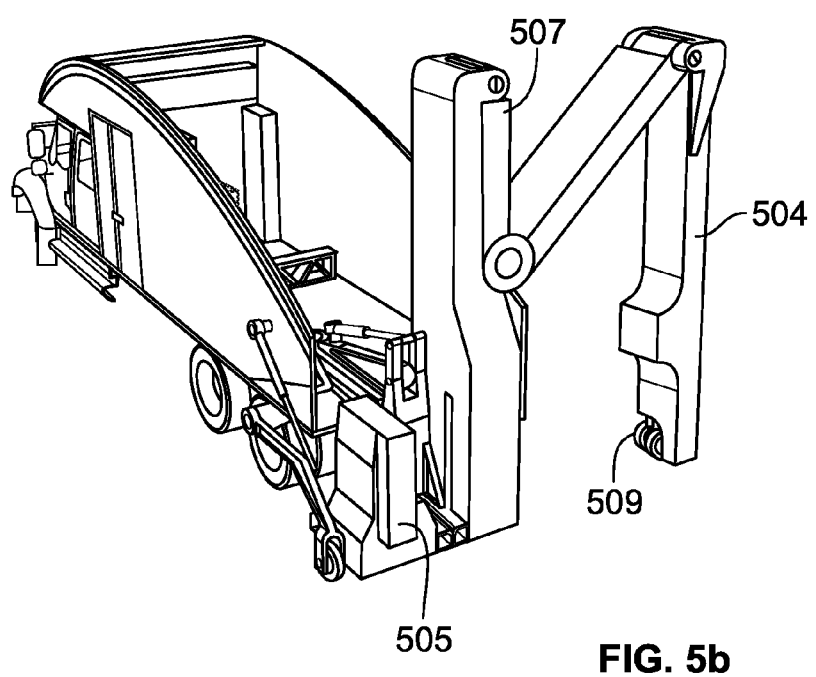
FIG. 5b illustrates a boom stowing position, according to an embodiment of the present specification.
Figure 5C:
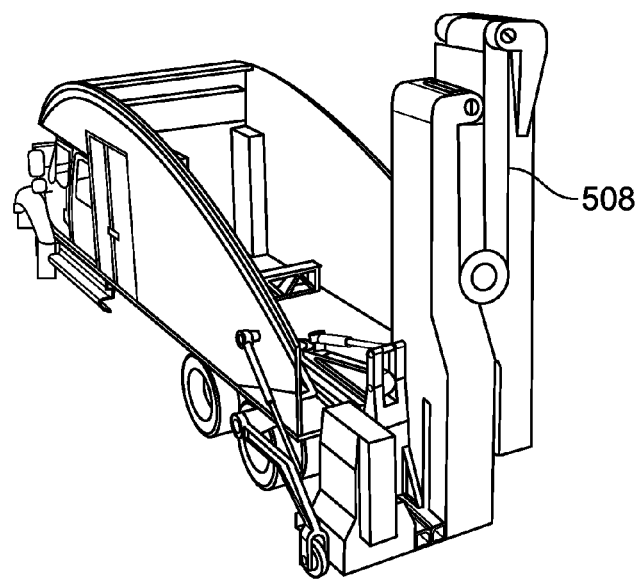
FIG. 5c illustrates a boom stowing position, according to an embodiment of the present specification.
Figure 5D:
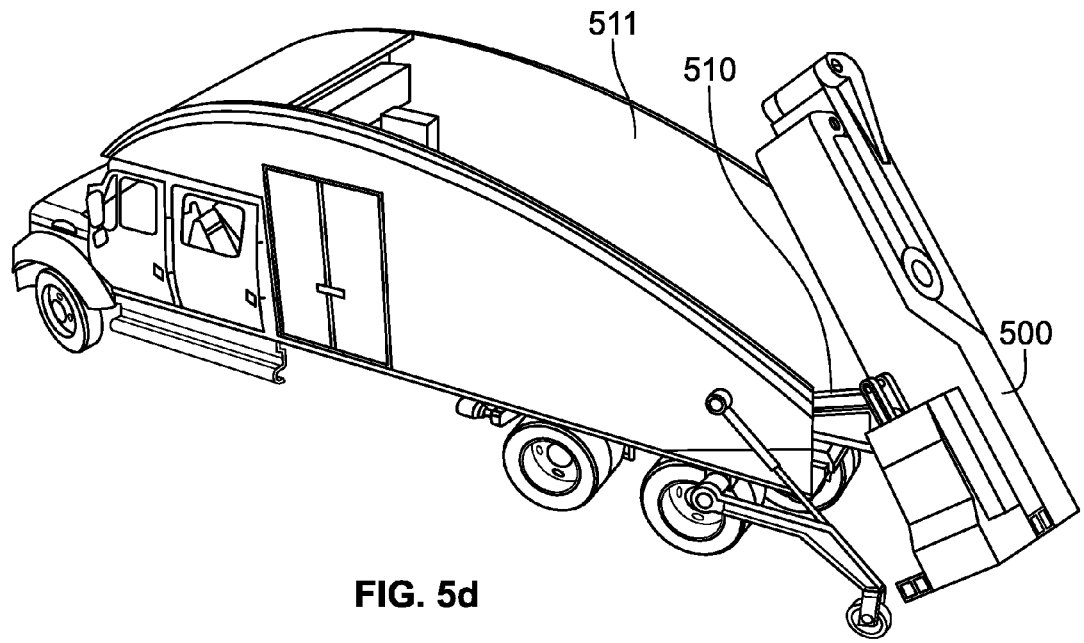
FIG. 5d illustrates a boom stowing position, according to an embodiment of the present specification.
Figure 5E:
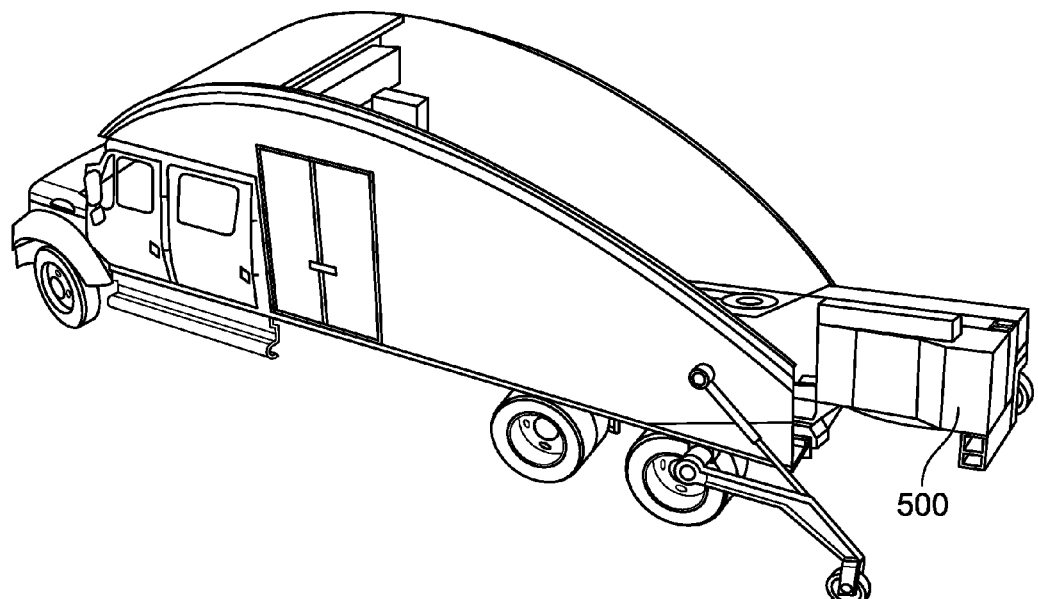
FIG. 5e illustrates a boom stowing position, according to an embodiment of the present specification.
Figure 5F:
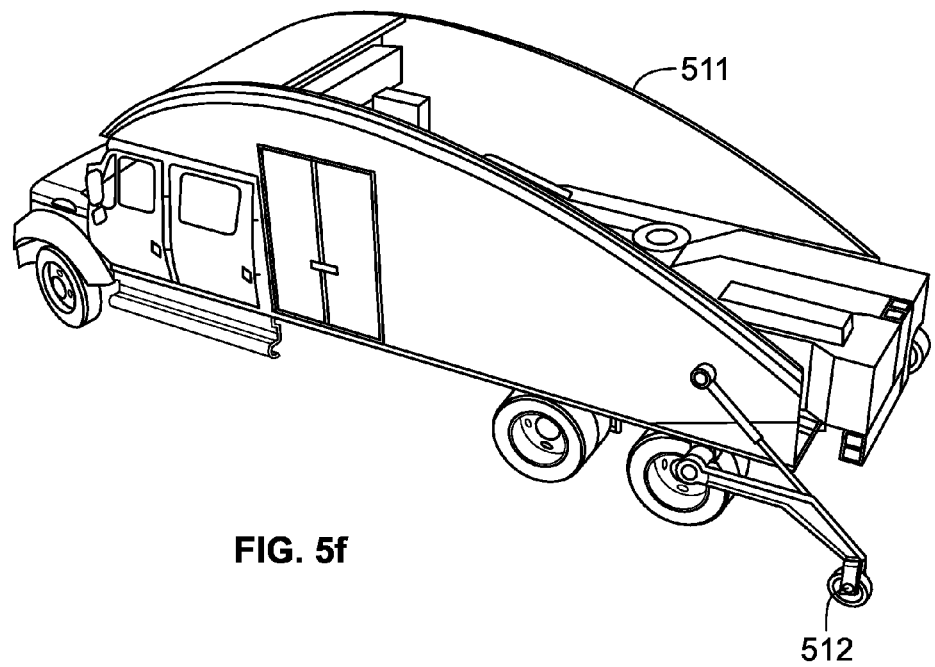
FIG. 5f illustrates a boom stowing position, according to an embodiment of the present specification.

FIGS. 5a through 5f illustrate an exemplary stowing sequence for the boom structure. Referring to FIG. 5a, the horizontal section 501 of the boom assembly 500 is bent at middle point 502 towards the direction of the X-ray source and vertical section 503 of the boom assembly 500. Next, as shown in FIG. 5b, if wheels are employed, the wheels 509 on the vertical section 504 orient themselves (automatically) toward the X-ray source 505, and stay on the ground providing support until the source-side horizontal sub section 507 of the horizontal section 501 is fully vertical. Then the array-side horizontal sub section 508 of the horizontal section 501 is lifted up into the vertical position, such that the two vertical sections 503 and 504 move closer to each other as shown in FIG. 5c Next as shown in FIG. 5d, the entire source-boom structure 500 pivots around the assembly mount 510 towards the bed of the truck 511, until as shown in FIG. 5e, the boom structure 500 is completely horizontal. The boom structure 500 is then pulled further into the truck 511 as shown in FIG. 5f using a suitable fixture (not shown in the drawings). The outrigger wheel 512 is also subsequently retracted.

One of ordinary skill in the art would appreciate that the reverse sequence is followed when the boom is deployed. In an embodiment, the boom structure is made up of a light-weight but stiff internal frame with plastic, carbon-fiber or thin aluminum covers.

Figure 6:
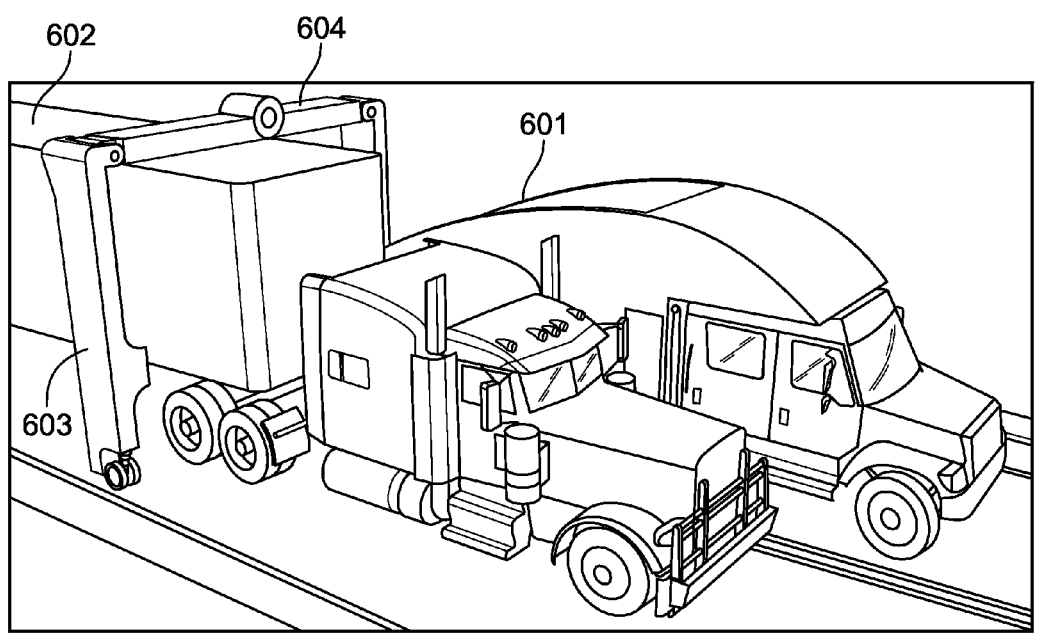
FIG. 6 illustrates the mobile inspection system of the present specification during a scanning operation.

FIG. 6 illustrates a mobile inspection system 601 as described in the present specification in scanning mode. A person of ordinary skill in the art would appreciate that the system is capable of scanning large trucks, such as the one 602 shown in the figure, as well as smaller vehicles. As a vehicle 602 passes through the portal 603 created by the boom, it is scanned using radiation from the X-ray source, as described throughout this specification. X-rays transmitted through (and attenuated by) the vehicle are detected by suitable detectors as described throughout this specification. In an embodiment, the detectors are integrated within the portions of the boom 604 that are opposite to the X-ray source and in the beam path. An image is generated from the detected radiation and it forms the basis of material discrimination. Further details of X-ray scanning systems are provided in U.S. patent application Ser. No. 13/577,170, which is herein incorporated by reference in its entirety. In an embodiment, the mobile inspection system 601 remains stationary while the vehicle 602 passes through the portal 604 coupled to the mobile inspection system 601. In other embodiment, the vehicle 602 remains stationary and the mobile inspection system 601 moves past the vehicle 602 such that the portal 604 passes over the vehicle 604 to scan the same.

Reduced Overall System Weight and Size

Although the present system is designed to scan large containers and trucks, in an embodiment, the system itself is light-weight compared to existing mobile inspection systems and hence easy and flexible in deployment. In an embodiment, the reduction in overall system weight and size is achieved by using a weight optimized Diesel-Electric Hybrid Vehicle design. The hybrid vehicle uses a diesel/electric hybrid drive train which allows for about 25% reduction in system weight. This reduction in weight is achieved by optimizing the chassis chosen, supplementing system power demands with an electric motor while reducing the size of the diesel motor, in an embodiment. Additionally, in an embodiment, the heavy diesel generator usually used for operating the system in scanning mode is eliminated, and electric power is drawn from the main truck engine as part of its diesel-electric hybrid design. In existing systems, the operator stations which are used to analyze the scanning results are generally in a separate enclosure over the superstructure on the trunk bed of the inspection system. In an embodiment of the present specification, additional weight reduction is achieved by eliminating the separate custom operator enclosure, and integrating operator stations into inspection vehicle itself (as shown in FIG. 1). Significant weight reduction is further achieved using custom-designed X-ray source shielding that is optimized for a particular radiation exclusion zone.

Cargo inspection systems typically use a linear accelerator X-ray source which produces X-rays not only in the desired direction (namely onto the object being scanned) but in all directions. These X-rays emanating in undesired directions are blocked by shielding. Typically, X-ray sources are specified to have a fixed fraction of "leakage" of X-ray energy in all directions except the desired direction, thus, a source is selected with a specified leakage level so that it complies with exclusion zone requirements. The exclusion zone is usually defined as a rectangular area, chosen such that the radiation at the boundary of the area does not exceed a certain maximum dose rate, averaged over the course of one hour. Calculations and measurements, however, show that the customer-specified exclusion zone, as well as the actual inspection system geometry, has various asymmetries that lead to an exclusion zone that is better than required in some directions, which can mean that either the exclusion zone could have been smaller in some directions, or that there is too much shielding present in those directions. The shielding could, in principle, be removed without affecting the performance of the system. Since the shielding consists of lead and tungsten, significant weight reduction can be achieved using an optimized shielding design.

Thus, in an embodiment, the present specification optimizes the weight of the shielding to obtain an overall X-ray source weight of about 4000 pounds for a 6 MV source. This is significantly lower compared to the weight of a standard 6 MV source, which, for the ultra-low-leakage version ($10^{-6}$ leakage fraction), is about 7800 lbs.

Figure 30:
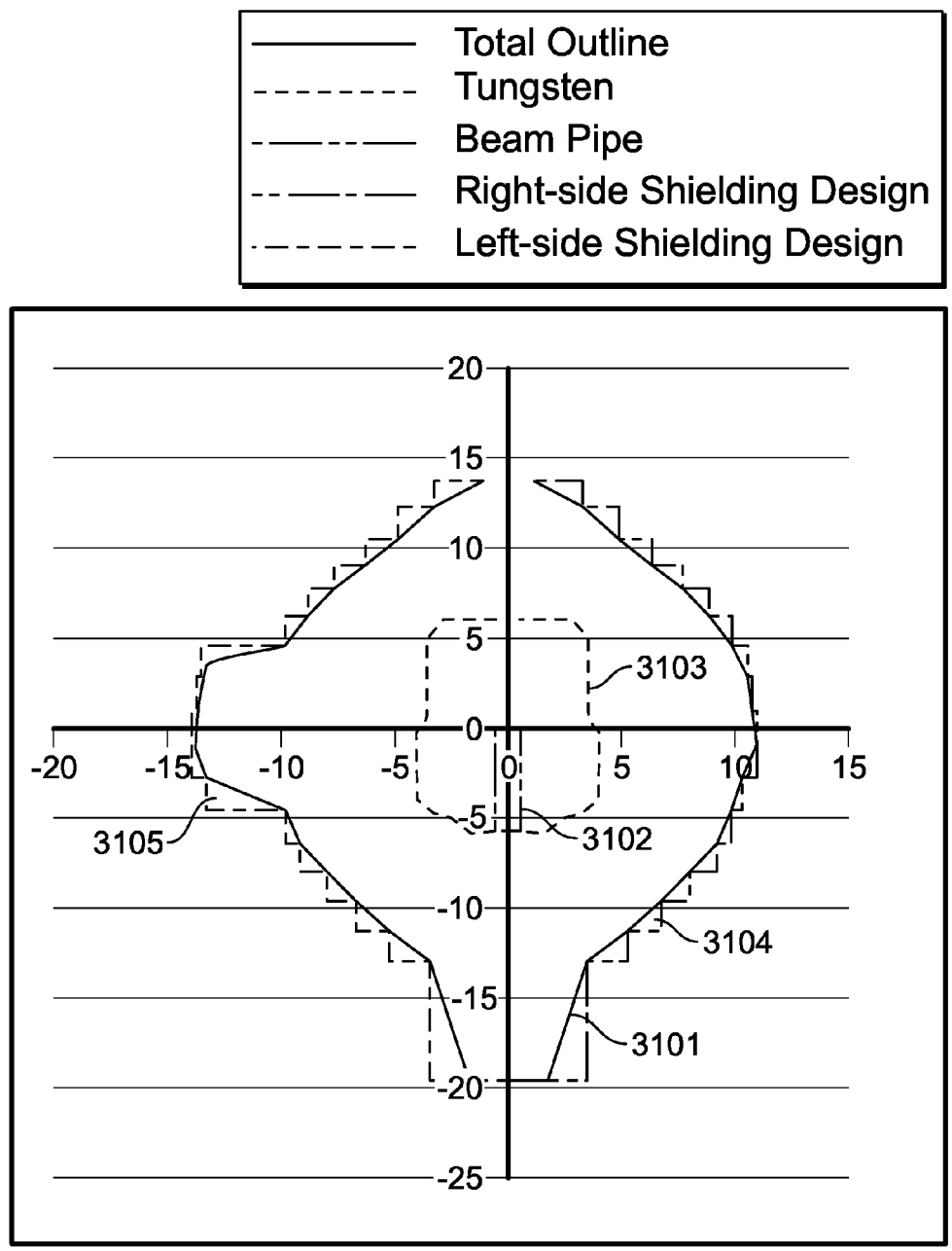
FIG. 30 is a graphical representation of a specialized shielding design for a particular configuration.

FIG. 30 illustrates an exemplary calculated shielding boundary, in inches, where shielding thickness in all directions is optimized for a particular maximum dose at a particular predetermined boundary. The x-axis represents the "lateral" direction, or the scan direction. The y-axis represents the horizontal direction of the x-ray beam. Referring to FIG. 30, curve 3101 shows the total shielding outline. Line 3102 represents the extended target, which, in an embodiment, is a target that is located beyond the end of the linear accelerator, usually at the end of a narrow tube that extends in front of the linac. In one embodiment, an extended target is employed to enable easier shielding of the immediate surroundings of the target, since the tube is narrower than the linac. Line 3103 represents an outline of the tungsten shield. Stepped lines 3104 and 3105 represent right-hand and left-hand shielding designs, respectively, which can be arrived at when using plain lead cylindrical sections. In one embodiment, extra shielding is provided in the direction of the operator location, as indicated by the asymmetrical lateral deviation in line 3105 between y=−5 and y=5 inches, as compared to line 3104. For a system with only a forward directed beam, the shielding is, in one embodiment, approximately cylindrically symmetric, with the exception of lateral deviation.

Figure 31A:
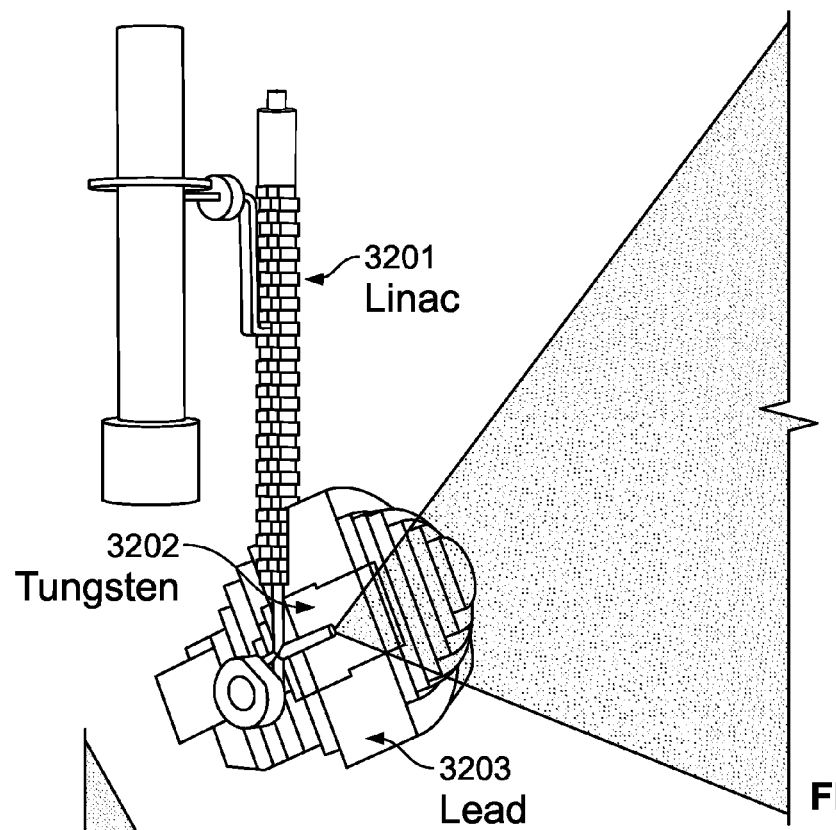
FIG. 31a shows one view of an exemplary shielding design, according to an embodiment of the present specification.
Figure 31B:
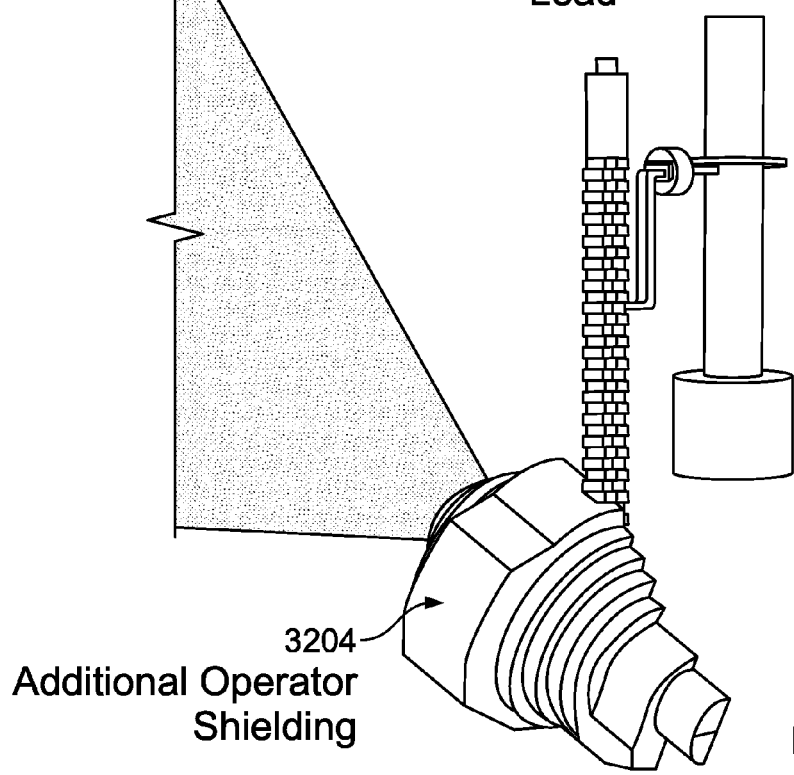

In other embodiments, where electron beam steering is employed, as described below, the shielding can be positioned more closely in the lateral or horizontal direction, but not vertical, since the electron beam needs room to deflect and come in from different angles. Thus, the shielding in the vertical direction, in these cases, is farther from the source. FIGS. 31a and 31b show the left and right sides of a possible shielding implementation, respectively corresponding to the exemplary shielding pattern described in FIG. 30. Referring to FIGS. 31a and 31b, a vertically mounted source 3201 is equipped with shielding designed to contain both tungsten 3202 as well as lead 3203. Further, additional operator shielding 3204 is also provided. Further details of a vertically mounted source are provided in the following sections, with reference to FIG. 16.

Systems and methods of reducing X-ray source shielding requirements, thereby reducing the overall weight of a linear accelerator X-ray source, are described in further detail in U.S. Provisional Patent Application No. 61/761,690 and in U.S. Provisional patent application Ser. No. 13/492,614, both of which are herein incorporated by reference in their entirety.

Reduced Radiation Exclusion Zone Through Vertical Intensity Modulation

Modulation of X-rays in the vertical plane helps to reduce the size of exclusion zone and specifically target regions of high attenuation in a focused manner. Vertical intensity modulation of X-rays can be achieved through multiple methods. The present specification describes methods and systems for implementing vertical intensity modulation.

Figure 35A:
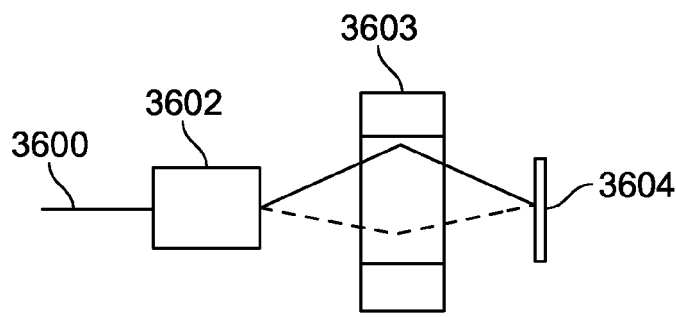
FIG. 35a illustrates a single-energy system for vertical intensity modulation which employs a pulsed bend magnet and a DC quadrupole magnet in accordance with an embodiment of the present specification.

FIG. 35a illustrates a system for vertical intensity modulation in a single-energy system which employs a quadrupole magnet, and specifically a DC quadrupole magnet, in accordance with an embodiment of the present specification. As shown in FIG. 35a, a pulsed dipole steering magnet 3602 changes the direction of single-energy electron beam 3600 such that electron beam 3600 passes through a magnetic field created by employing a DC quadrupole magnet 3603. In an embodiment, the magnetic field generated by using DC quadrupole magnet 3603 is configured such that it deflects the direction of single energy electron beam 3600 which then strikes the target 3604 at a specific point at a desired angle. The exact angle at which electron beam 3600 strikes the target 3604 determines the direction in which the generated X-ray beam has maximum intensity.

In an embodiment, the system analyses the image slice recorded in each pulse to determine the areas of high attenuation in the scanned object. Subsequently, in the next pulse, the quadrupole magnet 3603 changes the direction of electron beam 3600 such that the electron beam 3600 strikes the target 3604 at an angle which generates X-rays focused towards the area of high attenuation captured in the previous pulse. In one embodiment, the electron beam is adjusted continuously between successive X-ray pulses.

In some embodiments of the present specification, the system employs dual-energy beams for material discrimination instead of the single-energy methodology described above. In the case of a dual-energy beam, vertical modulation of the electron beam is more complicated. For dual-energy beams, the magnetic field is configured such that two consecutive beams of different energies have the same trajectory, which is switched at each pulse depending on the cargo attenuation requirements. The magnetic field strength needed to deflect a low-energy electron beam is lower than the field strength needed to deflect a higher-energy electron beam. In an embodiment, the present specification employs one or more shaped magnetic fields such that the electron beams passing through such shaped magnetic fields arrives at the target at the same location regardless of the energy of the beam. In an embodiment, to cause both the high energy and the low energy electron beams go through the same trajectory, the magnetic field is switched between two different field strengths. In an embodiment, the X-ray source uses a pulsed quadrupole magnet to provide the required magnetic field. As is known to those of ordinary skill in the art, a pulsed quadrupole magnet is one that switches between two different field strengths, to compensate for the difference in energy of the electron beam between one pulse and the next. It should be noted that in the case of dual energy, the two beams of different energies arrive in successive, and not simultaneous, pulses. Thus, a first energy will arrive in a first pulse while a second energy will arrive in a second pulse. This "switching" between energies remains consecutive, with the first energy arriving in the third pulse and so forth.

Figure 35B:
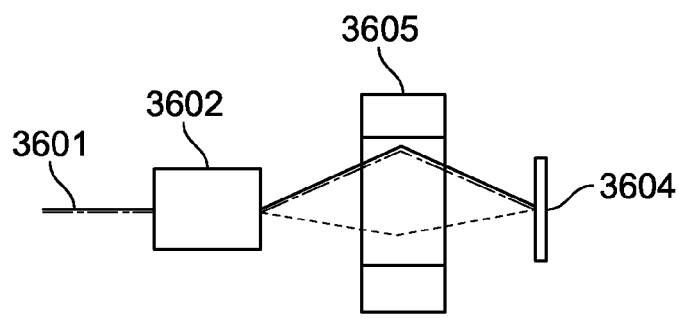
FIG. 35b illustrates a dual-energy system for vertical intensity modulation which employs a pulsed bend magnet and a pulsed quadrupole magnet in accordance with an embodiment of the present specification.

FIG. 35b illustrates vertical intensity modulation in a dual-energy system which employs a pulsed quadrupole magnet in accordance with an embodiment of the present specification. As shown in FIG. 35b, pulsed dipole steering magnet 3602 changes the direction of dual-energy electron beam 3601 such that the dual-energy electron beam 3601 passes through a magnetic field created by a pulsed quadrupole magnet 3605. In an embodiment, the pulse strength of the pulsed dipole magnet 3602 is adjusted such that the magnetic field applied to the electron beam in the dipole magnet positions the electron beam into the desired trajectory through the quadrupole magnet 3605. In an embodiment, the magnetic field generated by using the pulsed quadrupole magnet 3605 is configured such that it deflects the direction of dual energy electron beam 3601 which then strikes the target 3604 on a specific point at a desired angle. The exact angle at which dual energy electron beam 3601 strikes the target 3604 determines the direction in which the generated X-rays beam has maximum intensity. In an embodiment, the pulsed quadrupole magnet 3605 is pulsed to adjust the magnetic field for deflecting the two energies appropriately. In one embodiment, the target is made of a high-Z material, such as tungsten, as is used in conventional x-ray sources. In another embodiment, the target is made of a low-Z material, which tends to make the x-ray beam intensity more forward-focused.

Figure 35C:
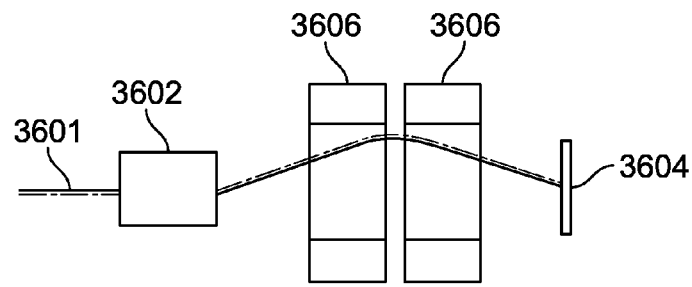
FIG. 35c illustrates a beam steering mechanism in a dual energy system which employs pulsed bend magnet and two DC magnets in accordance with an embodiment of the present specification.

FIG. 35c illustrates the system for beam steering in a dual energy system which employs two DC quadrupole magnets in accordance with an embodiment of the present specification. As shown in FIG. 35c, dual energy electron beam 3601 deflected by the steering magnet 3602 is transported through a magnetic field created by two DC quadrupole magnets 3606 which steer the electron beams such that the two beams of different energies have the same trajectory which is switched at each pulse depending on the cargo attenuation requirements.

In an embodiment, a first vertical slice of the cargo image is acquired by pulsing the X-ray source and acquiring data from the detector array. This slice is analyzed, and the signals from the detector array are used to estimate the area within the cargo in which the intensity is the highest, and from that the optimal electron beam angle and instantaneous beam current are determined in order to adequately image the cargo while maintaining a low dose. In an embodiment, these settings are then applied to the next slice after which the process repeats until the entire cargo object is scanned. In one embodiment, the electron beam is adjusted continuously between successive X-ray pulses. Lower-attenuation areas of the cargo are scanned with progressively lower X-ray intensities, since these areas are further away in angle from the maximum level of emission.

Reduced Radiation Exclusion Zone Through Electron Beam Steering

In an embodiment of the present specification, a smaller exclusion zone and hence lower weight of the X-ray source is accomplished using enhanced beam collimation achieved through electron beam steering. In an embodiment, the electron beam in an X-ray generator tube is directed onto a custom target in a manner that produces "forward radiation" at a number of different angles, thereby making it possible to achieve better angular coverage and only in the desired directions.

In an embodiment, the electron beam emerging from the linear accelerator in the X-ray source is defocused to split it into multiple portions which are then transported with the help of a shaped magnetic field to strike a shaped target at multiple angles. The target point itself does not move, rather, parts of the electron beam arrive from different directions in the vertical plane. Since the X-rays are produced from the target with the highest intensity in the direction of the electron beam, a high dose is produced in multiple directions simultaneously, resulting in the cargo being scanned with an X-ray fan beam, that is more uniform in the vertical direction and that is collimated in the vertical plane. At certain x-ray intensities, a conventional non-uniform beam would not provide sufficient intensity to adequately image parts of the cargo not covered by the highest intensity of the beam. Since the X-ray intensity in the fan beam is more uniformly spread across the cargo, the overall intensity of the electron beam can be reduced. Because of this overall reduction in X-ray intensity, the shielding, particularly in the lateral direction, can be reduced, leading to a lower overall source weight. In one embodiment, the target is made of a high-Z material, such as tungsten, as is used in conventional x-ray sources. In another embodiment, the target is made of a low-Z material, such as, but not limited to carbon, which tends to cause the x-ray beam intensity to be more forward-focused, which allows the lateral shielding to be further reduced, resulting in additional weight reduction of the X-ray source.

In an embodiment, the emission intensity angular profile is used to estimate whether a sufficient amount of X-ray intensity is used to adequately penetrate and image the cargo at all angles in the plane of the X-rays. In another embodiment, electron beam steering is combined with X-ray source intensity modulation. If it is determined that some areas require a higher intensity, in an embodiment, the overall intensity of the X-ray source is increased, as described in the paragraphs below.

In an embodiment, the present specification describes an X-ray source with a low-Z target which causes the X-ray beam to be more forward-peaked. In an embodiment, electron-beam steering is selectively applied to direct the forward-peaked X-rays towards areas in the cargo with high attenuation. In some embodiments, the low-Z target is shaped. In an embodiment, the shaped target has a semicircular shape. In other embodiment, the shaped target has a triangular shape. In an embodiment, the target has a flat shape.

In some embodiments, the low-Z target is carbon. In some embodiments, the low-Z target is graphite. In some embodiments, the low-Z target is formed from diamond, which exhibits good heat conduction properties, since the heat produced by the electron beam in the target needs to be adequately dissipated. Since X-rays generated from a low-Z target are forward-peaked, they allow for a significant reduction in lateral and backward shielding, and, as a result, a significant reduction in overall shielding weight can be achieved.

It should be noted herein that the material of the target may be selected depending upon the application of the present specification. For example, tungsten may be selected for a wide fan beam, low-Z materials such as graphite may be selected for a narrow fan bean, or copper may be selected to reduce the production of photo-neutrons.

Figure 32:
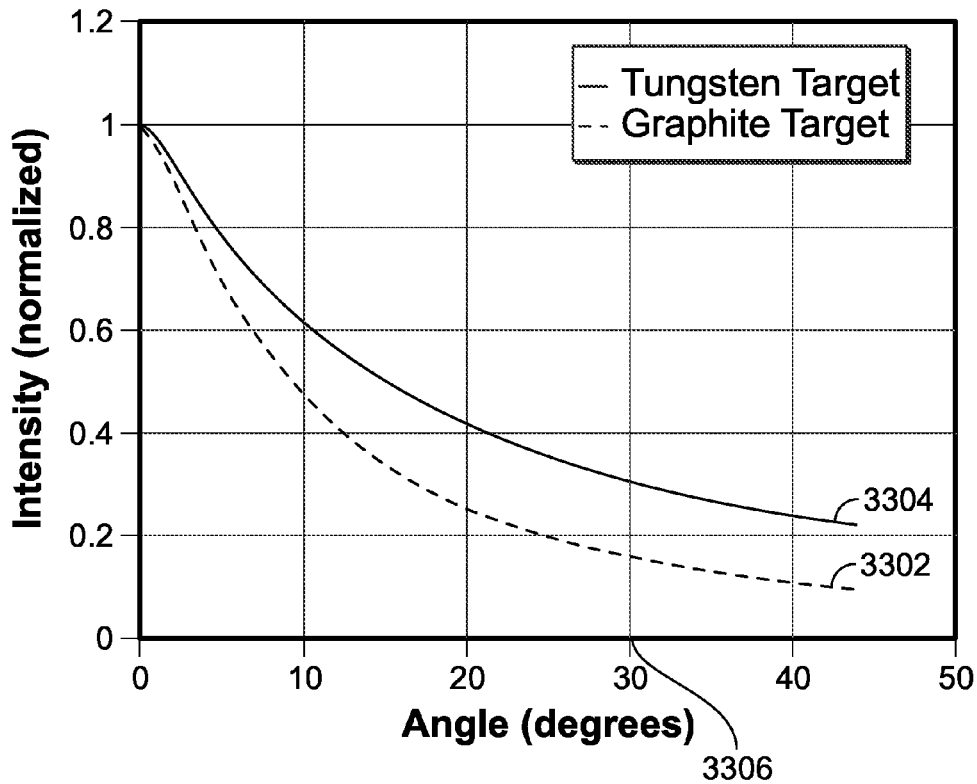
FIG. 32 is a graph depicting the intensity of an x-ray source versus an x-ray source angle corresponding to two similar x-ray sources coupled with high-Z and low-Z targets in accordance with an embodiment of the present specification.

FIG. 32 is a graph depicting the intensity of an x-ray source vs. the x-ray source angle corresponding to two similar x-ray sources coupled with a) a low-Z target and b) a high-Z target. FIG. 32 shows X-ray angular distributions 3302, 3304 with respect to the electron beam direction in an X-ray inspection system, for two radiation sources, simulated using the EGS electron-photon transport code, and normalized to yield 1 in the forward direction (angle=0). EGS is a standard simulation code. It should be noted herein that other simulation codes would yield similar results. The sources simulated here are standard 9 MV sources in which electron beams strike a target. The energy of the source does affect the overall shape;

however, it does not affect the fact that a low-Z target has a steeper angular fall-off than a high-Z target. One of the sources in the simulation is coupled with a high-Z target, such as tungsten, which has an atomic number of 74 (Z=74), while the second source is coupled with a low-Z target, such as graphite, which has an atomic number of 6 (Z=6). During simulation internal tungsten shielding is provided in a backward direction. While X-ray intensity distributions obtained are averaged over all the x-ray energies, the angular distribution is steeper for the higher energy X-rays than for the lower energy X-rays. As is illustrated in FIG. 32, at an angle 3306 of approximately 30 degrees (as shown on the x-axis), the intensity 3302 of the x-ray source coupled with the graphite target is lower than the intensity 3304 of the x-ray source coupled with the tungsten target by a factor of two. Thus, as illustrated, significant amounts of shielding material may be eliminated by using a low-Z target such as graphite instead of a high-Z target like tungsten in an x-ray inspection system. Since such shielding is usually in the form of lead, and since the shielding can be removed from the outer layers when a low-Z target is used, this adds up to a significant shielding volume and therefore weight. By way of an example estimate, it is calculated that at a minimum, a layer of one half inch (about one half-value layer) of lead at a radius of 25 cm with a weight of approximately 200 pounds can be omitted by using a low-Z target. In reality, typical shielding designs are much more complicated, in part because of the geometry of the linear accelerator components and in part because of the change of the energy spectrum with angle, and therefore a larger amount of excess shielding could most likely be removed. It should be noted that the example provided above is only for exemplary purposes and in no way limiting to the present specification.

High-Z targets provide a more uniform intensity of an x-ray fan beam which is typically used in cargo radiography systems, as compared to low-Z targets. In general, angular coverage is approximately a factor of two lower for a low-Z target than a high-Z target. Typically, angular coverage of an X-ray beam in a standard cargo radiography system is around 70 degrees (35 degrees in each direction as measured from where the beam exits the x-ray source) which is typically obtained by using a high-Z tungsten target. It should be noted that this coverage is still not very uniform, however. For example, at 35 degrees, the intensity is only 30% of the forward intensity (for a 9 MV source). When a low-Z target is employed, the equivalent angular coverage is approximately 34 degrees (17 degrees in either direction). Generally, angular coverage is even lower considering the energy spectrum of the x-rays at such angles; for example, lower-Z targets have a faster fall-off of high-energy x-rays, and thus have less coverage for the high energy x-rays which are more useful for radiography. On the other hand, however, this makes sources with low-Z targets easier to shield.

In an embodiment of the present specification, the electron beam in an x-ray generator tube is directed onto a custom target in a manner that produces "forward radiation" at a number of different angles, thereby making it possible to achieve better angular coverage than with a beam producing "forward radiation" in only one direction in the desired vertical plane. Forward radiation, or forward peaked radiation, is radiation that is preferentially emitted in the same direction as the electron beam direction when the latter strikes the target. More forward-peaked radiation is radiation that is concentrated in a smaller range of angles with respect to the electron beam direction. Referring to FIG. 32, for a high-Z target (tungsten) the intensity of the radiation averaged over all energies drops to half of its 0-degree value at an angle of about 15 degrees. For the low-Z target (graphite), the intensity of the radiation drops off to half of its 0-degree value at about 9 degrees. Therefore, for a low-Z target, the intensity of the radiation drops off to half of its 0-degree value at a smaller angle range than for a high-Z target. Also, for a low Z target, the forward-peak nature of the emission is indicative of having at least 50 percent of the intensity of the total radiation concentrated in angles less than 10 degrees from the emission point. It should be appreciated that shielding can be decreased in areas beyond a particular angle, as measured from the emission point, where the intensity has sufficiently decreased, such as beyond 9, 10, 11, 12, 13, or 14 degrees, relative to the shielding between the particular angle and emission point.

It should be appreciated that a low-Z target is an electron beam target comprising materials with an atomic number, Z, which is less than that of iron, e.g. 26. A high-Z target is an electron beam target comprising materials with an atomic number, Z, above that of tin, e.g. 50. For example, carbon and its forms (such as graphite and diamond) have a Z of 6 while tungsten has a Z of 74.

In an embodiment, the system of the present specification compensates for the steeper angular distribution by use of magnetic beam transport and shaping of the low-Z target, thereby producing a more uniform coverage of the object being scanned than conventional systems with respect to both x-ray intensity and x-ray energy. In one embodiment, electron-beam steering is employed to direct the electron beam at the tip of the target from below or above at different angles, in order to direct the maximum of emission of these X-rays towards high-attenuation areas in the cargo, at various angles. In an embodiment, the electron beam is steered by use of a suitably designed magnet, or by electrostatic deflectors, or by a combination of both. In an embodiment, the X-rays are collimated into a fan beam.

In an embodiment, the magnetic elements comprise a defocusing magnet, such as, but not limited to, a quadrupole magnet. A defocusing magnet applies a magnetic field to an electron beam which causes portions of the electron beam to diverge from each other. Depending on the target configuration, those diverging portions may then impinge on different locations on the shaped target. For example, for a small shaped diamond target, the diverging beam is then refocused using an appropriately shaped magnetic field, such as a focusing quadrupole, or a combination of a focusing quadrupole and a steering dipole.

Figure 36A:
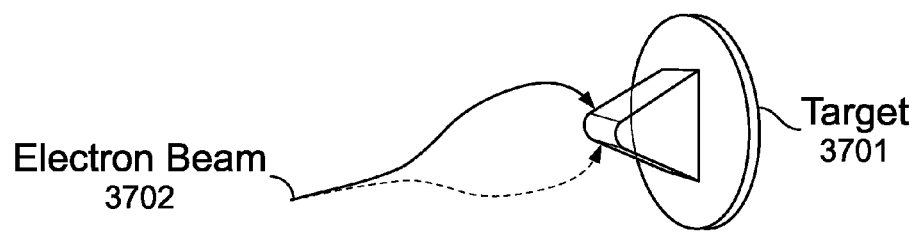
FIG. 36a illustrates the trajectory of an electron beam during vertical intensity modulation, which arrives at a specific point on the target from two different directions in subsequent pulses to generate X-rays focused towards areas of high density; and, FIG. 36b is another illustration of the trajectory of an electron beam during vertical intensity modulation, which arrives at a specific point on the target from different directions in subsequent pulses to generate X-rays focused towards areas of high density.
Figure 36B:
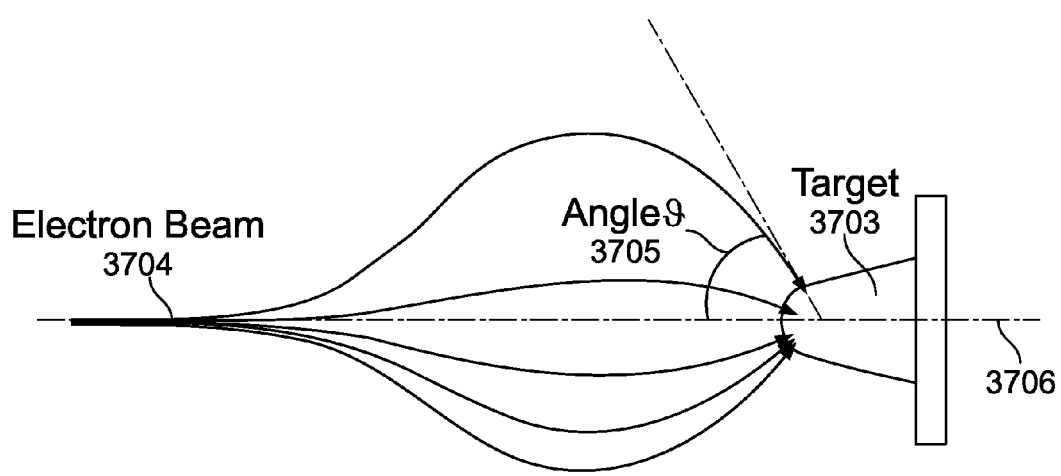

In an embodiment of the present specification, in an X-ray source having single energy electron beam, vertical intensity modulation can be achieved through electric or magnetic elements which change the direction of the electron beam 3702, as shown in FIG. 36a, such that it arrives at the target 3701 at a different angle, directed towards a region of high attenuation in each pulse. FIG. 36b shows an electron beam 3704 moving in a different path from its original direction 3706, bending back towards the target 3703, and arriving at target 3703 at an angle θ 3705. In an embodiment, the magnetic elements used for vertical intensity modulation comprise a pulsed dipole magnet and a DC quadrupole magnet. In another embodiment, the elements used for vertical intensity modulation comprise a pulsed electrostatic deflector and a DC quadrupole. In yet another embodiment, multiple electric and magnetic deflection devices are used, some of which may or may not be DC or pulsed. In one embodiment, the target is made of a high-Z material, such as tungsten, as is used in conventional x-ray sources. In another embodiment, the target is made of a low-Z material, which tends to make the x-ray beam intensity more forward-focused.

Figure 33:
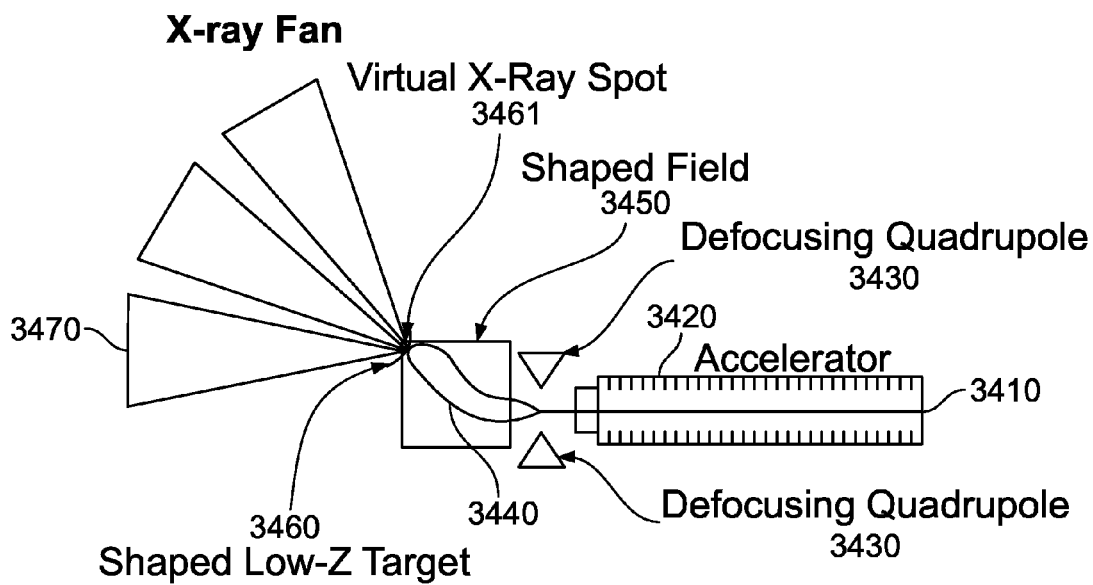
FIG. 33 illustrates an x-ray fan beam generated by using a low-Z target, in accordance with an embodiment of the present specification, in which DC magnetic elements comprising a defocusing magnet and shaped magnetic field are employed.

FIG. 33 illustrates an x-ray fan beam generated by using a custom low-Z target, in accordance with an embodiment of the present specification in which the magnetic elements comprise a defocusing magnet. As shown in FIG. 33, in an embodiment, magnetic element 3430 comprises a defocusing quadrupole magnet. The transported beam 3440 enters a shaped magnetic field 3450, designed to transport different parts of the beam 3440 to different areas on a shaped target 3460 to produce x-ray fan beam 3470. The geometry is optimized in order to provide a reasonable virtual focal point 3461 for the produced x-rays 3470. Thus, in an embodiment, the shaped magnetic field is arranged to transport the electron beam or parts thereof onto the shaped target in such a way that the x-rays will all appear as if they come from within a short distance of a particular point within the target.

In an embodiment, the shaped magnetic field is created by optimally arranging magnetic materials and electric coils, as is known to those of ordinary skill in the art. The magnetic field and target geometry are optimized to make as small a beam spot as possible. Both geometries are preferably optimized. In this embodiment, the main characteristic is to make it appear as though the x-rays all come from the same spot.

In an embodiment, the x-rays produced are forward-peaked, thereby reducing the amount of lateral shielding because of the reduced intensity and energy of the x-rays emerging in lateral directions, thereby reducing the probability of freeing neutrons from the shielding material. These neutrons are a nuisance in that they can produce spurious signals in nearby detectors, and using this method reduces the occurrence of such spurious signals. Further, in using the method of the present specification, the thickness of materials, type of materials, and geometries needed to shield against these neutrons can be altered and/or reduced.

In another embodiment, the magnetic elements comprise a bending magnet which can be set to bend the electron beam towards at least one of a plurality of areas within a shaped magnetic field that in turn transports the electron beam onto a corresponding plurality of parts of the shaped target, arriving there in a corresponding plurality of particular directions optimized for producing x-rays in the desired directions. In an embodiment, the bending magnet is set to bend the electron beam towards one of said plurality of areas within the shaped magnetic field on each subsequent accelerator pulse, in a sequence that comprises each of said plurality of areas. Between pulses the bending magnet field strength is adjusted appropriately in order for the beam to be directed towards the next area of the shaped magnetic field in the sequence, as desired.

Figure 34:
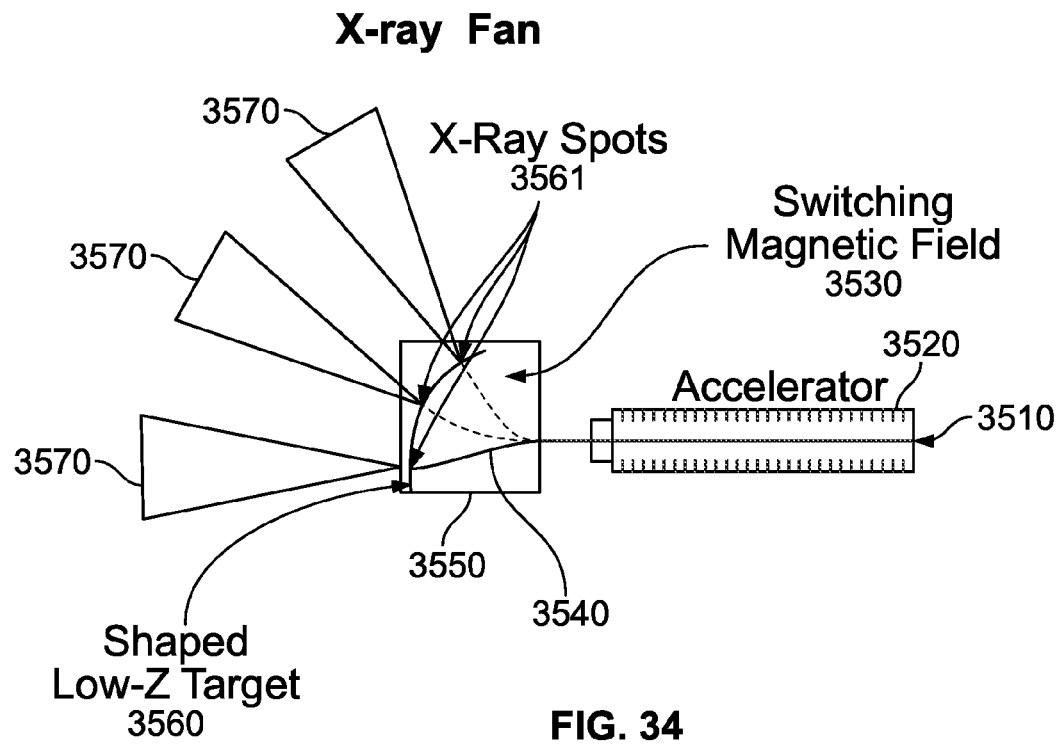
FIG. 34 illustrates an x-ray fan beam generated by using a low-Z target, in accordance with an embodiment of the present specification, in which switching magnetic elements comprising a shaped magnetic field are employed.

FIG. 34 illustrates an x-ray fan beam generated by using a low-Z target, in accordance with an embodiment of the present specification, in which the magnetic elements comprise a bending magnet. As shown in FIG. 34, electron beam 3510, after passing through accelerator 3520, is transported in a vertical direction by using magnetic elements 3530. In an embodiment, magnetic elements 3530 comprise a bending magnet that is set to bend the electron beam on each subsequent accelerator pulse, thus creating a switching magnetic field. The transported beam 3540 enters a shaped magnetic field 3550, designed to transport different parts of the beam 3540 to different areas on a shaped target 3560 to produce X-ray fan beam 3570. The x-rays from different pulses of the x-ray source are transported by the shaped magnetic field 3550 to different areas on the shaped target 3560, such that the x-rays appear as if they come from different points (x-ray spots) 3561 within the target. Therefore, the electron beam in an X-ray generator is switched from one direction on a target to another in successive electron pulses, in order to generate X-rays having a uniform intensity.

By transporting the x-rays from different pulses of the x-ray source by the shaped magnetic field to different areas on the target, such that the x-rays appear as if they come from different points within the target, a plurality of separate images can be produced, each from a separate vantage point. In the case where the system is applied in a radiography configuration, the separate images can then be used to obtain 3D information about the object being scanned, as is known to those skilled in the art.

Reduced Radiation Exclusion Zone Using Intensity Modulated Advanced X-Ray Source It should be evident to those of ordinary skill in the art that in many situations, only a limited amount of space is available to perform cargo scanning operations. At some ports of entry and in urban environments, the space is particularly limited. To that end, the scanning system of the present specification aims to provide the same imaging performance using a smaller footprint, thereby increasing its operational effectiveness. This is done, in an embodiment, by reducing the size of the exclusion zone and keeping the dose rate low, without compromising on the image quality.

In an embodiment, the exclusion zone is less than 36 m (120 ft) in the scan direction and less than 20 m (66 ft) perpendicular to the scan direction when scanning cargo equally divided between low-, medium-, and high-density cargos. At the same time, the dose to the driver and inspectors is less than 100 mrem per year, while the dose to cargo and possible stowaway is less than 0.5 rad (5 mSv) per scan at the cargo container/vehicle surface nearest to the radiation source.

In order to reduce the exclusion zone in the perpendicular direction, the present system employs an advanced intensity modulated X-ray source technology. In general, the higher the source intensity at a given source energy, the greater the amount of material the X-ray beam can penetrate and the better the contrast resolution. In current practice, the X-ray source intensity of an inspection system is set to the highest level allowable under the particular circumstances of the system and the inspection area, and all cargo is inspected using this fixed intensity, whether the accurate inspection of the cargo requires this intensity or not. The inspection intensity, however, is typically not the highest rated intensity that the source is capable of producing and is often set to not exceed a specified radiation dose limit at the boundary of a predefined Exclusion Zone. An intensity-modulated source changes intensity based on the results of the current X-ray pulse and uses a higher or lower intensity for the next X-ray pulse, if possible. That is, for each slice of the image, the current slice is analyzed and then source settings for the next pulse are optimized. In an embodiment, optimized settings include source intensity, energy and/or pulse frequency, detector integration time, and collimator settings. Use of an intensity modulated source can also involve adaptive image processing, both in the temporal and the spatial domain. In an embodiment, the system uses pulse-width modulation to change X-ray intensity. In another embodiment, pulse-height modulation is employed for intensity modulation by changing the instantaneous electron beam current. As will be recognized by those skilled in the art, pulse-height modulation is preferred for the purposes of X-ray spectroscopy, since the X rays arriving in a detector are spread out over the longest possible pulse duration.

Systems and methods for using an intensity-modulated X-ray source are described U.S. Pat. Nos. 8,781,067, 8,437,448 and 8,054,937, all of which are incorporated herein by reference in their entirety.

Figure 29:
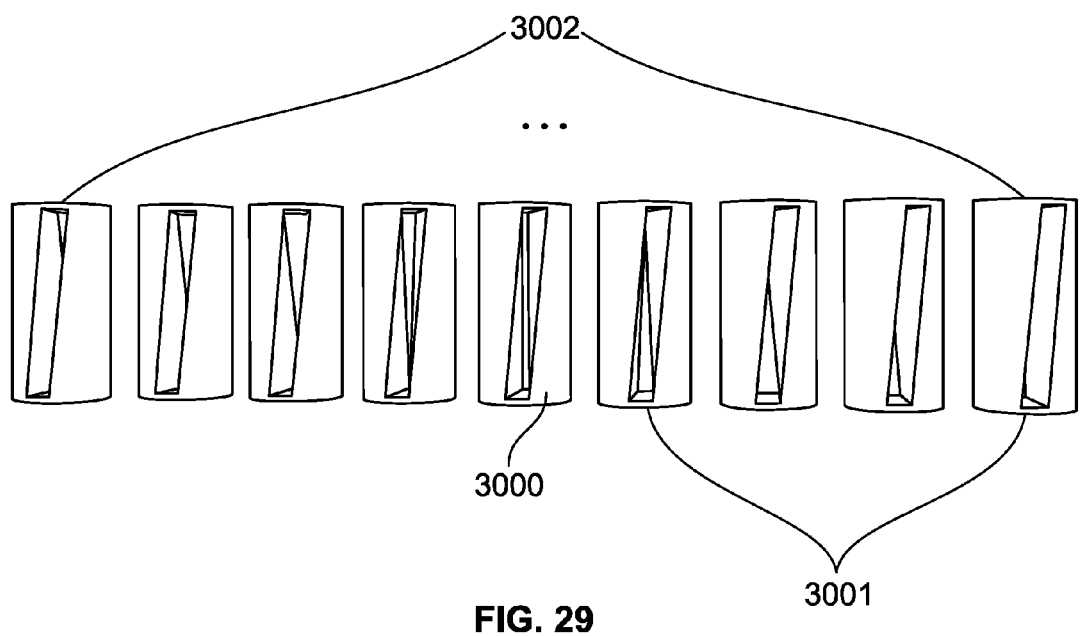
FIG. 29 shows an embodiment of an x-ray filter design used for focusing the electron beam on areas of high density.

In an embodiment shown in FIG. 29, a cylindrical filter 3000 is shown which is inserted into the path of X-ray beam to regulate the intensity of X-rays in different directions. In an embodiment, the cylindrical filter 3000 comprises a slot 3002, which in an embodiment is configured in an approximately "spiral" shape and runs along part of the circumference of the cylindrical filter 3000. Multiple planar images 3001 of the cylindrical filter 3000 illustrate the shape and position of twisted slot 3002 when cylindrical filter 3000 is viewed from different directions. The filter 3000 helps to reduce the exclusion zone by using a mechanical means to achieve vertical beam intensity steering. In an embodiment, as the cylindrical filter 3000 rotates, the X-rays passing in different vertical directions through the slot 3002 are controlled leading to lower radiations emanating in undesired directions and a reduced exclusion zone. In some embodiments, the filter allows for attenuation of X-rays in some directions and allows for the full beam of X-rays to pass through in other directions. In other embodiment, small individual filter sections are inserted into the fan beam by means of actuators.

Improved Image Quality Using Gapless Detector Array

In some embodiments, the present specification significantly improves image quality and aims to reduce image artifacts for better identification of threats and contraband. It is well known in the art that artifacts, such as "hot line" and "fade artifact" are mainly produced by the scatter of the X-ray beam by the cargo, the detector array, boom structure, and associated structures. Further, "curtain artifact" is generated by boom oscillations at a number of frequencies that are predicted to occur as a result of resonances arising from the boom structure. The magnitude of the curtain artifact is determined by the width of the fan-beam, how well the fan-beam is aligned with the detector array, the magnitude of the boom motions, and the method used to normalize intensity variations from the linac.

In an embodiment, the system of the present specification counters scatter-related artifacts by at least one of the following:

1. reducing the width of the X-ray fan beam;
2. designing the X-ray detector array to remove sources of scatter; and
3. improving detector collimation.

Reducing scatter reduces the magnitude of the fade artifacts, and also helps to preserve the exponential relationship between the transmittance of the X-ray beam and the thickness of the object. This further helps the segmentation and classification of anomalous regions in the image. It may be noted that decreasing the width of the X-ray beam may cause the magnitude of the curtain artifact to increase. To counter that, the present specification implements several improvements to the boom structure employed in mobile applications to make it stiffer to dampen the vibrations, or shift to the natural frequencies.

Further, the system of the present specification improves the minimum observable contrast by using lower-noise detector electronics to achieve a reduction in the dark noise.

In an effort to eliminate the artifacts and to improve the situation with regard to X-ray scatter into the detectors, in an embodiment, the present system employs a collimated detector array design that has essentially no gaps, and where the collimator can be integrated into the boom design as a support element, reducing its effect on boom weight.

Because the source is a virtual point some distance away from the detector array, the only way to mount the modules in a way that leaves (mostly) no gaps is in a circular arc. This is, however, not usually feasible, since it takes up too much space. Thus, it may be noted that cargo inspection systems typically use an inverted-L-shaped detector array, as shown in FIG. 7. The L-shaped array 701 is preferred (over a circular arc) because it is spatially the most efficient layout, considering the rectangular cross section of a cargo container and the fan-like geometry 702 of a collimated X-ray beam, provided by the source 703. For high-energy X-ray inspection, the detectors in the detector array are narrow/thin for better spatial resolution and long in order to efficiently capture the transmitted X-rays. Because of this, the detectors need to be aimed more or less towards the source of the X-rays, or else the X-rays from the source would cross multiple detectors, reducing or eliminating the high spatial resolution.

Therefore, it is common practice to design the detector array such that it consists of a number of detector modules, each of which comprises several detectors, and each of which is mounted at a different angle in the array, optimized so that each detector in the module more or less is aimed at the source. The only way to mount the modules in this fashion is by offsetting one module from another, each one mounted at a slightly different angle, as shown in FIG. 8. FIG. 8 shows a typically configured detector array in which linear sections are "forced" to point to the source in a straight array. These discontinuities or "gaps" then lead to what is known as the horizontal line artifact. While this artifact can, to some degree, be addressed in software, it would be preferable to have a detector array design that would not exhibit this problem in the first place. FIG. 9 shows an ideal configuration of such detector, however, requires that each of the many detector elements (on the order of 1200 or so) to be aligned individually to aim at the source. This would require different electronics boards/mounting structures for each element.

Figure 10:
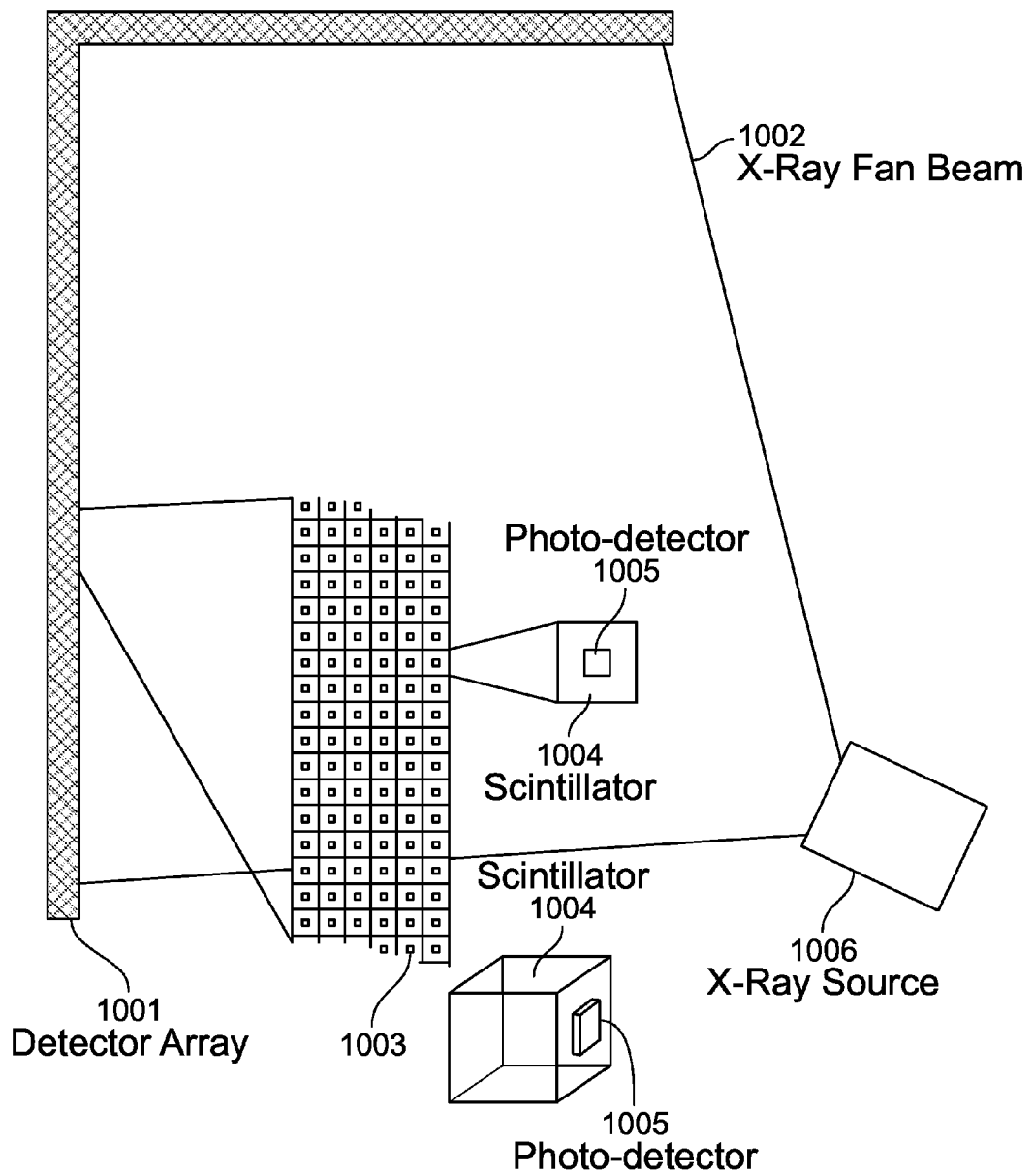
FIG. 10 is an illustration of a detector array consisting of a set of detector elements arranged in columns and rows both horizontally and vertically, where a particular set of detector elements can be chosen at every angle, which, as a set, is aligned to aim at the source.

FIG. 10 illustrates an exemplary layout, where each "detector" is individually aligned to aim at the source. The "detector" described in this embodiment comprises multiple smaller detector segments. Referring to FIG. 10, instead of a one-dimensional single array composed of modules with multiple long, thin detectors, the present specification uses a two-dimensional array 1001 of small detector segments 1003 (segmented detector array), with both dimensions in the plane of the fan beam 1002. The detector array 1001 comprises small detector elements 1003 and each detector element comprises a scintillator 1004. Thus, at each location in the detector array, a set of detector elements 1003 can be found such that the set as a whole is aligned towards the X-ray source 1006. Each detector element 1003 is also outfitted with a small photo-detector 1005, to read out the scintillator crystal.

As mentioned earlier, traditional detector arrays for high-energy X-ray systems have fairly long detectors in order to be able to detect the X-rays with good efficiency. For such scintillators, a length of 20-30 mm is usually sufficient. In the present specification, in an embodiment, the long crystal is replaced with a "virtual detector" consisting of about 6 crystals of size 5×5×5 mm. The six small crystals in this example have the same total volume as one long crystal, and therefore overall X-ray detection efficiency will be the same, if the signals from the separate crystal segments are added together. Total scintillator cost would also be very similar, and the yield of small crystals is usually higher than that of larger crystals.

Figure 11:
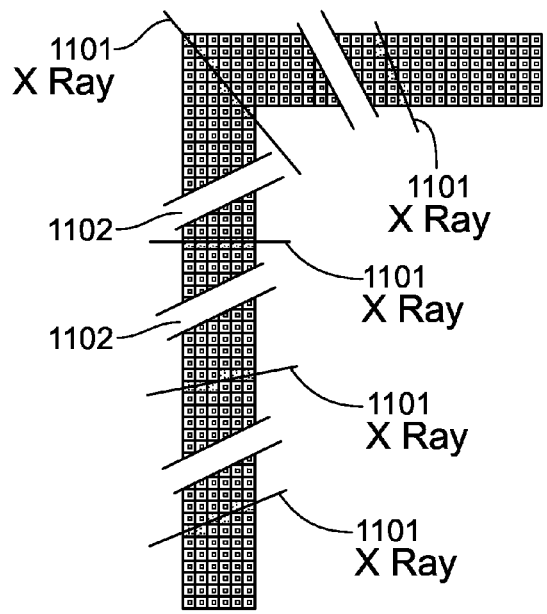
FIG. 11 is a diagram depicting X-rays emanating from the source intersecting with the detector array shown in FIG. 10 at different angles.

FIG. 11 illustrates how X-rays 1101 coming from the source intersect the array at different angles 1102. It should be noted in the figure that the darker shaded sets of detector elements show exemplary sets of detector elements that aim back at the source at various angles. For any given angle of incidence, a "virtual detector" consisting of a certain combination of detector segments is representative of the signal in that direction. Thus, different combinations of small detector segments form the virtual detector for each different point of incidence and X-ray direction. Such an array can be constructed in the form of modules that are mounted in the inverted L-shaped housing while leaving no gaps, thereby eliminating the horizontal line artifact. In addition, this depth segmentation reduces the X-ray count rate in any given detector segment compared to the original case, making it easier to implement spectroscopic algorithms. Moreover, the deeper detector segments see a filtered signal, where the filter is provided by the upstream detector segments. This improves the results of spectroscopic algorithms.

In an embodiment, different scintillator materials are used for the different segments, so as to have different average Z. Dual-detector operation can simply be implemented by combining the signals from some front detector segments and from some rear detector segments. Further, it is in principle possible to exploit the segmentation to improve the spatial resolution.

Figure 12:
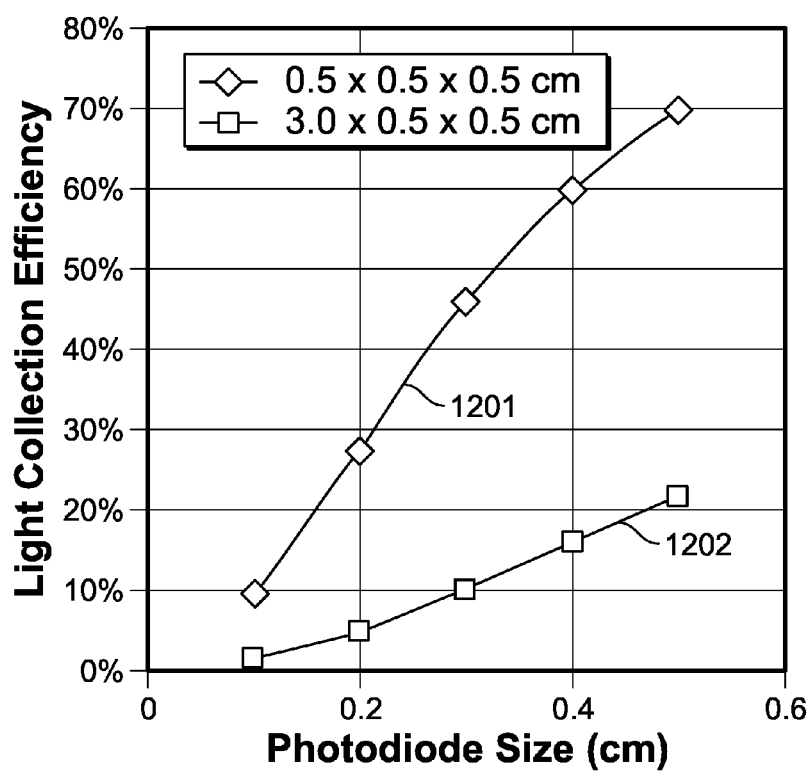
FIG. 12 is a graph comparing light collection efficiency for small detectors versus large detectors, and the dependency on photodiode size.

FIG. 12 shows a graphical comparison of light collection efficiency for small detectors 1201 with that of large detectors 1202, as a function of photodiode size. The detector crystals are assumed to be painted with white paint. It is clear from the figure that the light collection efficiency for a long thin detector with a paint reflector is rather low, and in addition it is non-uniform over the length of the crystal. On the other hand, smaller crystals have much improved light yield, and much better light collection uniformity, even with a much smaller photodiode.

Figure 22:
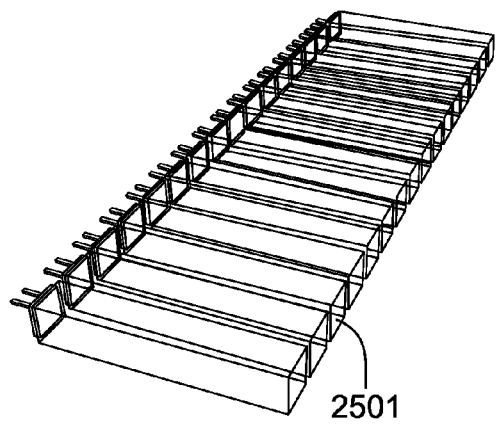
FIG. 22 illustrates an exemplary implementation of a detector array comprising a number of long, thin detectors.

In another embodiment, a detector array comprises a number of long thin detectors. It should be noted herein that the description below applies to a detector array comprised of long, thin detectors due to spatial considerations. Specifically, the previously described implementation (segmented detector array) needs room for the side-mounted photo-detector and electronic circuit board. In addition, for a segmented detector array, one would need additional room on at least one side of the collimator. A possible implementation is illustrated in FIG. 22, and comprises an array of 16 scintillator crystals 2301 with photo-detectors. In an embodiment, the scintillator crystals can be manufactured from materials such as LYSO or cadmium tungstate or lead tungstate or any other kind of scintillating materials.

In some embodiments, the photodetectors may be photodiodes, biased photodiodes for implementation of noise spectroscopy, avalanche photodiodes, or silicon photomultipliers (also known as multi-pixel photon counters) for implementation of transmission Z-spectroscopy. In some embodiments of the present specification, scintillator crystals and their associated photo-detectors can be replaced by solid state detectors made from a semiconductor material, such as, but not limited to, Cadmium-Zinc-Telluride (CZT). In another embodiment, the scintillator crystals can be replaced by a cerenkov detector.

Figure 23:
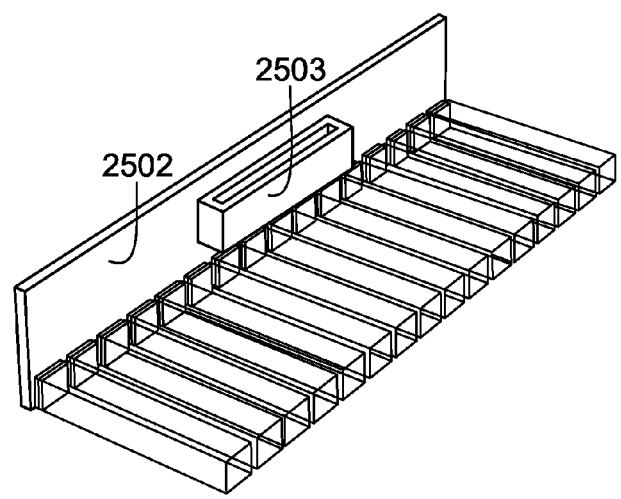
FIG. 23 illustrates an exemplary configuration and location of a detector interface board (DIB)

Since, in an embodiment, the angle, and therefore the spacing, of the vertically stacked detectors changes every 64 detectors, in an embodiment, the present specification uses a dual-circuit-board approach to the read-out, shown in FIG. 23. A small, elongated board 2402, called the detector interface board (DIB) serves as a way to gather the signals from all the photo-detectors onto an edge-connector 2403. In an embodiment, there are 18 versions of this detector interface board (DIB), each occurring 4 times per system, and each with slightly different spacing of the photo-detector connections.

Figure 24:
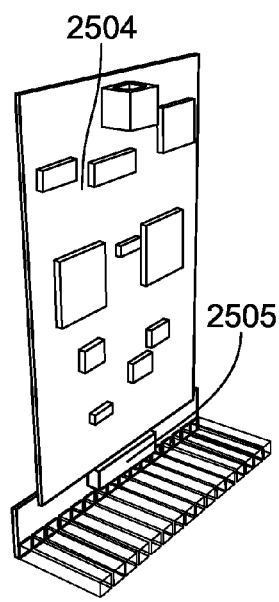
FIG. 24 shows a data acquisition board interfacing directly with an edge connector of a DIB, according to an embodiment of the present specification.

In an embodiment shown in FIG. 24, a second board 2504, which is the data acquisition board, plugs directly into the edge connector 2505. In an embodiment, the data acquisition board (DAB) serves 16 channels of detectors, and is identical across the entire detector array.

In an embodiment, the scintillator crystals are polished on all sides, or have a ground surface. They need a reflector, but the current practice of painting the crystals cannot be used where noise spectroscopy or transmission Z-spectroscopy techniques are to be implemented, since in order to ensure uniform light collection in these methodologies, there has to be an air gap between the crystal and the reflector. An additional consideration is that the reflector material should be fairly opaque, in order to avoid cross talk between neighboring detectors. Therefore, in an embodiment, an extrudate is made from opaque or relatively opaque, highly reflective material.

Figure 25A:
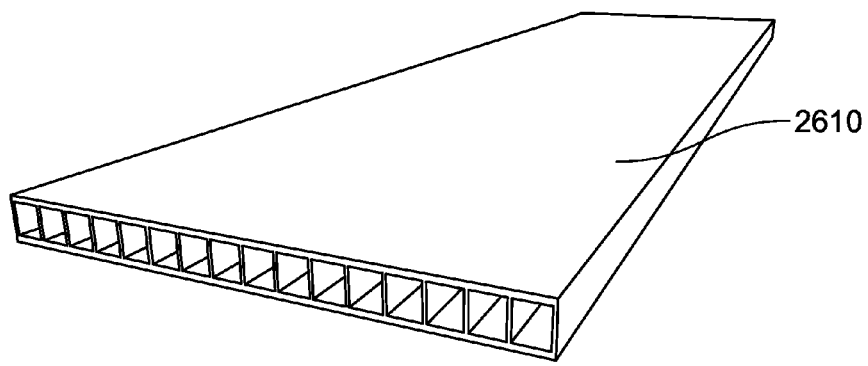
FIG. 25a illustrates an exemplary extrudate that can be used to form a housing for detectors in a detector array, in an embodiment of the present specification.
Figure 25B:
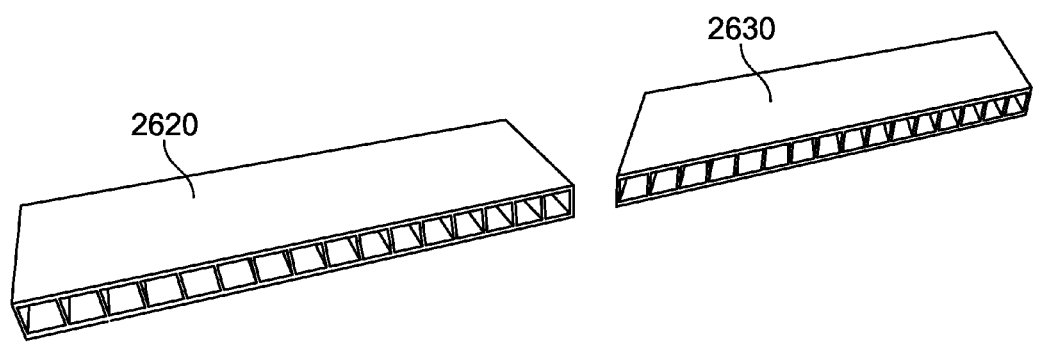
FIG. 25b shows the extrudate of FIG. 25a cut at various angles to form detector housings, according to an embodiment.

An extrudate is shown as 2610 in FIG. 25a. In an embodiment, the extrudate has room for 16 detectors, with 1 mm of reflecting material between detectors, and 0.5 mm at the edges, so that two neighboring detectors in two adjoining modules also have 1 mm of reflecting material between them. Further, individual reflector assemblies can then be made for each detector module by cutting through the extrusion at the appropriate angle. For example, as shown in FIG. 25b, the extrudate from FIG. 25a can be cut at various angles to make detector housings 2620 and 2630.

In another embodiment, a custom part is machined from opaque or relatively opaque, highly reflective material such as Labsphere Spectralon. Thus, in cases where the reflector material cannot be subject to an extrusion process, detector housings 2620 and 2630 can be machined, and can consist of one machined part, or from more than one machined part and glued together, using common machining and adhesive techniques.

Figure 26A:
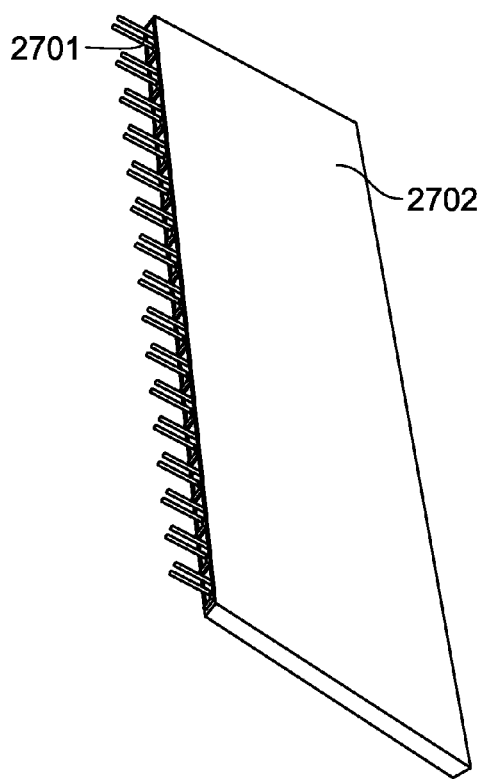
FIG. 26a illustrates a detector assembly with a reflector and a DIB, according to an embodiment of the present specification.
Figure 26B:
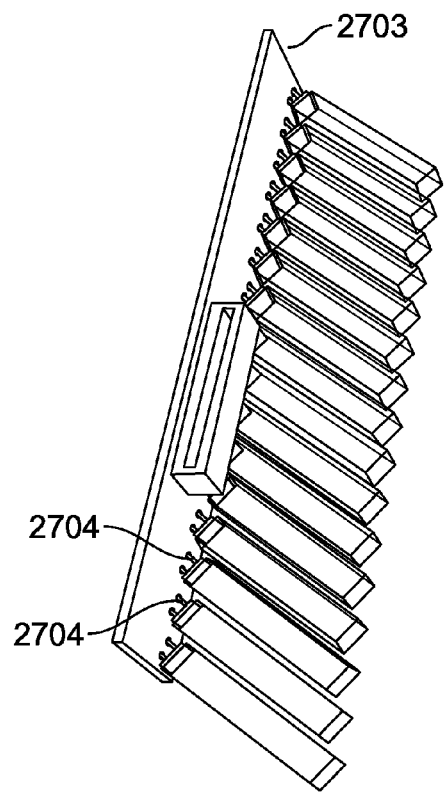
FIG. 26b illustrates a detector assembly with a reflector and a DIB, according to an embodiment of the present specification.
Figure 26C:
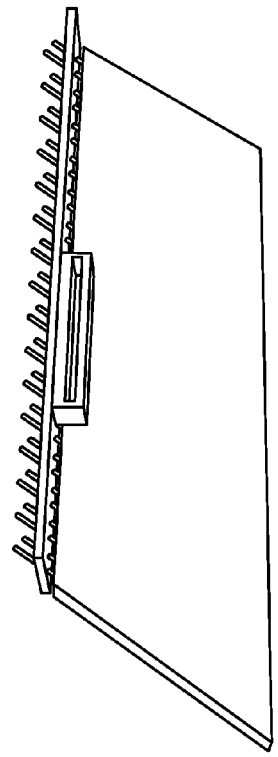
FIG. 26c illustrates a detector assembly with a reflector and a DIB, according to an embodiment of the present specification.

FIGS. 26a, 26b and 26c illustrate a detector assembly with a reflector and a detector interface board (DIB). The LYSO detectors 2701 are inserted into the reflector 2702 made for the particular detector module, which serves as a detector housing. In an embodiment, the holes on either end are plugged with some moldable white reflector material, such as plaster of Paris, or white putty. In another embodiment, the plug is made from the same reflector material that is used for the rest of the detector housing, either as an integral part of the detector housing, or as a separate part that slides into the opening. In an embodiment, one plug has holes in it to enable the leads for the photodetector to pass through. In another embodiment, a combination of materials is used. In an embodiment, the leads 2704 are soldered into a DIB 2703 of the appropriate size, as shown in FIG. 26b. The final detector module is shown in FIG. 26c.

Figure 27A:
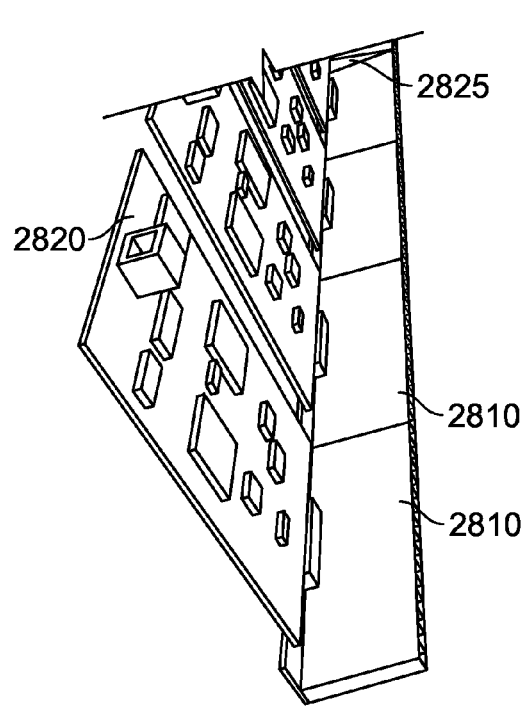
FIG. 27a shows a detector array assembly, according to an embodiment of the present specification.

FIG. 27a shows the detector array assembly 2810, comprising a data acquisition board (DAB) 2820 for every 16 channels of detectors. In an embodiment, the angle with which the detector assemblies are constructed is not kept uniform along the entire length of detector array to ensure that the detectors are properly aligned in the direction of X-ray source. In FIG. 27a, in an embodiment, the angle 2825 is changed after the fourth DAB.

Figure 13:
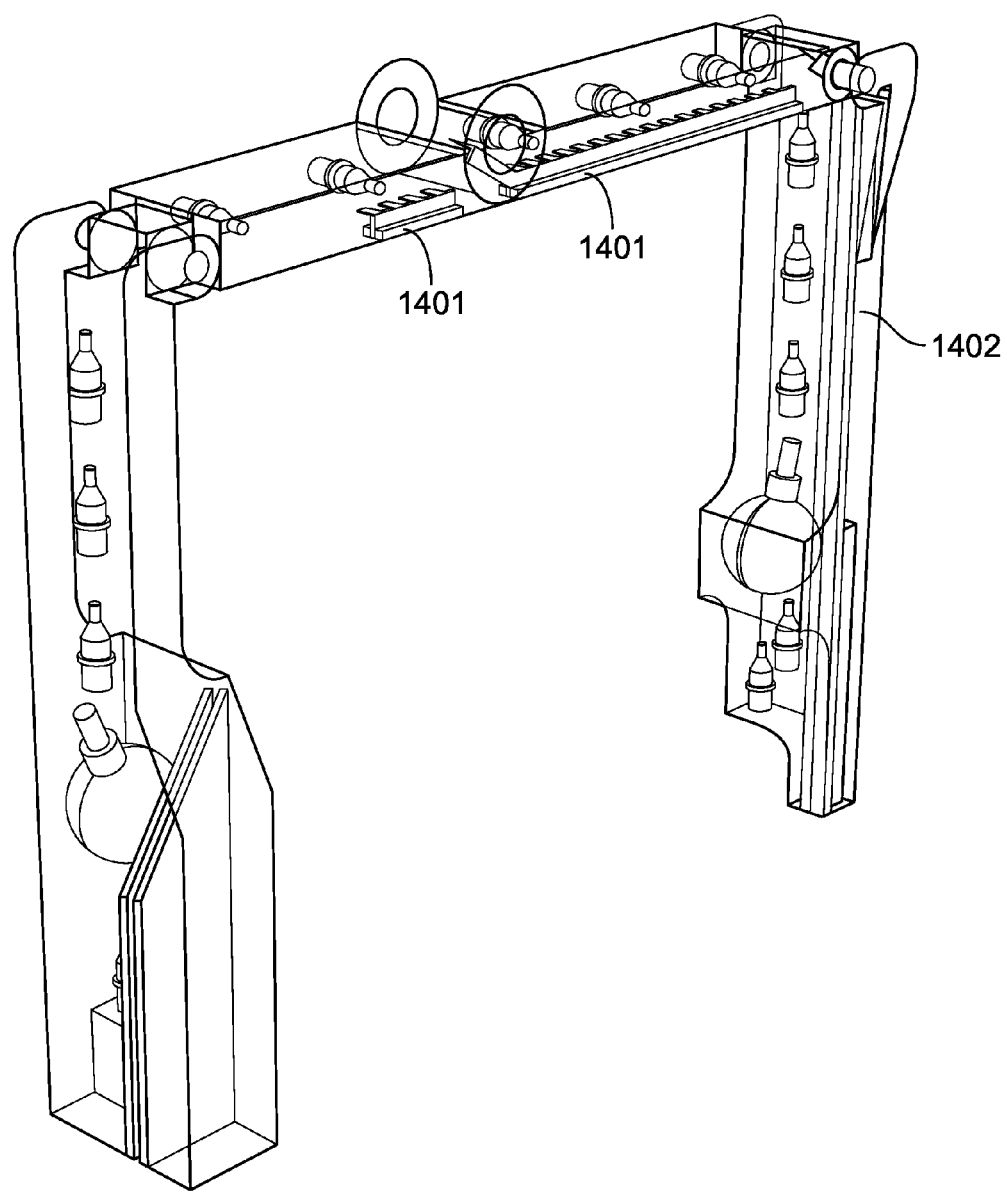
FIG. 13 shows detector-collimator assemblies integrated within a boom structure, according to an embodiment of the present specification.
Figure 27B:
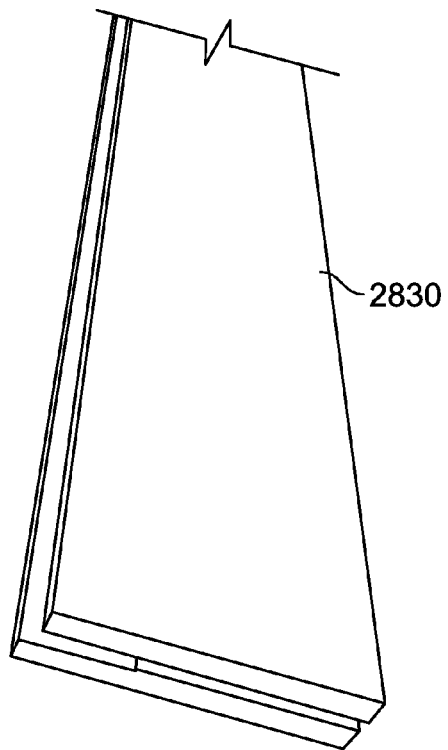
FIG. 27b shows a collimator, according to an embodiment of the present specification.
Figure 27C:
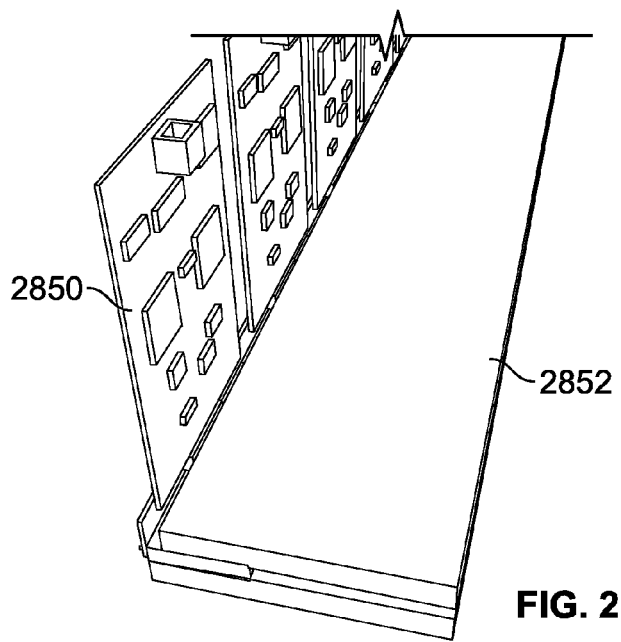
FIG. 27c is an illustration of detector assemblies inserted into a steel collimator, according to an embodiment of the present specification.

In an embodiment, the detector module is inserted into a collimator such as the collimator 2830 shown in FIG. 27b. In an embodiment, the collimator is made of steel. FIG. 27c illustrates a detector assembly inserted into a collimator. Referring to FIG. 27c, a detector assembly 2850 is inserted into a steel collimator 2852. Steel is chosen because it is less dense than lead and is structurally superior. Therefore, the collimator can be made a part of the structural form of the detector boom, thereby fulfilling two roles at once. This is shown in FIG. 13, wherein the detector-collimator assemblies 1401 are integrated within the boom 1402. While lead is preferred because it has better attenuation, only a fairly shallow collimator made of lead can be allowed due to weight considerations. A shallow collimator, however, has a larger opening angle and will allow more scattered radiation to reach the detectors. To make up for the lack of density, a steel collimator can be made with the same attenuation but with more depth. In an embodiment, the steel collimator is about 4 inches deep, with a gap of exactly the width of the detectors, which is 5 mm in the present example. In order to keep this spacing constant throughout the array and for stability, in other embodiment the collimator is welded to a square tube of appropriate size and strength. In another embodiment, a thin steel cover on the end of the collimator opposite the detectors is used.

Figure 28:
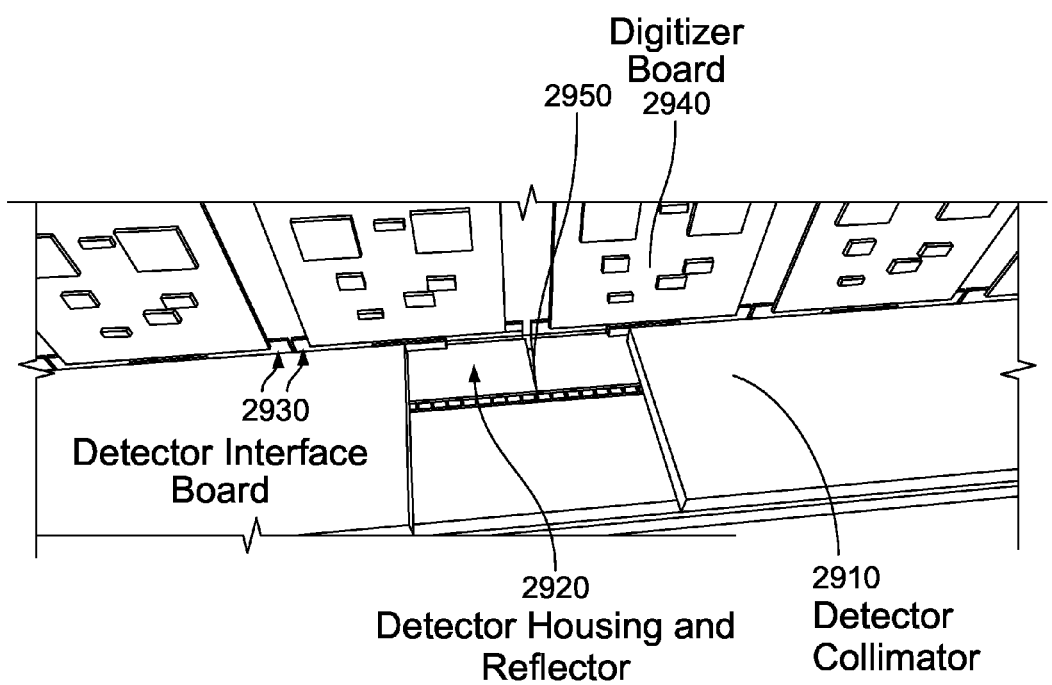
FIG. 28 shows a cross-sectional view of the detector assemblies inserted into the collimator shown in FIG. 27b.

FIG. 28 shows a cross sectional view of the detector assemblies inserted into the steel collimator 2910, with a part of the collimator not drawn to enable seeing the detector housings inside. As can be seen from the figure, the collimator 2910 is placed over the detector housing and reflector 2920, which couples the array to the detector interface boards (DIB) 2930 and the digitizer boards 2940. In an embodiment, the angle with which the detector assemblies are constructed is not kept uniform along the entire length of detector array to ensure that the detectors are properly aligned in the direction of X-ray source. In FIG. 28, 2950 represents a small change in the angle with which the detector housings are constructed. In an embodiment, the construction angle is changed after every four detector housings. However, other configurations are employed in other embodiments.

Improved Material Discrimination

Material discrimination in the system of present specification is performed using a combination of two spectroscopic measurement techniques of the transmitted X-rays to improve the ability to determine the atomic number of the materials inside a container. The technologies considered are known as Z-determination by statistical count-rate analysis (Z-SCAN) and transmission Z-Spectroscopy (Z-SPEC). In an embodiment, conventional methods, such as dual-energy X-ray source technology, are used instead, or in addition.

Figure 14:
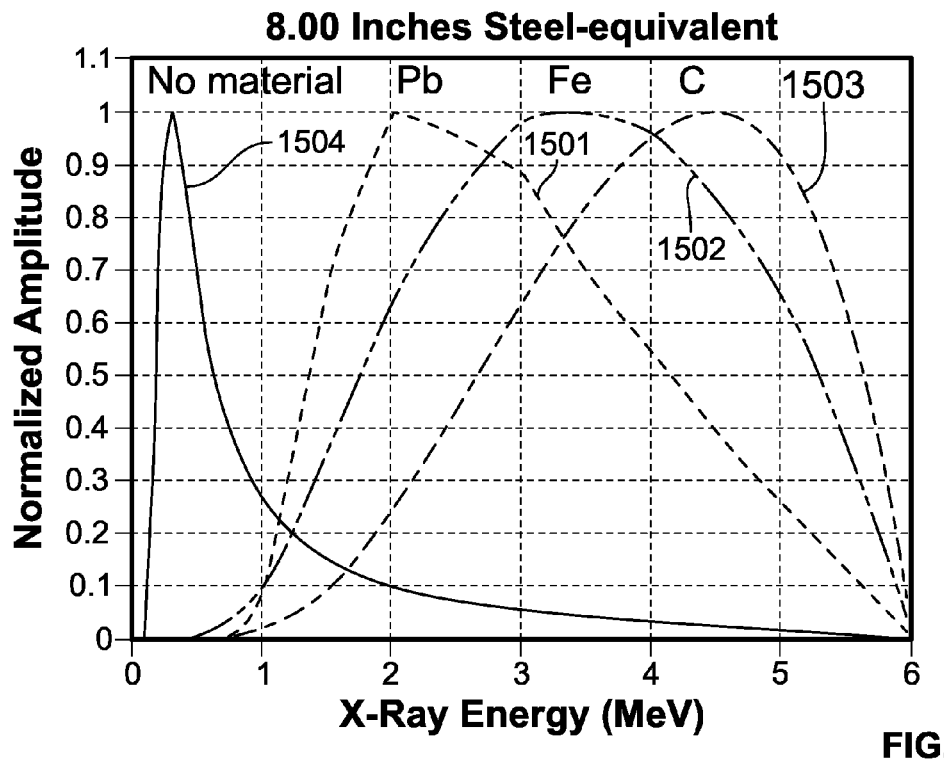
FIG. 14 is a graph showing energy spectra for various materials.

Z-SPEC is a technique that determines individual X-ray energies arriving at the detector elements by producing a spectrum for each detector element. It is known in the art that the spectrum of X-rays changes when going through equivalent amounts of materials of different atomic number Z. FIG. 14 shows the spectra behind the equivalent of 8 inches of steel for lead 1501, steel 1502, and carbon 1503, compared to the original bremsstrahlung spectrum 1504. It is apparent from FIG. 14, that the spectrum behind high-Z material has lower average energy, and is skewed towards lower energy. On the other hand, the spectrum behind low-Z material has higher average energy and is skewed towards higher energy. Z-SPEC measures the entire X-ray spectrum, and determines the Z of the material based on the shape of the spectrum, to determine the Z of the cargo material traversed. The Z-SPEC technique works best for a narrow (~$10^2$) attenuation dynamic range, and can be improved by using a high-duty-factor X-ray source.

Further details of implementation of the Z-SPEC technique are available in U.S. Pat. No. 8,750,454, entitled "High Energy Spectroscopy-Based Inspection Systems and Methods to Determine the Atomic Number of Materials", which is incorporated herein by reference in its entirety.

Z-SCAN is a statistical technique which determines a feature called the Noise Figure Y of the energy spectrum of the X-rays arriving at the detector elements, through the use of fast detector materials and photo-detectors and wave-form digitization and analysis. This noise figure is a direct measure of the Z of the cargo material traversed.

In the Z-SCAN technique, the noise figure Y is defined as:

$Y=\alpha<E^2>/<E>$ where $<E>$ is the mean X-ray energy and $<E^2>$ is the mean of the square of the X-ray energies and $\alpha$ is a calibration constant. Since the signal in a given detector is:

$S=\alpha<E>N$ and the mathematical variance of S is:

$\delta S^2=\alpha^2<E^2>N$, wherein N is the number of X-rays in a given signal S, $\delta S$ is the standard deviation of statistical uncertainty in the measurement of signal S and $\delta S^2$ is the statistical variance.

The noise figure can thus also be written as:

$Y=\delta S^2/S$, and can thus be determined from the data: the signal S is determined in the usual way, and the variance of S by measuring S many times and using the statistical relation for the standard deviation:

$\delta S^2=\Sigma(S-<S>)^2/(n-1)$ where $<S>$ is the average value of S and n is the number of measurements of S.

This is best done by measuring multiple samples of the signal for each pixel in the image, and then by combining multiple pixels belonging to the same object (found through a segmentation algorithm applied to the image).

Figure 15:
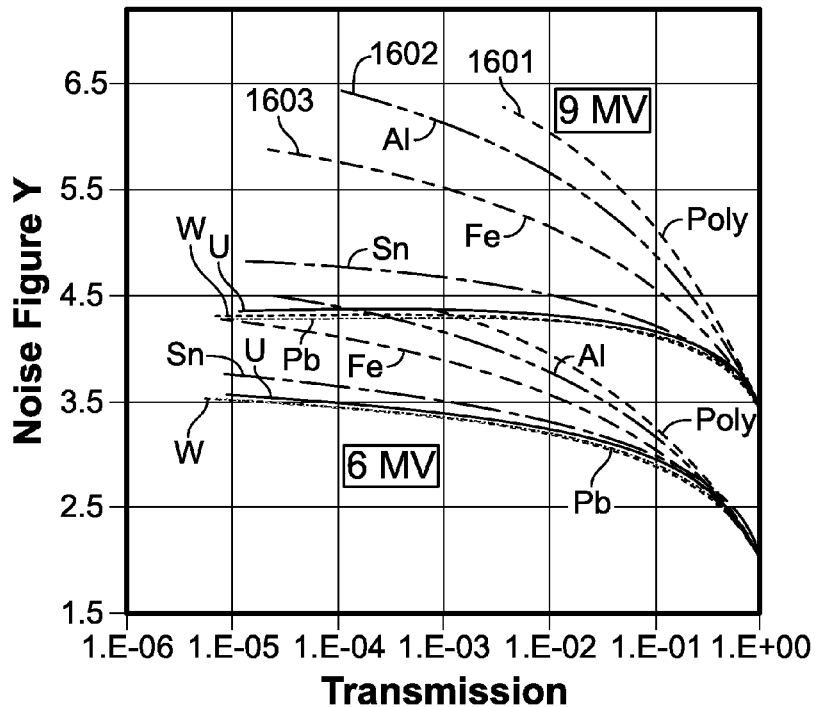
FIG. 15 is a graph showing a noise figure for various materials calculated according to a noise spectroscopy-based technique.

The calculated noise figure is shown vs. transmission in FIG. 15 for a number of materials, such as Poly 1601, Al 1602, Fe 1603, etc. at two different X-ray source energies of 9 MV and 6 MV.

Thus, Z-SCAN determines statistically the Z of the material. Further details of implementation of the Z-SCAN technique are available in U.S. Pat. No. 8,724,774, entitled "Method and System for Extracting Spectroscopic Information from Images and Waveforms", which is incorporated herein by reference in its entirety.

X-ray spectroscopy (Z-SPEC) is a difficult process because the energy of individual X-rays needs to be measured in a very high count rate environment, since typical linear accelerator-based X-ray sources emit X-rays in large but short bursts. In an embodiment, the present specification describes a linear accelerator source with an increased duty factor to spread out the arrival of X rays at the detector array over time and hence provide improved material discrimination. In an embodiment, duty factor is enhanced to be in the range of 0.4-1.0% compared to 0.04-0.1% generally used in the commercially available X-ray systems. In an embodiment, the higher duty factor is achieved by moving from a typical 300 pulses per second to 1000 pulses per second and/or increasing the pulse duration from a typical 4 microseconds to 10 microseconds. While conventional X-ray sources use a magnetron, a high-duty-factor linac X-ray source requires the use of a klystron. It is known in the art that a klystron-based source uses more power. In order to limit klystron power consumption to a manageable amount, the linac beam centerline would need to be somewhat longer than those in current use, for a given electron beam energy. Since the X-ray beam spot has to be fairly low above the ground to enable vehicle scanning, and the X-ray fan beam ideally aims at an upward angle, it is not convenient to use a configuration where the electron beam is aimed straight at a target; as in that case the electron-gun end of the linac would be below ground level. Therefore, in an embodiment, the present specification employs a configuration where the X-ray source is mounted more or less vertically, and has a 245 degree turnaround magnet, aiming the X-ray beam at 25 degrees up towards the cargo.

Figure 16:
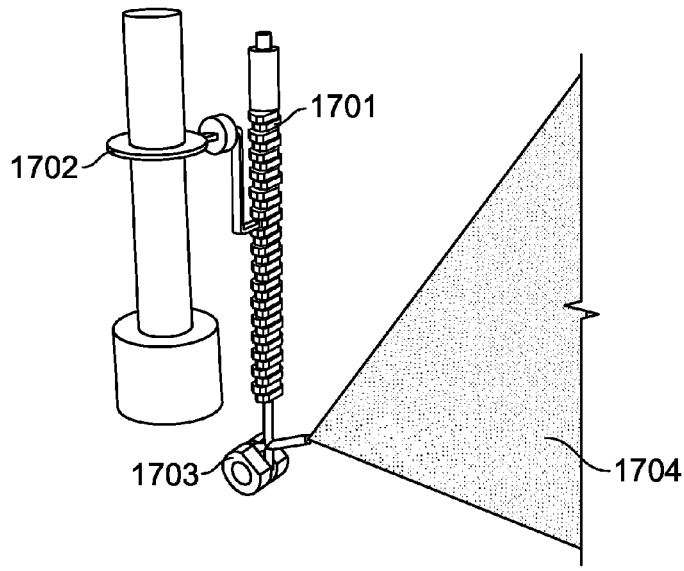
FIG. 16 is a depiction of an exemplary high-duty factor, vertically mounted X-ray source.

This configuration is shown in more detail in FIG. 16. Referring to FIG. 16, linac 1701 is mounted vertically and is associated with klystron 1702. The linac is equipped with the 245 degree magnet 1703, which ensures that the radiation beam 1704 is aimed at the required angle. This configuration has the added advantage that the linac and its enclosure can be part of a single assembly together with the detector array, substantially reducing opportunities for the source and detector array to get out of alignment. One of ordinary skill in the art could appreciate that the above configuration of the X-ray source and the applied magnetic field is an exemplary configuration and there could be multiple other configurations to generate the resultant electron beam in a desired direction. In an embodiment, the present specification employs a configuration where the X-ray source is mounted at −25 degree angle and has a 270 degree magnet to generate an electron beam as illustrated in FIG. 16. In another embodiment, the present specification employs a configuration where the X-ray source is mounted vertically and has a 270 degree magnet and an additional magnetic element to bend the electron beam by another 25 degrees to generate the same resultant electron beam as illustrated in FIG. 16.

In an embodiment, if the instantaneous count rate of arriving signals is still too high, Z-SCAN is used in combination with Z-SPEC to provide improved material discrimination. In an embodiment, for cost and simplicity reasons, Z-SPEC, Z SCAN as well as radiographic imaging are combined into a single detector array.

In an embodiment, to provide high spatial resolution, fast and high-density detectors are used for Z-SPEC. In an embodiment, lead tungstate ($PbWO_4$) is used for manufacturing high density scintillation detectors. In an embodiment, since lead tungsten has low light output, fast photo detectors with some gain such as avalanche photodiodes or silicon photomultipliers are used in conjunction to overcome electronics noise. In another embodiment, high speed preamplifiers and digitizers are also used to ensure that the Z-SPEC process is conducted efficiently and signals don't pile up.

Material Categorization and Alarm Verification

In an embodiment, the system described in the present specification employs two levels of scanning to detect threats. In an embodiment, the present specification provides threat detection algorithm assist tools, and a software framework together with a user interface to implement the same. At the first level, in an embodiment, the X-ray image is displayed on an interface screen at the end of the primary scan. In an embodiment, suspicious locations are identified by ATR (Automatic Threat Recognition) algorithms during the X-ray scan. The operator can further use the tools provided in the software package to analyze the image and determine if the cargo is benign or suspicious. If the operator determines that certain suspect areas should be targeted for secondary screening, those areas can be tagged or marked using the image annotation tools provided in the software package. After all such areas have been marked, the inspector confirms the selections by clicking a scan decision button to prepare the inspection system for a secondary scan, if needed. At the end of the secondary scan, the X-ray image, along with the ATR results from both screenings, are displayed on the user interface. At the locations targeted for secondary screening, the results are highlighted to indicate them as benign or suspicious. The operator then makes a final decision on the cargo to either clear the container, or detain it for manual inspection.

In an embodiment, the present specification uses X-ray imaging for primary scanning and neutron-based interrogation to perform secondary screening. This allows the system to effectively determine the presence of bulk explosives, narcotics, chemical weapons and high-Z materials which might shield radioactive materials. The neutron subsystem is particularly useful for the detection of narcotics, specifically cocaine or heroin hydrochloride.

Figure 17:
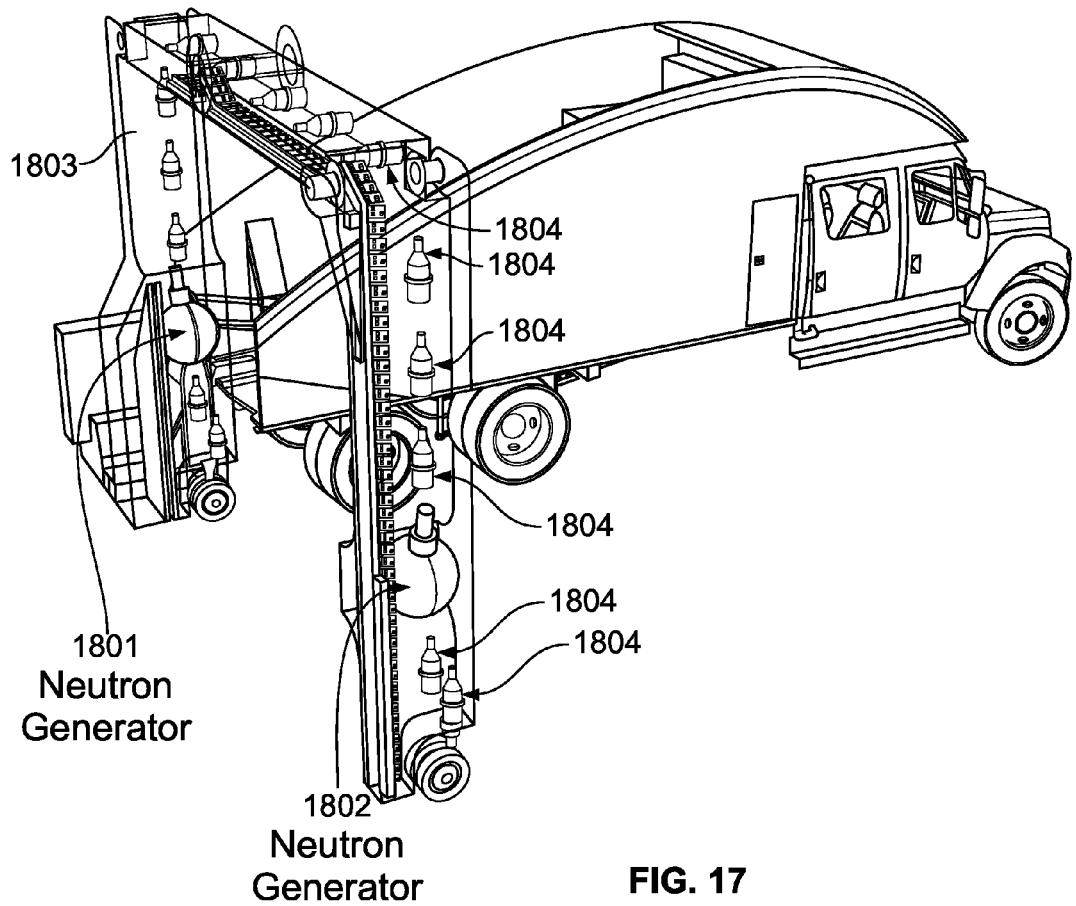
FIG. 17 illustrates an exemplary neutron subsystem, according to an embodiment of the present specification.

FIG. 17 illustrates the neutron subsystem, according to an embodiment of the present specification. Referring to FIG. 17, in an embodiment, the neutron system comprises two 14 MeV neutron generators 1801 and 1802, each located on a vertical side of the boom 1803. The neutron generators are equipped with moderator/fan beam collimators (not shown). The system further comprises 15 NaI(Tl) detectors 1804 to provide the gamma-ray detection array, all located inside the boom.

One of ordinary skill in the art would appreciate that incorporation of the neutron system in the boom requires widening and strengthening the boom in order to accommodate the additional weight of the neutron system. This has the added benefit of making the boom less susceptible to boom sway, thereby reducing the "curtain artifact", and allowing the X-ray beam to be collimated more for reduced X-ray exclusion zone. Further, placing a neutron generator on each side of the boom allows detection of threats on both sides of the container with the operational efficiency of a single sided scan.

In an alternate embodiment, the neutron generator is placed on the horizontal boom on the top.

Figure 18A:
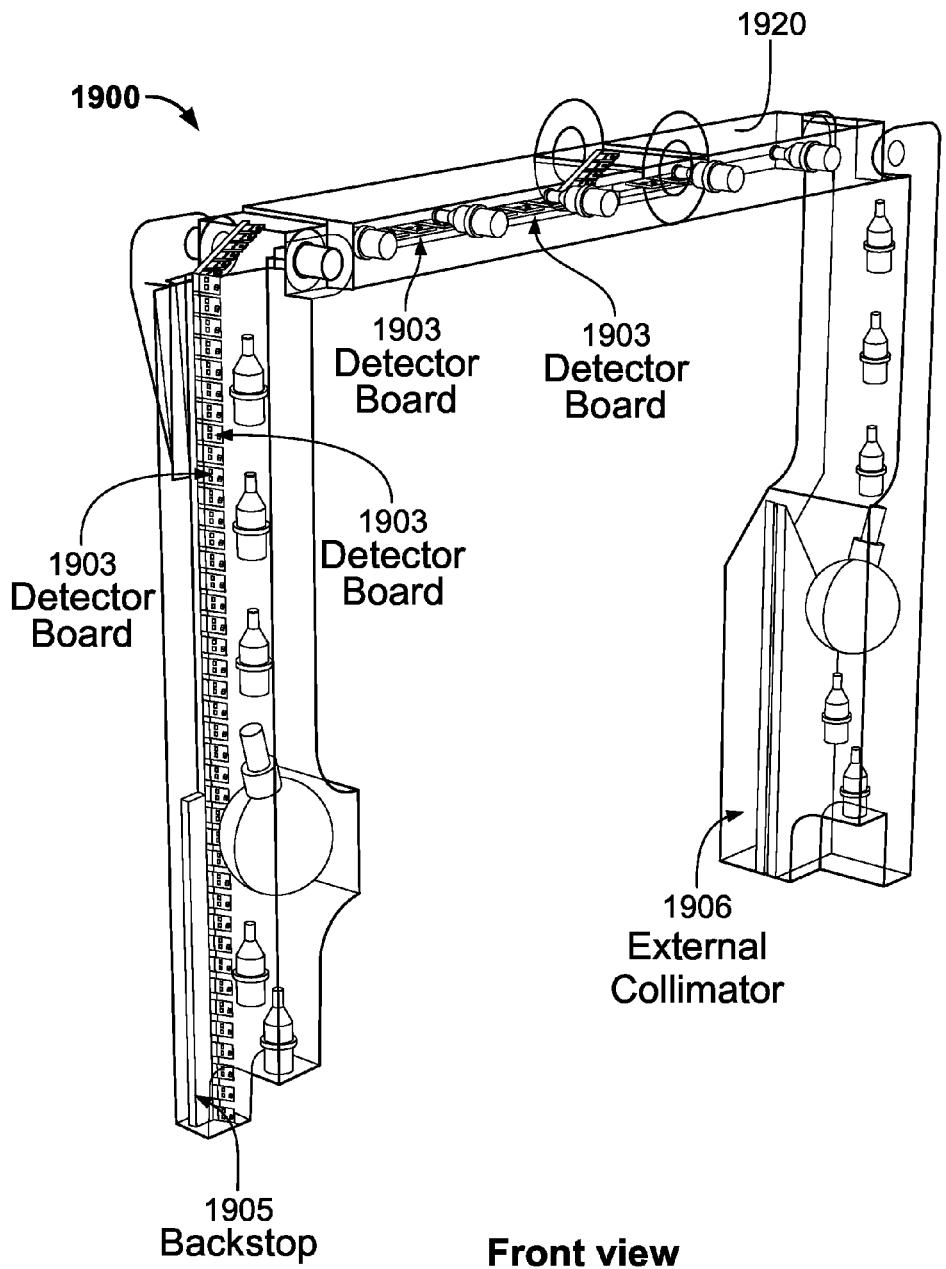
FIG. 18a illustrates a front view of an X-ray scanning system co-located with a neutron scanning system within a boom structure, according to an embodiment of the present specification.
Figure 18B:
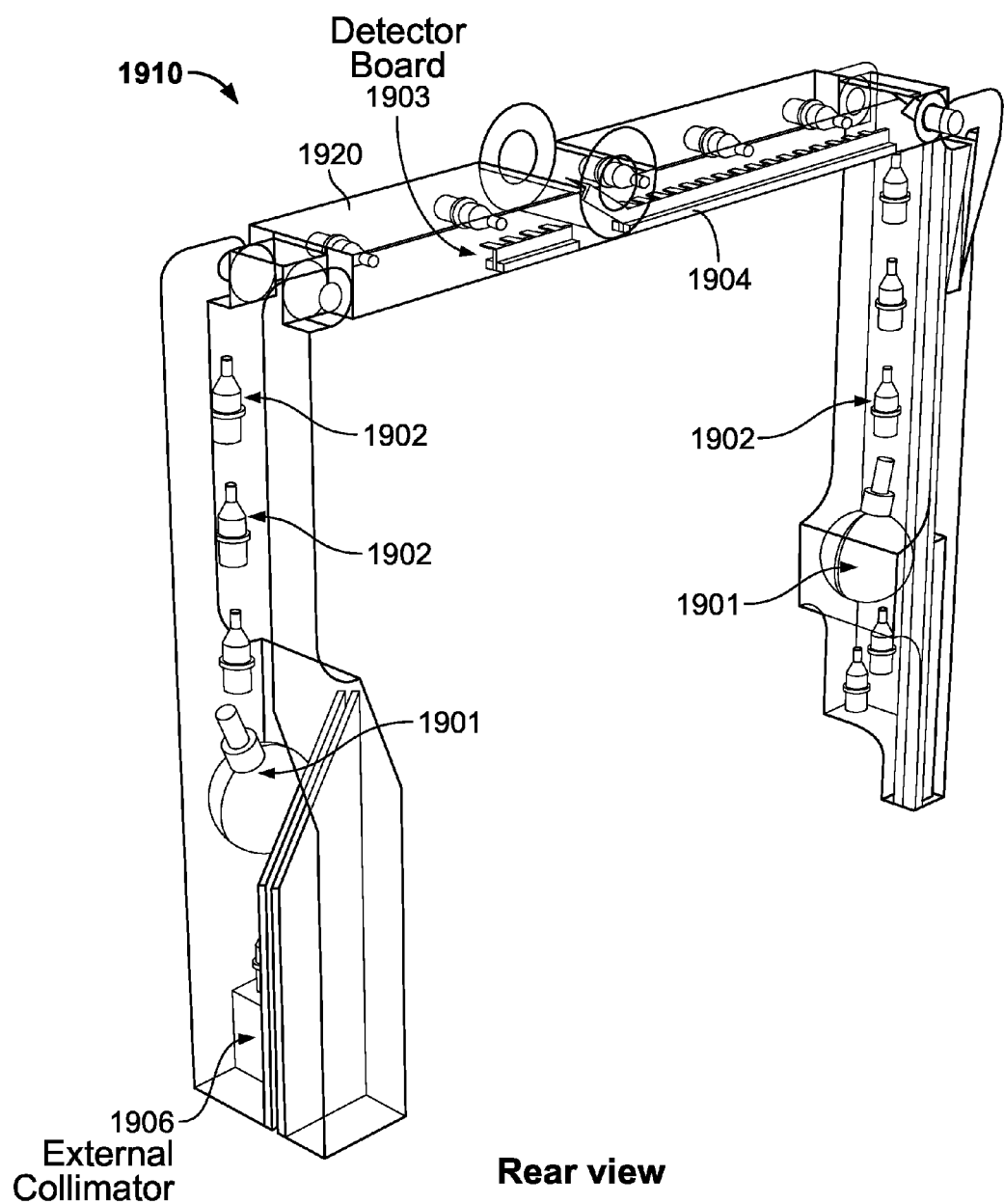
FIG. 18b illustrates a rear view of an X-ray scanning system co-located with a neutron scanning system within a boom structure, according to an embodiment of the present specification.

FIGS. 18a and 18b illustrate an X-ray scanning system along with the neutron scanning system in a front view 1900 as well as rear view 1910 of the boom 1920, respectively. In one embodiment, the X-ray scanning system is the primary system. The neutron subsystem comprises the neutron sources 1901 and the NaI detectors 1902 to detect material-specific gamma rays that may be emitted from materials in the cargo irradiated by the neutrons. The X-ray sub-system comprises the X-ray source (not shown) and detector array boards 1903. Each detector assembly board is also inserted into a steel collimator 1904, as described earlier with reference to FIG. 13. The system also comprises a lead back stop 1905 located behind the detector arrays on the vertical side of the boom, and an external collimator 1906 located on the opposite side. The external collimator 1906 is built into the proximal vertical boom, and has a wedge-shaped profile, i.e. it is wider on the source side to allow all X rays to enter the collimator, and narrower on the detector side in order to allow only collimated X rays to exit.

Figure 19:
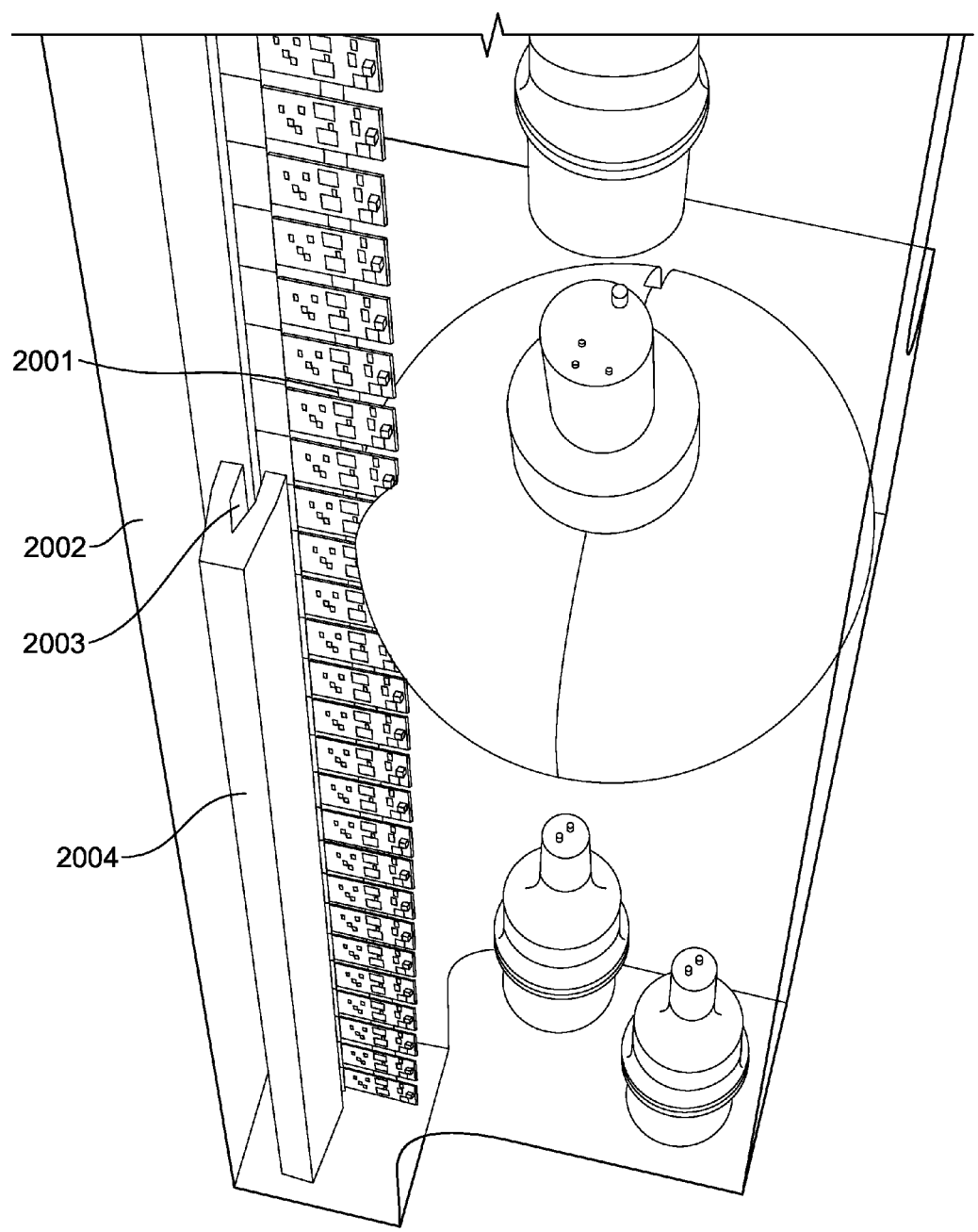
FIG. 19 is a detailed view of the detector arrays located on a vertical portion of the boom.

FIG. 19 shows further details of the detector arrays 2001 in the vertical side of the boom 2002. A V-shaped channel 2003 is provided in the lead back stop 2004, which prevents X-rays from scattering sideways.

In an embodiment, the neutron system uses a wide (in the vertical plane) fan beam. This has the advantage that the threat does not need to be localized vertically, and the system does not need to have the same view of the cargo as the X-ray system, as would be required using a collimated neutron source.

In an embodiment of the present specification the shielding design of the neutron generator is developed after a complex optimization between overall weight, signal strength and cost. The function of the shielding is three-fold: first, the shielding moderates the fast neutrons and produces thermal neutrons for inspection; second, it acts as a radiation shield where it attenuates the fast neutrons and keeps them from interacting within the detectors; and thirdly, it also minimizes radiation dose to the operators and the general public.

In an embodiment, each neutron generator produces 14.1 MeV neutrons that are isotropically emitted from the target location within the generator. All shielding designs considered are of a layered design composed of different materials. The layered geometry allows materials to be chosen for their specific neutron-energy-dependent attenuation, in light of the fact that the average neutron energy falls off as the neutrons penetrate the shield.

The general strategy for the neutron shielding design is to use materials that "reflect" neutrons, in order to redirect neutrons that would otherwise exit and cause background. Some materials also tend to moderate the neutron energy through the (n, 2n) reaction by ejecting a second neutron when hit by an energetic neutron. Common materials with a low (n, 2n) reaction threshold are tungsten and lead. Another material that moderates neutrons through the (n, 2n) reaction, as well as elastic scattering, is beryllium. Hydrogen-containing materials such as polyethylene ($CH_2$) moderate neutrons from elastic scattering of the neutrons off of hydrogen atom.

Figure 20:
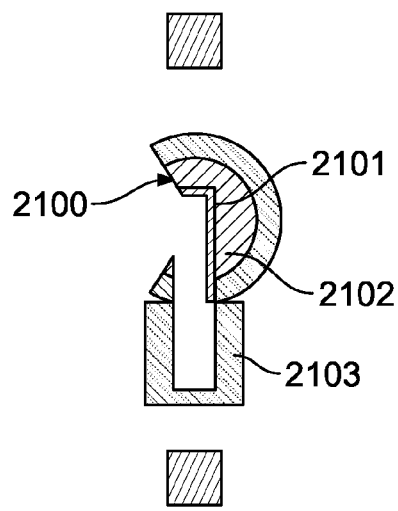
FIG. 20 shows a three-layered neutron moderator design, according to an embodiment of the present specification.

FIG. 20 illustrates a three-layered shielding collimator design. Referring to FIG. 20, the three-layer spherical moderator design comprises layers of lead 2101, beryllium 2102 and polyethylene 2103. The layer of lead 2101 immediately surrounding the neutron generator acts to reflect and attenuate the 14.1 MeV neutrons. The polyethylene sphere 2102 generates a high thermal neutron flux for signal production. It also provides good radiation dose suppression which minimizes the exclusion zone surrounding the system. The beryllium layer 2103 is efficient in reducing the neutron energy through elastic scattering as well as through the (n, 2n) reaction. The advantage of utilizing beryllium over polyethylene is that beryllium does not have a high thermal neutron capture cross-section. This allows the low-energy neutrons to survive the attenuation and traverse into the cargo container.

The present moderator design optimizes the narcotics signal while minimizing the radiation exposure and system weight.

Figure 21:
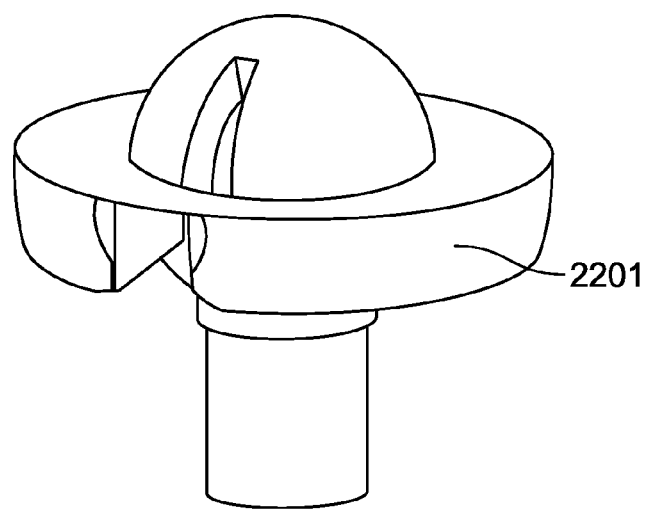
FIG. 21 is an illustration of directional shielding around the neutron moderator shown in FIG. 20.

To further reduce the radiation footprint generated by the 14.1 MeV source neutrons, the present system, in an embodiment, employs direction-specific shielding. In an embodiment, an additional polyethylene shielding is placed around the three-layer moderator, as shown in FIG. 21. Referring to FIG. 21, the shielding 2201 is designed to block those neutrons emitted at specific angles that contribute to the radiation dose at large distance (>25 feet). The specificity of the shielding geometry allows a maximum shielding effect with minimal additional weight.

In an embodiment, directional shielding ring 2201 blocks fast neutrons from 4° above the neutron source horizontal plane to 17.5° below the horizontal plane. In an embodiment, 40% reduction in dose can be achieved in the exclusion zone as well as at the operator location with this directional shield placed around both neutron generator collimators. Clearly, other designs are possible that optimize utility and spatial considerations.

The primary benefit of the secondary inspection is to avoid performing devanning of the vehicle under inspection to check for possible threats. Presumably, in the case where a threat object is considered highly suspicious, devanning would automatically be indicated, but for a wide range of somewhat suspect areas in an X-ray image, a direct scan using neutrons would quickly provide additional information.

The above examples are merely illustrative of the many applications of the system of present invention. Although only a few embodiments of the present invention have been described herein, it should be understood that the present invention might be embodied in many other specific forms without departing from the spirit or scope of the invention. Therefore, the present examples and embodiments are to be considered as illustrative and not restrictive, and the invention may be modified within the scope of the appended claims.

We claim:

1. An X-ray source for scanning an object comprising:
an electron beam generator, wherein said electron beam generator generates an electron beam;
an accelerator for accelerating said electron beam in a first direction; and,
a first set of magnetic elements for transporting said electron beam into a magnetic field created by a second set of magnetic elements, wherein the magnetic field created by said second set of magnetic elements causes said electron beam to strike a target such that the target substantially only generates X-rays focused toward a high density area in the scanned object.

2. The X-ray source of claim 1, wherein said high density section in the scanned object is estimated in a second pulse using image data captured by a detector array in a first pulse and wherein the direction of the electron beam is optimized by said X-ray source during said second pulse to focus X-rays towards said high density area in the scanned object based on said image data in said first pulse.

3. The X-ray source of claim 2, wherein the intensity of the electron beam is optimized in each pulse to ensure that targeted areas in the scanned object are irradiated with an optimal dose of X-rays.

4. The X-ray source of claim 1, wherein said magnetic field causes said electron beam to strike the target at the same point but at a different angle in each successive pulse such that the angle at which said electron beam strikes the target depends on the position of the high density area in the scanned object.

5. The X-ray source of claim 1, wherein said magnetic field causes said electron beam to strike the target at the same point from different directions in successive pulses.

6. The X-ray source of claim 1, wherein said electron beam comprises single energy radiation.

7. The X-ray source of claim 6, wherein said first set of magnetic elements comprise a pulsed dipole magnet and said second set of magnetic elements comprise a quadrupole magnet.

8. The X-ray source of claim 1, wherein said electron beam comprises dual energy radiation.

9. The X-ray source of claim 8, wherein said first set of magnetic elements comprise a pulsed dipole magnet and said second set of magnetic elements comprise a pulsed quadrupole magnet.

10. The X-ray source of claim 8, wherein said first set of magnetic elements comprise a pulsed dipole magnet and said second set of magnetic elements comprise two quadrupole magnets, wherein each quadrupole magnet is configured to transport at least one of the radiation energies in the dual energy radiation beam.

11. The X-ray source of claim 1, wherein said target is manufactured from a material having low atomic number.

12. The X-ray source of claim 11 wherein said target is manufactured from carbon, graphite or diamond.

13. The X-ray source of claim 1, wherein said target is shaped.

14. The X-ray source of claim 13 wherein said target is of a semi-circular, triangular, or flat shape.

15. The X-ray source of claim 1, further comprising shielding optimized to reduce the system weight.

16. The X-ray source of claim 1, wherein said linear accelerator is mounted in a substantially vertical direction.

17. An inspection system for scanning cargo or vehicles comprising:
an X-ray source for generating an electron beam;
an accelerator for accelerating said electron beam in at least one predefined direction;
a first set of magnetic elements for transporting said electron beam into a magnetic field created by a second set of magnetic elements, wherein the magnetic field created by said second set of magnetic elements causes said electron beam to strike a target such that it substantially only generates X-rays focused toward a specific high density area in the scanned object; and,
an X-ray detector array for detecting the radiation transmitted through the object under inspection.

18. The system of claim 17, wherein said inspection system is mounted on a mobile inspection vehicle.

19. The system of claim 17, wherein said high density area in the scanned object is estimated in a second pulse using image data captured by the detector array in a first pulse and wherein the direction of electron beam is optimized by said X-ray source during said second pulse to focus X-rays towards said high density area in the scanned object based on said image data in said first pulse.

20. The system of claim 17, wherein the intensity of electron beam is optimized for each pulse to ensure that targeted areas in the scanned object are radiated with an optimal dose of X-rays.

21. The system of claim 17, wherein said magnetic field causes said electron beam to strike the target at the same point but at a different angle in each successive pulse such that the angle at which said electron beam strikes the target depends on the position of high density area in the scanned object.

22. The system of claim 17, wherein said magnetic field causes said electron beam to strike the target at different points in successive pulses.

23. The system of claim 17, wherein said electron beam comprises single energy radiation.

24. The system of claim 23, wherein said first set of magnetic elements comprise a pulsed dipole magnet and said second set of magnetic elements comprise a quadrupole magnet.

25. The system of claim 17, wherein said electron beam comprises dual energy radiation.

26. The system of claim 25, wherein said first set of magnetic elements comprise a pulsed dipole magnet and said second set of magnetic elements comprise a pulsed quadrupole magnet.

27. The system of claim 25, wherein said first set of magnetic elements comprise a pulsed dipole magnet and said second set of magnetic elements comprise two quadrupole magnets wherein each quadrupole magnet is configured for transporting at least one of the radiation energies in the dual energy radiation beam.

28. The system of claim 17, wherein said target is manufactured from a material having low atomic number.

29. The system of claim 18 wherein said target is manufactured from carbon, graphite, or diamond.

30. The system of claim 17, wherein said target is shaped.

31. The system of claim 30, wherein said target is of a semi-circular, triangular, or flat shape.

32. The system of claim 17, further comprising a shielding optimized to reduce the system weight.

33. The system of claim 17, wherein said X-ray source is a linear accelerator mounted in a substantially vertical direction.

34. The system of claim 17, wherein said system further conducts transmission Z-spectroscopy to analyze at least one material contained in the scanned object.

35. The system of claim 17, wherein said system further conducts noise spectroscopy to analyze at least one material contained in the scanned object.

36. The system of claim 17, further comprising at least one X-ray filter for vertically modulating x-ray intensity.

37. The system of claim 17, wherein said X-ray detector array comprises one or more gapless X-ray detector arrays to detect the radiation transmitted by the scanned objects.

38. The system of claim 37, wherein said gapless detector array comprises a two-dimensional array of small detector elements and wherein each detector element comprises a scintillator.

39. The system of claim 17, further comprising a neutron-based inspection subsystem comprising a pair of neutron generators and a plurality of gamma-ray detectors.

40. An X-ray source for scanning an object comprising:
an electron beam generator, wherein said electron beam generator generates an electron beam;
an accelerator for accelerating said electron beam in a first direction; and,
a first set of magnetic elements for transporting said electron beam into a magnetic field created by a second set of magnetic elements, wherein the magnetic field created by said second set of magnetic elements causes said electron beam to strike a target such that the target generates X-rays, wherein a majority of the X-rays are focused on a high density area in the scanned object and a minority of the X-rays are focused elsewhere.

41. An X-ray source for scanning an object comprising:
an accelerator capable of generating a sequence of pulsed electron beams of two or more different energies moving in a pre-defined direction, wherein a first pulse is low energy, a second pulse is high energy and each subsequent pulse in the sequence alternates between low energy and high energy; and,
a set of electron steering components which causes the beam to strike the same area of the target at pre-defined angles, wherein said angle is estimated from at least one image captured from any previous pulse in the sequence of pulses of said electron beam.

42. The X-ray source of claim 41 wherein the steering components include a pulsed steering magnet and a pulsed quadrupole.

43. The X-ray source of claim 41 wherein the steering components include a pulsed steering magnet and at least two DC magnets.

44. The X-ray source of claim 41 wherein the low energy beam ranges from 4 MeV to 6 MeV and the high energy beam ranges from 6 MeV to 10 MeV.

45. The X-ray source of claim 41 wherein the target is fabricated from tungsten, a low-z material such as graphite, or copper depending upon the application.

* * * * *